United States Patent [19]
Ogawa et al.

[11] Patent Number: 5,641,607
[45] Date of Patent: *Jun. 24, 1997

[54] ANTI-REFLECTIVE LAYER USED TO FORM A SEMICONDUCTOR DEVICE

[75] Inventors: Tohru Ogawa; Tetsuo Gocho, both of Kanagawa, Japan

[73] Assignee: Sony Corporation, Tokyo, Japan

[*] Notice: The term of this patent shall not extend beyond the expiration date of Pat. No. 5,472,827.

[21] Appl. No.: 535,377

[22] Filed: Sep. 28, 1995

Related U.S. Application Data

[63] Continuation of Ser. No. 175,299, Dec. 29, 1993, Pat. No. 5,472,827, which is a continuation-in-part of Ser. No. 998,743, Dec. 30, 1992, abandoned.

[30] Foreign Application Priority Data

| Dec. 30, 1991 | [JP] | Japan | 3-360521 |
| Dec. 30, 1991 | [JP] | Japan | 3-360523 |
| Mar. 11, 1992 | [JP] | Japan | 4-087911 |
| Mar. 11, 1992 | [JP] | Japan | 4-087912 |
| Aug. 20, 1992 | [JP] | Japan | 4-244314 |
| Oct. 31, 1992 | [JP] | Japan | 4-316073 |
| Dec. 29, 1992 | [JP] | Japan | 4-359750 |

[51] Int. Cl.$^6$ .............. G03C 1/825; G03F 7/09
[52] U.S. Cl. .............. 430/272.1; 430/159; 430/166; 430/510; 430/512; 430/950; 428/446
[58] Field of Search .............. 430/159, 166, 430/272.1, 275.1, 276.1, 512, 524, 525, 510, 950; 428/446

[56] References Cited

U.S. PATENT DOCUMENTS

| 4,407,927 | 10/1983 | Kamoshida et al. | 430/197 |
| 5,077,185 | 12/1991 | Cho et al. | 430/523 |
| 5,362,598 | 11/1994 | Takeyama et al. | 430/512 |
| 5,472,827 | 12/1995 | Ogawa et al. | 430/315 |
| 5,472,829 | 12/1995 | Ogawa | 430/325 |

FOREIGN PATENT DOCUMENTS

| 1-241125 | 9/1989 | Japan. |
| 2-148731 | 6/1990 | Japan. |

*Primary Examiner*—Christopher G. Young
*Attorney, Agent, or Firm*—Hill, Steadman & Simpson

[57] ABSTRACT

A method of determining an optimum condition of an anti-reflective layer upon forming a resist pattern by exposure with a monochromatic light, forms the anti-reflective layer with these conditions and forms a resist pattern using a novel anti-reflective layer. The method comprises (I) forming an equi-contour line for the amount of absorbed light regarding a photoresist of an optional film thickness using the optical condition of the anti-reflective layer as a parameter, (II) conducting the same procedure as in (I) above for a plurality of resist film thicknesses, (III) finding a common region for the amount of absorbed light with respect to each of the traces obtained, thereby determining the optical condition for the anti-reflective layer, (IV) applying same procedures as described above while changing the condition of the anti-reflective layer, thereby determining the optical condition for the anti-reflective layer, and (V) determining the optimum optical condition such as the kind and the thickness of the anti-reflective layer under a certain condition of the anti-reflective layer.

5 Claims, 68 Drawing Sheets

Standing wave effect (on Si)

Condition

Resist: XP8843 (n=1.802, k=0.0107)

Substrate: Si (n=1.572, k=3.583)

$\frac{\lambda}{2n}$ = 68.8nm in which n=1.802, $\lambda$=248nm

Trace of fluctuation for the amount of absorbed light in a resist film when $n_{arl}$, $k_{arl}$ are changed while fixing thickness of anti-reflective layer ARL for a certain resist film thickness Resist film thickness: 985nm Anti-reflective layer thickness: 20nm Trace for other resist film of different thickness Resist film thickness: 1000nm Anti-reflective layer thickness: 20nm Trace for other resist film of different thickness Resist film thickness: 1018nm Anti-reflective layer thickness: 20nm Trace for other resist film of different thickness Resist film thickness: 1035nm Anti-reflective layer thickness: 20nm Standing wave effect (on W-Si)

$\lambda$=248nm
XP8843onW-Si
$n_{PR}$=1.802, $k_{PR}$=0.0107
$n_{sub}$=1.96, $k_{sub}$=2.69

Trace of fluctuation for the amount of absorbed light in resist film relative to the change of $n_{arl}$, $k_{arl}$ for resist film thickness of 985 nm in a case of anti-reflective layer at 30 nm thickness $\lambda = 248\,nm$
XP8843 / ARL / W-Si
$n_{PR} = 1.802$, $k_{PR} = 0.0107$, $d_{PR} = 0.985\,\mu m$
$n_{arl}$, $k_{arl}$ : parameter, $d_{arl} = 0.03\,\mu m$
$n_{sub} = 1.96$, $k_{sub} = 2.69$ Trace for the resist film thickness of 1000 nm $\lambda$ = 248 nm
XP 8843 / ARL / W-Si
$n_{PR}$ = 1.802, $k_{PR}$ = 0.0107, $d_{PR}$ = 1.0 μm
$n_{arl}$, $k_{arl}$: parameter, $d_{arl}$ = 0.03 μm
$n_{sub}$ = 1.96, $k_{sub}$ = 2.69

Trace for the resist film thickness of 1017.5 nm $\lambda = 248$ nm
XP8843 / ARL / W-Si
$n_{PR} = 1.802$, $k_{PR} = 0.0107$, $d_{PR} = 1.0175$ μm
$n_{arl}$, $k_{arl}$ : parameter, $d_{arl} = 0.03$ μm
$n_{sub} = 1.96$, $k_{sub} = 2.69$ Trace for the resist film thickness of 1035 nm $\lambda = 248$ nm
XP 8843 / ARL / W-Si
$n_{PR} = 1.802$, $k_{PR} = 0.0107$, $d_{PR} = 1.035 \mu m$
$n_{arl}, k_{arl}$ : parameter, $d_{arl} = 0.03 \mu m$
$n_{sub} = 1.96$, $k_{sub} = 2.69$ Standing wave effect at optimum condition $\lambda = 248$ nm
XP8843 / ARL / W-Si
$n_{PR} = 1.802$, $k_{PR} = 0.0107$
$n_{arl} = 2.15$, $k_{arl} = 0.67$, $d_{arl} = 0.03$ μm
$n_{sub} = 1.96$, $k_{sub} = 2.69$ Standing wave effect at optimum condition $\lambda = 248$ nm
XP 8843 / ARL / W-Si
$n_{PR} = 1.802$, $k_{PR} = 0.0107$
$n_{arl} = 4.9$, $k_{arl} = 0.1$, $d_{arl} = 0.03$ μm
$n_{sub} = 1.96$, $k_{sub} = 2.69$ Relation between layer thickness and n of anti-reflective film ○ n - value1
□ n - value2

Relation between layer thickness and k of anti-reflective film

○ k-value1
□ k-value2

ARL layer thickness (nm)

Anti-reflective effect of SiC (50 nm) on W-Si

Condition

Photoresist: XP8843 1 μm

Substrate: W-Si

Light interference in resist film

P: Incident light

R: Reflection light

PR: resist

S: substrate

Standing wave effect $\lambda = 248$ nm
XP 8843 / Si
$n_{PR} = 1.802$, $k_{PR} = 0.0107$
$n_{Si} = 1.5717$, $k_{Si} = 3.583$ Standing wave effect Resist film thickness (μm)

$\lambda = 248$ nm
XP8843 / Al-Si
$n_{PR} = 1.802$, $k_{PR} = 0.0107$
$n_{sub} = 0.089$, $k_{sub} = 2.354$ Standing wave effect Resist film thickness (μm)

$\lambda = 248$ nm
XP8843 / W-Si
$n_{PR} = 1.802$, $k_{PR} = 0.0107$
$n_{sub} = 0.089$, $k_{sub} = 2.354$ Influence of step $d_{PR1} \neq d_{PR2}$ S: Substrate In: For example, poly-Si PR: Resist Fig.23 Influence of standing wave effect Influence of standing wave effect Influence of standing wave effect Relation between fluctuation for the amount of absorbed light and dimensional change of pattern Structure of example PR: photoresist ARL: anti-reflective layer (SiC)

G : High melting metal silicide (WSi gate)

S: Substrate

Structure of example

PR: photoresist

ARL: anti-reflective layer (SiC or SiO)

1 : Al series metal wiring material

S: Substrate

Standing wave effect

Resist film thickness ( μm )

$\lambda = 248$ nm
XP 8843 on Al-Si ,
$n_{PR} = 1.802$ , $k_{PR} = 0.0107$
$n_{sub} = 0.089$ , $k_{sub} = 2.354$ Trace of fluctuation at resist film thickness of 982 nm $\lambda = 248$ nm,
XP8843 / ARL / Al, Al-Si, Al-Si-Cu,
$n_{PR} = 1.802$, $k_{PR} = 0.0107$, $d_{PR} = 982$ nm,
$n_{arl}$, $k_{arl}$ : parameter, $d_{arl} = 30$ nm,
$n_{sub} = 0.089$, $k_{sub} = 2.354$ Trace of fluctuation at resist film thickness of 1000 nm $\lambda$ = 248 nm
XP8843 / ARL / Al, Al-Si, Al-Si-Cu,
$n_{PR}$=1.802, $k_{PR}$=0.0107, $d_{PR}$=1000nm,
$n_{arl}$, $k_{arl}$ : parameter, $d_{arl}$=30nm,
$n_{sub}$= 0.089, $k_{sub}$= 2.354

Trace of fluctuation at resist film thickness of 1018 nm $\lambda = 248$ nm,
XP8843 / ARL / Al, Al-Si, Al-Si-Cu,
$n_{PR} = 1.802$, $k_{PR} = 0.0107$, $d_{PR} = 1018$ nm,
$n_{arl}$, $k_{arl}$ : parameter, $d_{arl} = 30$ nm,
$n_{sub} = 0.089$, $k_{sub} = 2.354$ Trace of fluctuation at resist film thickness of 1035 nm $\lambda = 248$ nm,
XP8843 / ARL / Al, Al-Si, Al-Si-Cu,
$n_{PR} = 1.802$, $k_{PR} = 0.0107$, $d_{PR} = 1035$ nm,
$n_{arl}$, $k_{arl}$ : parameter, $d_{arl} = 30$ nm,
$n_{sub} = 0.089$, $k_{sub} = 2.354$ Standing wave effect at optimum condition $\lambda = 248\,nm$
XP 8843 / ARL / Al-Si,
$n_{PR} = 1.802$, $k_{PR} = 0.0107$,
$n_{arl} = 4.8$, $k_{arl} = 0.45$, $d_{arl} = 30\,nm$,
$n_{sub} = 0.089$, $k_{sub} = 2.354$ Standing wave effect at optimum condition $\lambda = 248$ nm,
XP8843 / ARL / Al-Si,
$n_{PR} = 1.802$, $k_{PR} = 0.0107$,
$n_{arl} = 2.0$, $k_{arl} = 0.8$, $d_{arl} = 30$ nm,
$n_{sub} = 0.089$, $k_{sub} = 2.354$ Relation between anti-reflective layer thickness and R Figure showing dependence of n, k value of SiC film on film forming condition Dependence of optical property (n value, k value) of SiC film on deposition condition System  Bias-ECR Plasma CVD
Gas     $SiH_4$, $C_2H_4$
Flow Rate   $SiH_4$ : 5-10
 (sccm)    $C_2H_4$ : 2.5-10
Pressure   0.04 - 0.533
 (Pa)
RF Power   300 - 900
 (W)

Anti-reflective effect of SiC film (20 nm) on Al, Al-Si, Al-Si-Cu (Example 1)

XP8843 / SiC(20nm) / Al-Si, Al-Si-Cu, Al,
nsic = 2.3, ksic = 0.81

Anti-reflective effect of SiO film (30 nm) on Al, Al-Si, Al-Si-Cu (Example 7)

XP8843/SiO(30nm)/Al, Al-Si, Al-Si-Cu,
$n_{SiO} = 1.83$, $k_{SiO} = 0.75$

Structure of example

PR: photoresist

ARL: anti-reflective layer (SiC or SiO)

S: Si substrate

Standing wave effect $\lambda = 248$ nm, $n_{PR} = 1.802$, $k_{PR} = 0.0107$,
XP8843 on Si, $n_{sub} = 1.96$, $k_{sub} = 2.69$ Anti-reflective effect of SiC film (25 nm) on Si substrate ~~(Example 1)~~

XP8843 / SiC(25nm) / Si, $n_{sic} = 2.3$, $k_{sic} = 0.65$

Anti-reflective effect of SiO film (30 nm) on Si substrate ~~(Example 2)~~

XP8843 / SiO(30nm) / Si ,
$n_{SiO} = 2.1$, $k_{SiO} = 0.7$

Structure of example

PR: photoresist

ARL: anti-reflective layer (SiC)

G: high melting metal silicide (WSi gate)

S: substrate

SiO film forming behavior by ECR-CVD

Anti-reflective effect of SiO (24 nm) on W-Si

Resist Thickness (nm)

Condition
 substate : W - Si
   (n = 1.93, k = 2.73)
 ARL : optimized SiOx
   (n : 2.36, k = 0.53, d = 23.8 nm)
 photoresist : XP8843
   (n = 1.80, k = 0.011)

ARL effect

|  | without SiOx | with SiOx |
|---|---|---|
| Max | 0.60 | 0.425 |
| Min | 0.40 | 0.410 |
| Swing ratio | ±21% | ±1.8% |

Structure of Example 53

PR: photoresist

ARL: anti-reflective film

G: high melting metal silicide (WSi gate)

S: substrate $Si_xO_yN_z$ film forming behavior by ECR-CVD

WSi (HT) condition
(identical with SiC, 25 nm)

○ SiH4 / N2O

● Microwave

Anti-reflective effect of $Si_xO_yN_z$ (25 nm) on W-Si

Resist Thickness (nm)

Condition
    substrate : W-Si
        (n = 1.93, k = 2.73)
    ARL : optimized $Si_xO_yN_z$
        (n : 2.36, k = 0.53, d = 23.8nm)
    photoresist : XP8843
        (n = 1.80, k = 0.011)

ARL effect

|  | Without $Si_xO_yN_z$ | With $Si_xO_yN_z$ |
|---|---|---|
| Max | 0.60 | 0.425 |
| Min | 0.40 | 0.410 |
| Swing ratio | ±21% | ±1.8% |

Structure of Example 65

PR: photoresist

OX: oxide film ($SiO_2$, etc., may be saved)

ARL: anti-reflective film

G: metal wiring material

S: substrate

Optical constant property of $Si_xO_yN_z$, $Si_xN_y$

Standing wave effect at optimum condition

SiON for AlSi (KrF)

$n = 2.08$
$k = 0.85$
$d = 0.025 \mu m$ $\Rightarrow SiH_4 / N_2O = 0.83$

ARL effect: ± 0.48 %

Structure of Example 77

PR: photoresist

Ox: oxide film ($SiO_2$, etc., may be saved)

ARL: anti-reflective layer

G: silicon series material (single crystal silicon, polycrystalline silicon, amorphous silicon, doped polysilicon)

Anti-reflective effect of $Si_xO_yN_y$ film, $Si_xN_y$ film (32 nm) on Si substrate X P8843/$Si_xO_yN_z$, $Si_xN_y$ (32nm) /Si
n$Si_xO_yN_z$ = 2.0
k$Si_xO_yN_z$ = 0.55

Anti-reflective effect of $Si_xO_yN_y$ film, $Si_xN_y$ film (100 nm) on Si substrate XP8843/$Si_xO_yN_z$, $Si_xN_y$(100nm)/Si
$n_{arl} = 1.9$
$k_{arl} = 0.35$ Optical constant property of $Si_xO_yN_z$, $Si_xN_y$ Anti-reflective effect of $Si_xO_yN_z$, $Si_xN_y$ film (33 nm) on Poly-Si, amorphous silicon, doped polysilicon substrate XP8843 / SixOyNz, SixNy(33nm) / Poly-Si, amorphous-Si, doped polysilicon, $n_{PR} = 1.801$, $k_{PR} = 0.0107$,
$n_{arl} = 2.01$, $k_{arl} = 0.62$, $d_{arl} = 3.3nm$
$n_{poly} = 1.71$, $k_{poly} = 3.3$

ANTI-REFLECTIVE LAYER USED TO FORM A SEMICONDUCTOR DEVICE

CROSS-REFERENCE TO RELATED APPLICATIONS

This is a continuation of U.S. application Ser. No. 08/175,299 filed Dec. 29, 1993, which was a continuation-in-part of U.S. patent application Ser. No. 07/998,743, filed Dec. 29, 1992, now abandoned, which has been replaced by a continuation application Ser. No. 08/320,119 filed Oct. 11, 1994.

BACKGROUND OF THE INVENTION

1. Field of the Invention

The present invention concerns a method of determining conditions for an anti-reflective layer, a method of forming an anti-reflective layer and a method of forming a resist pattern by using a novel anti-reflective layer. In particular, it relates to a method of determining a condition of an anti-reflective layer for defining optical conditions such as a thickness and a refractive index condition, for example, reflection refractive index and absorption refractive index of an anti-reflective layer upon forming a resist pattern by exposing a photoresist on an anti-reflective layer formed on an underlying material by a monochromatic light; a method of forming the anti-reflective layer utilizing the above-mentioned method and a method of forming a resist pattern by using a novel anti-reflective layer. The present invention can be utilized suitably, for example, either in a case of setting an anti-reflective layer disposed for preventing the standing wave effect when photolithography is used or in a case of forming a resist pattern by using an anti-reflective film when photolithography is used upon manufacturing, for example, electronic materials (such as semiconductor devices).

2. Description of the Prior Art

For instance, in the photolithography, a KrF excimer laser beam (248 nm) is used and is mounted in most advanced steppers (projection exposing machine) at present (for example, Nikon NSR 1505 EX1, Canon FPA 4500) have a lens of about 0.37 to 0.42 NA. By using the steppers, research and development have been studied for design rule devices in a sub-half micron (0.5 um) region.

In the stepper, a monochromatic light is used as an exposing optical source. In a case of exposure by the monochromatic light, it has been generally known that a phenomenon referred to as a standing wave effect occurs. The standing wave is caused by occurrence of a light interference in a resist film. That is, It is caused by the interference between an incident light P and a reflection light R from the interface between a resist PR and a substrate S in the film of the resist PR.

As a result, as shown in FIG. 19, the amount of light absorbed in the resist (ordinate in the graph) fluctuates depending on the thickness of the resist film (abscissa in the graph). In the present specification, the amount of light absorbed in the resist means an amount of light absorbed in the resist itself excluding the amount of light due to surface reflection, absorption by a metal if it is present in the resist, or light outgoing from the resist. The amount of the absorbed light constitutes an energy for causing light reaction to the resist.

As can be seen from the comparison between FIG. 20 and FIG. 21, the extent of the fluctuation for the amount of the absorbed light also differs based on the kind of underlying substrates. In FIGS. 19, 20 and 21, XP 8843 (manufactured by Shipley Co.) is used in each of the cases and Si, Al—Si and W—Si are used as the underlying material in respective cases. That is, fluctuation for the amount of the absorbed light is determined by a complex swing reflectivity (R) (in which (R) represents that it is a vector amount having a real part and an imaginary part) considering multiple interference determined by optical constants (n, k) of the underlying material (substrate) and optical constants (n, k) of the resist.

In addition, in the actual device, as schematically shown in FIG. 22, unevenness is always present on the surface of a substrate. For instance, protrusions In, such as poly-Si, are present. Therefore, when the resist PR is coated, the thickness of the resist film varies between upper and lower portions of the step. That is, the thickness dPR2 of the resist film on the protrusion In is smaller than the thickness dPR1 of the resist film in other portions than the above. As has been described previously, the standing wave effect differs depending on the thickness of the resist film and, accordingly, fluctuation for the amount of the light absorbed in the resist changes respectively undergoing the effect of the standing wave effect. As a result, the dimension of the resist pattern obtained after exposure and development differs between the upper and the lower portions of the step.

Influence of the standing wave effect on the dimension of the pattern becomes more remarkable as the pattern is finer in a case of using a stepper of an identical wavelength and an identical number of aperture. FIGS. 23–25 show the influence of the standing wave effect on every pattern dimension in a case of using Nikon NSR 1505 EX1 as a stepper (exposure light used: λ=248 nm, KrF excimer, NA=0.42) and using XP 8843 as a resist (chemically amplified type resist, a polyvinylphenol type resist containing optical acid generating agent, manufactured by Shipley Microelectronics Co.). It is apparent that the standing wave effect becomes remarkable as the pattern becomes finer (refer also to the scattering of critical dimension shift at 0.5 um, 0.4 um and 0.35 um line-and-space patterns shown by "open circles" in the drawings).

The above-mentioned trend is a phenomenon observed in common with all of resists.

The dimensional accuracy of a resist pattern in a photolithographic step upon manufacturing a device such as a semiconductor device is generally ±5%, although it is considered that an accuracy coarser than ±5% in total may be practically tolerable. However, if occurrence of scattering due to the other factors such as focus is also taken into consideration, it is desirable that the pattern accuracy upon a resist exposure is within ±5%. For attaining the dimensional accuracy of ±5%, it is essential to reduce the standing wave effect.

FIG. 26 shows a dimensional variation of the resist pattern relative to the fluctuation (ordinate) for the amount of absorbed light in the resist film (abscissa). As can be seen from FIG. 26, fluctuation for the amount of absorbed light in the resist film has to be within a range of less than 6% in order to manufacture, for example, a rule device of 0.35 um.

For satisfying the above-mentioned requirement, several studies have been made on the anti-reflective technique in each of the fields. However, although the type of material for the underlying material and the resist to be used are known, it is not always easy to determine as to what are the conditions for the anti-reflective layer that can attain an anti-reflective effect suitable to such a case.

For instance, in the formation of a pattern on a gate structure (for example, on a W—Si film) for which an anti-reflective layer is considered indispensable, it has not yet been determined what are the conditions for the anti-reflective layer that will reduce fluctuation for the amount of the absorbed light in the resist film, for example to a range of less than 6%. Naturally, no effective anti-reflective layer material to be used for such W—Si has yet been found.

For the structure using the W—Si material as the gate, a pattern has now been formed at present, for example, by means of a multi-layer resist method or dye-incorporated resist. Accordingly, it is considered essential to establish anti-reflective technique on W—Si as soon as possible.

In such a case, if there is a means capable of determining comprehensive conditions and concrete conditions regarding an anti-reflective layer for forming a stable fine pattern on an optional underlying material (substrate) using an exposure optical source of an optional monochromatic light it can be found for the condition of the anti-reflective layer to be formed, for example, on W—Si. However, no such means has yet been proposed.

OBJECT OF THE INVENTION

In view of the foregoing situations, it is an object of the present invention to provide a method for determining a condition for an anti-reflective layer which is capable of being used in a case of forming a resist pattern on an optional underlying material (substrate) by using an exposure optical source of an optional monochromatic light, so that a stable resist pattern can be formed satisfactorily even if the resist pattern is fine.

Another object of the present invention is to provide a method of forming an anti-reflective layer by the condition described above.

A further object of the present invention is to provide a method of forming a resist pattern by developing a novel anti-reflective layer and using such an anti-reflective layer.

SUMMARY OF THE INVENTION

The foregoing object can be attained in accordance with the first aspect of the present invention by a method of determining a condition for an anti-reflective layer upon forming a resist pattern by exposing a photoresist on the anti-reflective layer formed on an underlying material by a monochromatic light, wherein the film thickness and the optical condition of the anti-reflective layer are determined by the following means or steps, which comprises:

(I) determining an equi-contour line for the amount of absorbed light in a photoresist of an optionally determined film thickness using the optical condition for the anti-reflective layer as a parameter;

(II) determining equi-contour lines for the amount of absorbed light for a plurality of different film thicknesses in the same manner as in (I) above;

(III) finding a common region for the amount of the absorbed light for each of the equi-contour lines obtained in (II) above and setting the optical condition defined by the common region as an optical condition for the anti-reflective layer in the condition defined initially in (I) above;

(IV) determining the optical condition for the anti-reflective layer by conducting the same procedures as described above while changing the condition for the anti-reflective film; and (V) finding the optimum optical condition for the anti-reflective layer in the condition for the anti-reflective layer according to (IV) above.

The foregoing object can be attained in accordance with the second aspect of the present invention by a method of forming an anti-reflective layer upon forming a photoresist pattern by exposing a photoresist on the anti-reflective layer formed on an underlying material by a monochromatic light, wherein the anti-reflective layer is formed by using a substance adaptable to the condition for the refractive index based on the optimum refractive index condition for the anti-reflective layer determined by the means (I)–(V) as defined in the first aspect.

The foregoing object can be attained in accordance with the third aspect of the present invention by a method of forming a resist pattern which comprises forming an anti-reflective layer with silicon carbide on an underlying high melting metal silicide material and forming a photoresist on the anti-reflective layer.

The foregoing object can be attained in accordance with the fourth aspect of the present invention by a method of forming a resist pattern by forming an anti-reflective layer on an underlying metal series material and forming a photoresist on the anti-reflective layer thereby forming a resist pattern, wherein the anti-reflective film is formed with an organic or inorganic substance under the conditions of the film thickness and the optical condition determined by the following means or steps, which comprises:

(I) determining an equi-contour line for the amount of absorbed light in a photoresist of an optionally determined film thickness using the optical condition for the anti-reflective layer as a parameter;

(II) determining equi-contour lines for the amount of absorbed light for a plurality of different film thicknesses in the same manner as in (I) above;

(III) finding a common region for the amount of the absorbed light for each of the equi-contour lines obtained in (II) above and setting the optical condition defined by the common region as an optical condition for the anti-reflective layer in the condition defined initially in (I) above;

(IV) determining the optical condition for the anti-reflective layer by conducting the same procedures as described above while changing the condition for the anti-reflective film; end (V) finding the optimum optical condition for the anti-reflective layer in the condition for the anti-reflective layer according to (IV) above.

The foregoing object can be attained in accordance with the fifth aspect of the present invention by a method of forming a resist pattern which comprises forming an anti-reflective layer on an underlying metal series material with silicon carbide or silicon oxide and forming a photoresist on the anti-reflective layer, thereby forming a resist pattern.

The foregoing object can be attained in accordance with the sixth aspect of the present invention by a method of forming an anti-reflective layer on an underlying inorganic material (including metal material and silicon material) and forming a resist pattern on the anti-reflective layer thereby forming the resist pattern, wherein the anti-reflective layer is formed with an organic or inorganic substance satisfying the film thickness and the optical condition determined by the following steps or means, which comprises:

(I) determining an equi-contour line for the amount of absorbed light in a photoresist of an optionally determined film thickness using the optical condition for the anti-reflective layer as a parameter;

(II) determining equi-contour lines for the amount of absorbed light for a plurality of different film thicknesses in the same manner as in (I) above;

(III) finding a common region for the amount of the absorbed light for each of the equi-contour lines obtained in (II) above and setting the optical condition defined by the common region as an optical condition for the anti-reflective layer in the condition defined initially in (I) above;

(IV) determining the optical condition for the anti-reflective layer by conducting the same procedures as described above while changing the condition for the anti-reflective film; and (V) finding the optimum optical condition for the anti-reflective layer in the condition for the anti-reflective layer according to (IV) above.

The foregoing object can be attained in accordance with the seventh aspect of the present invention by a method of forming a resist pattern which comprises forming an anti-reflective layer with silicon carbide or silicon oxide on an underlying silicon material and forming a photoresist on the anti-reflective film, thereby forming a resist pattern.

The foregoing object can be attained in accordance with the eighth aspect of the present invention by a method of forming a resist pattern as defined by the fourth aspect, wherein an anti-reflective layer is formed on an underlying metal material by using an organic or inorganic substance having a value within ±0.6 for the reflection refraction index n and a value within ±0.2 for the absorption refractive index k and forming a photoresist on the anti-reflective layer, thereby forming the resist pattern.

The foregoing object can be attained in accordance with the ninth aspect of the present invention by a method of forming a resist pattern, wherein an $SiO_2$ film having reflection refractive index n=2.4±0.6 and absorptive refraction index k=0.7±0.2 is used as an anti-reflective layer on an underlying metal material.

The foregoing object can be attained in accordance with the tenth aspect of the present invention by a method of forming a resist pattern, wherein a $Si_xO_yN_z$ film or a $Si_xN_y$ film having reflection refractive index n=2.4±0.6 and absorptive refractive index k=0.7±0.2 is used as an anti-reflective layer on the underlying metal material.

The foregoing object can be attained in accordance with the 11th aspect of the present invention by a method of forming a resist pattern as defined by any one of the eighth to tenth aspects, wherein the underlying metal material comprises a high melting metal silicide.

The foregoing object can be attained in accordance with the 12th aspect of the present invention by a method of forming a resist pattern, in which a $Si_xO_yN_z$ film is formed as an anti-reflective layer on the underlying metal material thereby forming a resist pattern.

The foregoing object can be attained in accordance with the 13th aspect of the present invention by a method of forming a resist pattern as defined by the 12th aspect, wherein the metal material is aluminum series material.

The foregoing object can be attained in accordance with the 14th aspect of the present invention by a method of forming a resist pattern in which a $Si_xO_yN_z$ or $Si_xN_y$ film as an anti-reflective layer is formed on an underlying silicon series material thereby forming a resist pattern.

The foregoing object can be attained in accordance with the 15th aspect of the present invention by a method of forming a resist pattern as defined by the 14th aspect, wherein the silicon material comprises any one of single crystal silicon, polycrystalline silicon, amorphous silicon and doped poly-silicon.

The first aspect of the present invention comprises, as shown in FIG. 1:

(I) determining an equi-contour line for the amount of absorbed light in a photoresist of an optionally determined film thickness using the optical condition for the anti-reflective layer as a parameter;

(II) determining equi-contour lines for the amount of absorbed light for a plurality of different film thicknesses in the same manner as in (I) above;

(III) finding a common region for the amount of the absorbed light for each of the equi-contour lines obtained in (II) above and setting the optical condition defined by the common region as an optical condition for the anti-reflective layer in the condition defined initially in (I) above;

(IV) determining the optical condition for the anti-reflective layer by conducting the same procedures as described above while changing the condition for the anti-reflective film; and (V) finding the optimum optical condition for the anti-reflective layer in the condition for the anti-reflective layer according to (IV) above.

An optimum condition for the anti-reflective layer is obtained in accordance with the foregoing constitution and a substance adaptable to the condition that is capable of satisfying or substantially satisfying such a condition is selected thereby enabling to form an effective anti-reflective layer.

For instance, each of refractive indices n, k at each of specific wavelengths (exposure wavelength) is determined by a means such as a spectroscopic ellipsometer and a substance having such refractive indices n, k is searched from existent substances as the anti-reflective material, or a substance for such a condition can be synthesized to serve for the anti-reflective material.

Description will then be made to a methodology of determining a comprehensive condition for an anti-reflective layer by using the present invention with reference to the drawings.

(1) The thickness of the resist film between maximum values or between minimum values of the standing wave effect is given as $\lambda/4n$ assuming the refractive index of the resist as $n_{PR}$ and the exposure wavelength as $\lambda$ (refer to FIG. 2).

(2) An anti-reflective layer ARL is assumed between the resist and the substrate, with the film thickness as $d_{arl}$ and optical constant as $n_{arl}$, $k_{arl}$.

(3) Taking notice on the film thickness at a certain point in FIG. 2 (for instance, a film thickness for maximizing the standing wave effect), the amount of the absorbed light in the resist film fluctuates at that point as $n_{arl}$, $k_{arl}$ are changed while the film thickness $d_{arl}$ of the anti-reflective layer being fixed. The varying trace, that is, the equi-contour lines for the amount of absorbed light is determined as shown in FIG. 3. The procedures described above correspond to step (I) in accordance with the present invention.

(4) When the procedure (3) is applied repeatingly to four points each at $\lambda/8n_{PR}$ interval with reference to other different film thickness $d_{pr}$ of the resist, at least, film thickness maximizing or minimizing the standing wave effect, FIG. 4 to FIG. 6 corresponding to FIG. 3 are obtained (in FIGS. 3—6, the thickness of the anti-reflective layer is defined as 20 nm and the thickness of the resist Layer is defined as 985 nm, 1000 nm, 1018 nm and 1035 nm, respectively). This corresponds to step (II).

(5) The common region for each of the graphs in FIG. 3 to FIG. 6 shows a region in which the amount of absorption light in the resist film does not fluctuate even if the resist film thickness varies. That is, the common region described above is a region having a highest anti-reflective effect for minimizing the standing wave effect. Accordingly, a search is made for such a common region. The common region can be found conveniently, for example, by overlapping each of the subgraphs to determine the common region (the common region may, of course, be retrieved by a computer). This corresponds to step (III).

(6) Procedures (3), (4) and (5) are repeated while continuously varying the film thickness d of the anti-reflective layer. For instance, assuming that the procedure was conducted, for example, at d=20 nm up to (5), then the above-mentioned procedures are repeated while varying d. This can specify the condition for the film thickness $d_{arl}$ of the anti-reflective layer minimizing the standing wave effect and a condition for the optical constant $n_{arl}$, $k_{arl}$. This corresponds to step (IV).

(7) The kind of the film that satisfies the condition to be met by the anti-reflective layer specified in (6) above (film thickness, optical constant) is found by measuring the optical constant of each kind of the films by the exposure light. This corresponds to step (V).

This methodology is applicable, in principle, to all of the wavelength and the kind of the underlying material (substrate). Further, an anti-reflective layer of an optimum condition can be formed in accordance with the condition obtained in (7) above and with the substance capable of satisfying the condition (corresponding to FIG. 1 (VI)).

By using the method in accordance with the present invention, the anti-reflective layer as an effective means for forming a stable fine pattern on an optional underlying material (substrate) by using a stepper having an optical source of an optional monochromatic light can be easily designed.

The present invention can be utilized for finding a condition of an organic or inorganic film for forming an anti-reflective layer used for forming a stable resist pattern on a W—Si film by using a KrF excimer laser. In this case, a substance having n, k condition shown in FIGS. 14 and 15 to be described later can be used. In this case, it is desirable to use such an organic or inorganic layer having a tolerable range for each of n, k values in FIGS. 14, 15, i.e., ±0.2 for n and ±0.05 for k. As for the anti-reflective layer, it is preferred to use SiC having n=3.16±0.2, k=0.24±0.05 at a film thickness of 50±10 nm. SiC constituting the anti-reflective layer can be formed by sputtering or CVD. SiC can also be etched by RIE using $CF_4$, $CHF_3$, $C_2F_6$, $C_3F_8$, $SF_6$ or $NF_3$ series gas as an etchant and by adding Ar to thereby improve ionic property.

The third through tenth aspects of the present invention can be attained by conducting the operation for finding the substance capable of satisfying the condition as described above by using the above-mentioned method. Referring to the third aspect of the present invention, it can be found that SiC (silicon carbide) is particularly appropriate on high melting metal silicide W—Si, based on which the present invention has been completed.

This invention can suitably be used in a case of forming a stable resist pattern on a W—Si film by using a KrF excimer laser, in which SiC with n=3.16±0.02 and k=0.24±0.05 at a film thickness of 50±50 nm is preferably used as the anti-reflective layer. SiC constituting the anti-reflective layer can be formed by sputtering or CVD. SiC can be etched by RIE using $CF_4$, $CHF_3$, $C_2F_6$, $C_3F_8$, $SF_6$ or $NF_3$ series gas as an etchant and by adding Ar to improve the ionic property.

Further, in the fourth aspect of the present invention, the concept of the first aspect is applied in a case of using a metal series material such as a high melting metal compound as the underlying material.

Referring to the fifth aspect of the present invention, upon forming a resist pattern by forming a resist on an anti-reflective layer, when an operation of finding out the substance capable of satisfying the condition in accordance with the condition obtained by the above-mentioned method is conducted, it has been found that SiC (silicon carbide) and SiO (silicon oxide) are suitable on a metal wiring material, particularly Al series metal material, for example, Al, Al—Si, Al—Si—Cu or Cu series metal material, such as Cu, as well as that an organic or inorganic material found by the above-mentioned method is appropriate, based on which the present invention has been attained.

This invention is preferably applied in a case of forming a stable resist pattern on an Al series metal material, such as Al, Al—Si or Al—Si—Cu, or a Cu series metal material, such as Cu, by using a KrF excimer laser. In this case, it is preferred to use SiO with n=1.83±0.2 and k=0.75±0.2 at a layer thickness of 30±10 nm as an anti-reflective layer, for example, on the Al series metal material. Alternatively, SiC with n=0.2±0.2 and k=0.8±0.2 is preferably used at a layer thickness of 20±10 nm. Alternatively, it is preferred to use an organic or inorganic substance having an optimum curve regarding the refractive index and the layer thickness of the anti-reflective layer obtained in (V) above, and within a range of the value on the curve ±0.2 for n and the value on the curve ±0.15 for k. SiO constituting the anti-reflective layer can be formed by CVD or thermal oxidation. SiC can be formed by sputtering or CVD. The anti-reflective layer can be etched by RIE using $CF_4$, $CHF_3$, $C_2F_6$, $C_3F_8$, $SF_6$ or $NF_3$ series gas as an etchant and adding Ar and $O_2$ to improve the ionic property.

In the sixth aspect of the present invention, the concept of the first aspect is applied in a case of using an inorganic substance, such as silicon material, as an underlying material.

Referring to the seventh aspect of the present invention, when an operation was conducted in accordance with the condition obtained in the foregoing method and finding a substance capable of satisfying the condition, it has been found that SiC (silicon carbide) or SiO is appropriate on a silicon series material, particularly a silicon substrate, based on which the present invention has been attained.

The invention can suitably be applied to a case of forming a stable resist pattern on a silicon substrate by using a KrF excimer layer. In this case, it is preferred to use SiC with n=0.2±0.2 and k=0.65±0.2 at a layer thickness of 25 nm±10 nm as an anti-reflective layer. Alternatively, it is preferred to use SiO with n=0.1±0.2 and k=0.7±0.2 at a layer thickness of 30±10 nm. SiO constituting the anti-reflective layer can be formed, for example, by CVD or thermal oxidation. SiC can be formed, for example, by sputtering or CVD. The anti-reflective layer can be etched by RIE using $CF_4$, $CF_3$, $C_2F_6$, $C_3F_8$, $SF_6$ or $NF_3$ series gas as an etchant and adding Ar and $O_2$ or Ar or $O_2$ to improve the ionic property.

Referring to the ninth and tenth aspects of the present invention, it has been found that $SiO_x$ film, $SiO_xN_z$ film or $SiN_y$ film is appropriate on a metal material such as high melting metal silicide in accordance with the condition obtained by the method as described above, based on which the present invention has been attained.

This invention is applicable preferably to a case of forming a stable resist pattern on a W—Si film by using a KrF excimer laser. In this case, as the anti-reflective layer, it is preferred to use $SiO_x$ with $n=2.4\pm0.6$ and $k=0.7\pm0.2$ at a layer thickness of 30 nm, and further, $SiO_x$ can be formed by various kinds of CVD processes. Further, $SiO_x$ can be etched by RIE using $CHF_3$, $C_4F_8$, $CHF_3$ or $S_2F_2$ series gas as an etchant and improving the ionic property.

Referring to the 12th and 13th aspects of the present invention, it has been found that a $SiO_xN_y$ film is suitable on the underlying metal material such as Al series material, based on which the present invention has been attained.

Further, referring to the 14th and 15th aspects of the present invention, it has been found that a $SiO_xN_y$ film or $Si_xN_y$ film is appropriate on the silicon series underlying material, based on which the present invention has been attained.

DESCRIPTION OF THE PREFERRED EMBODIMENTS

The principles of the present invention will be apparent from the description of the following examples. However, the present invention is not limited by the following examples:

Example 1

Figure 1:
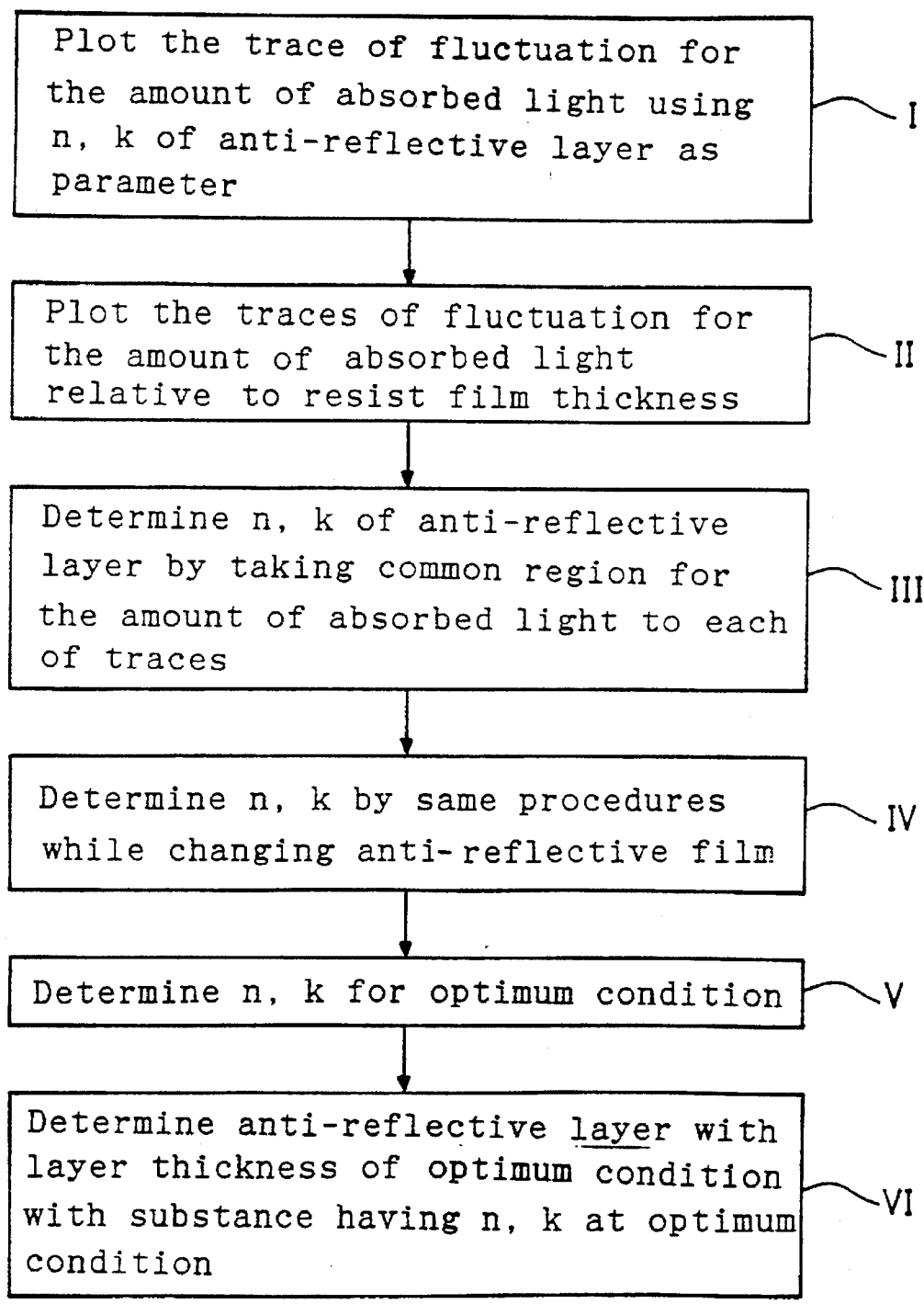
FIG. 1 is a flow chart illustrating the constitution of the steps for the method of determining an optimum condition according to the present invention.
Figure 2:
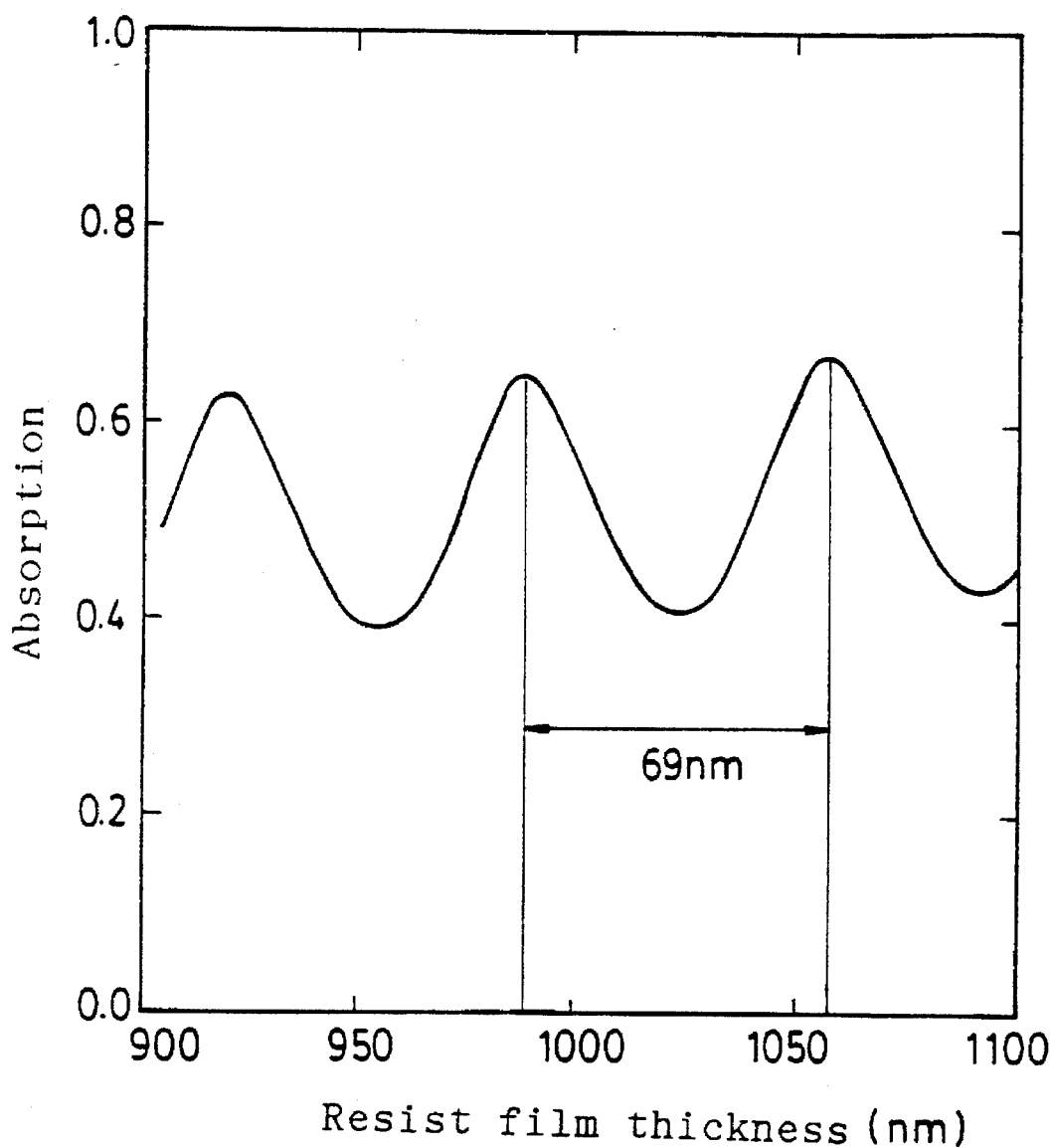
FIG. 2 is a graph illustrating a standing wave effect of absorption in relation to resist thickness.
Figure 3:
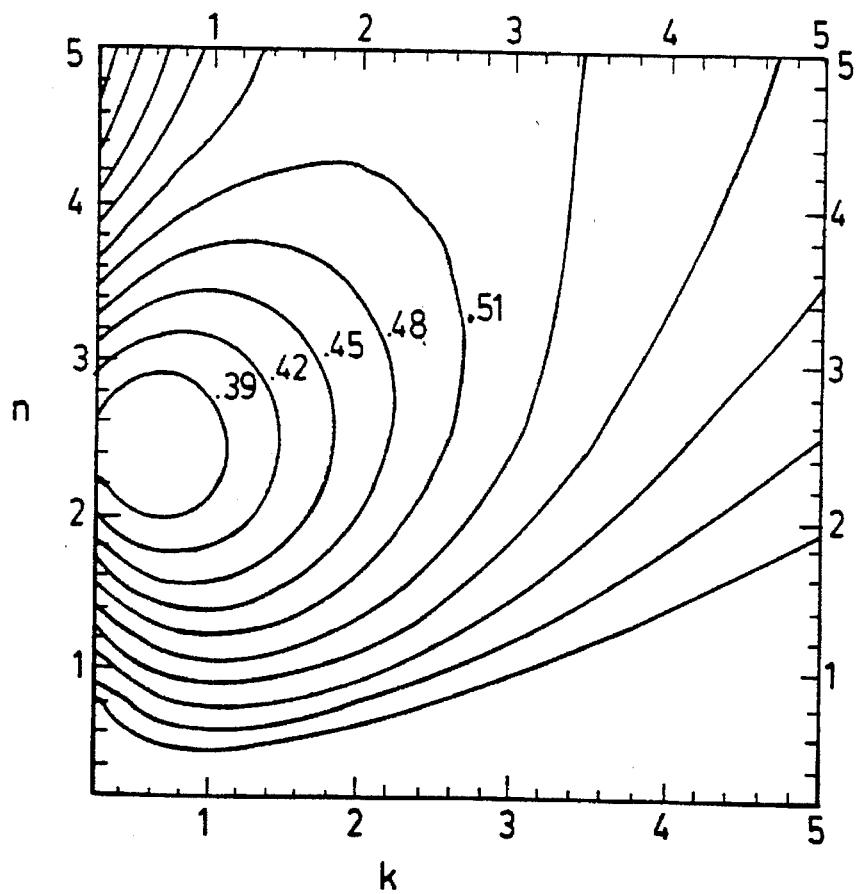
FIG. 3 is a graph illustrating a trace of fluctuation for the amount of absorbed light in a resist film (an equi-contour line for the amount of absorbed light) in a case where $n_{arl}$, $k_{arl}$ are varied while fixing the thickness of the anti-reflective layer ARL, with respect to a certain resist film thickness of 985 nm.
Figure 4:
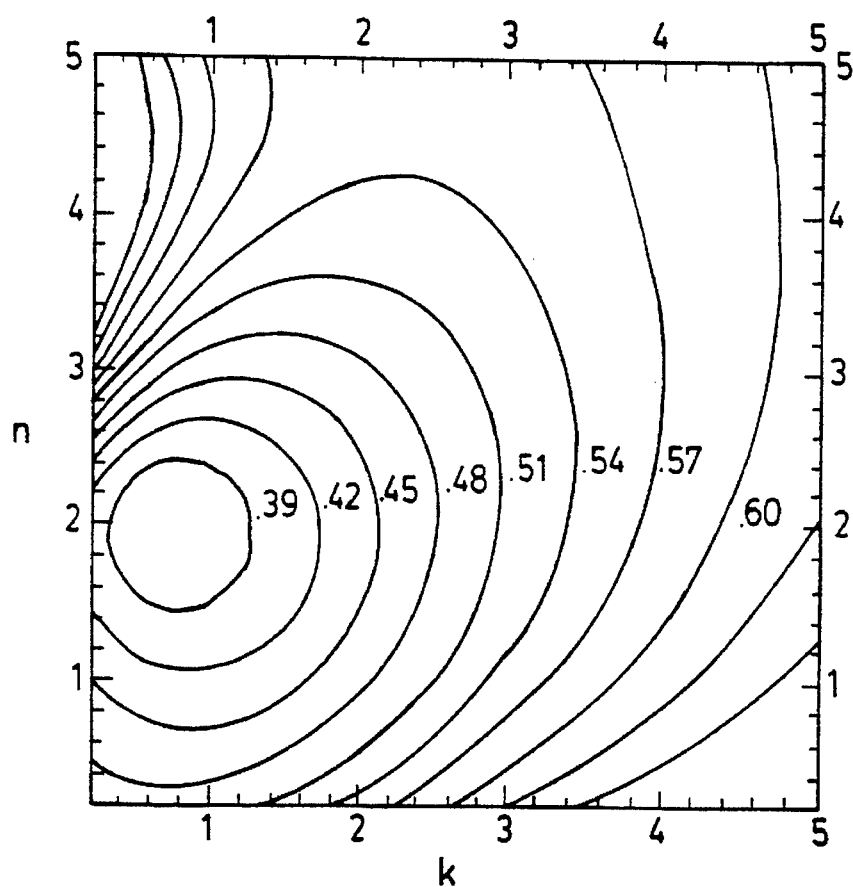
FIG. 4 is a graph illustrating a trace (equi-contour line) for a resist film thickness of 1000 nm.
Figure 5:
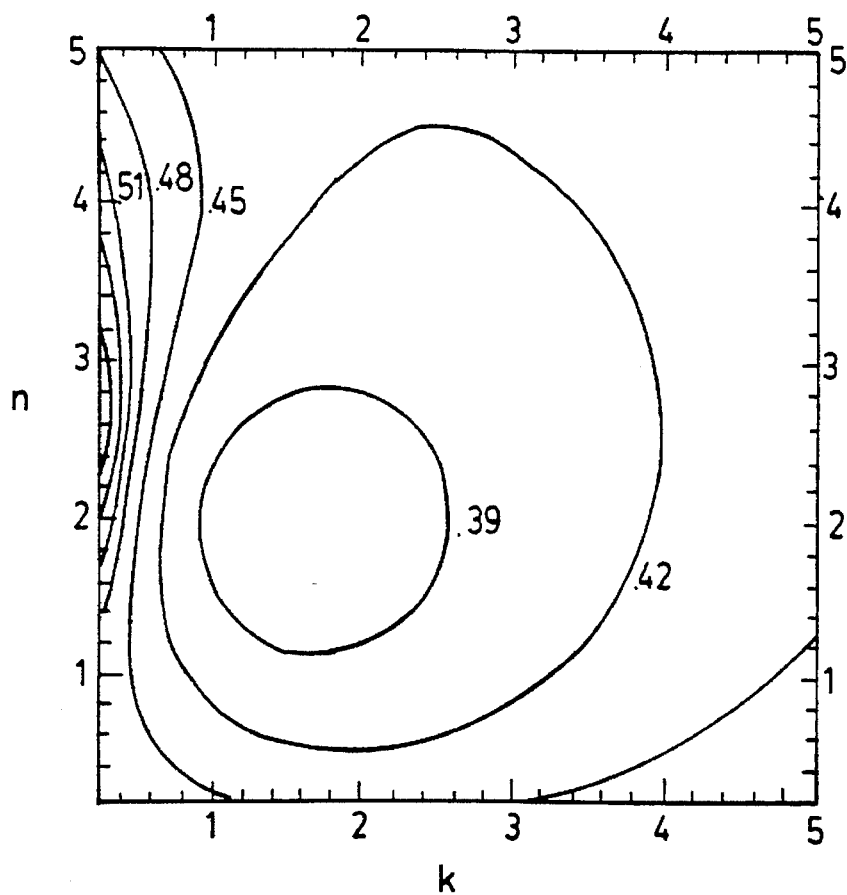
FIG. 5 is a graph illustrating a trace (equi-contour line) for a resist film thickness of 1018 nm.
Figure 6:
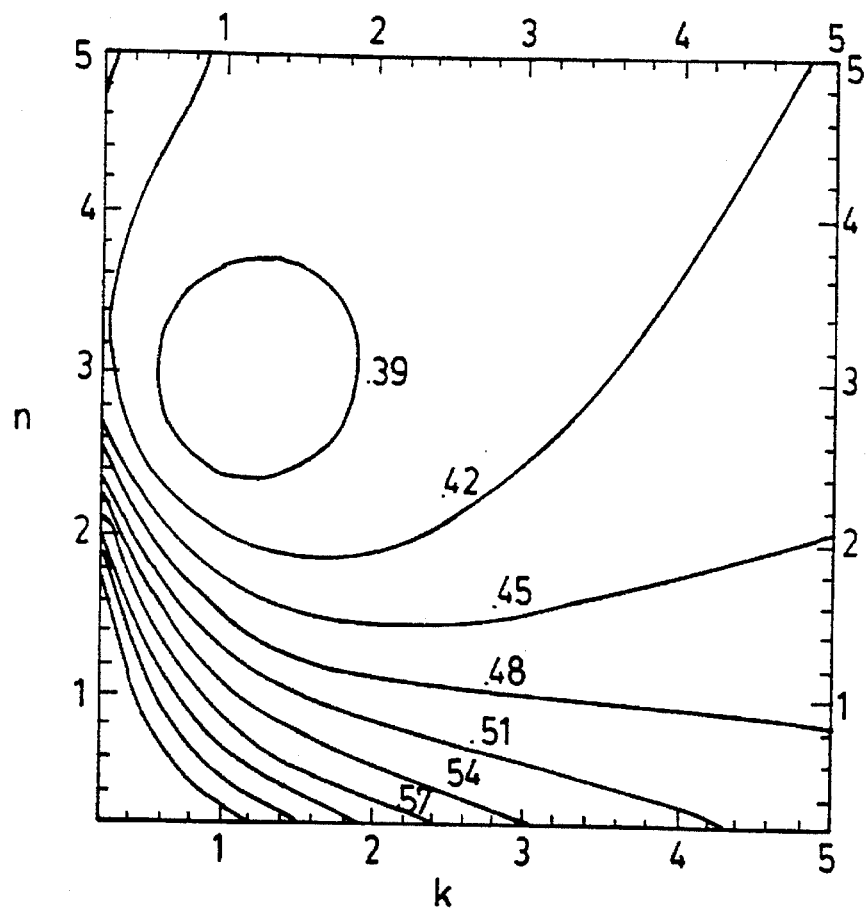
FIG. 6 is a graph illustrating a trace (equi-contour line) for a resist film thickness of 1035 nm.
Figure 7:
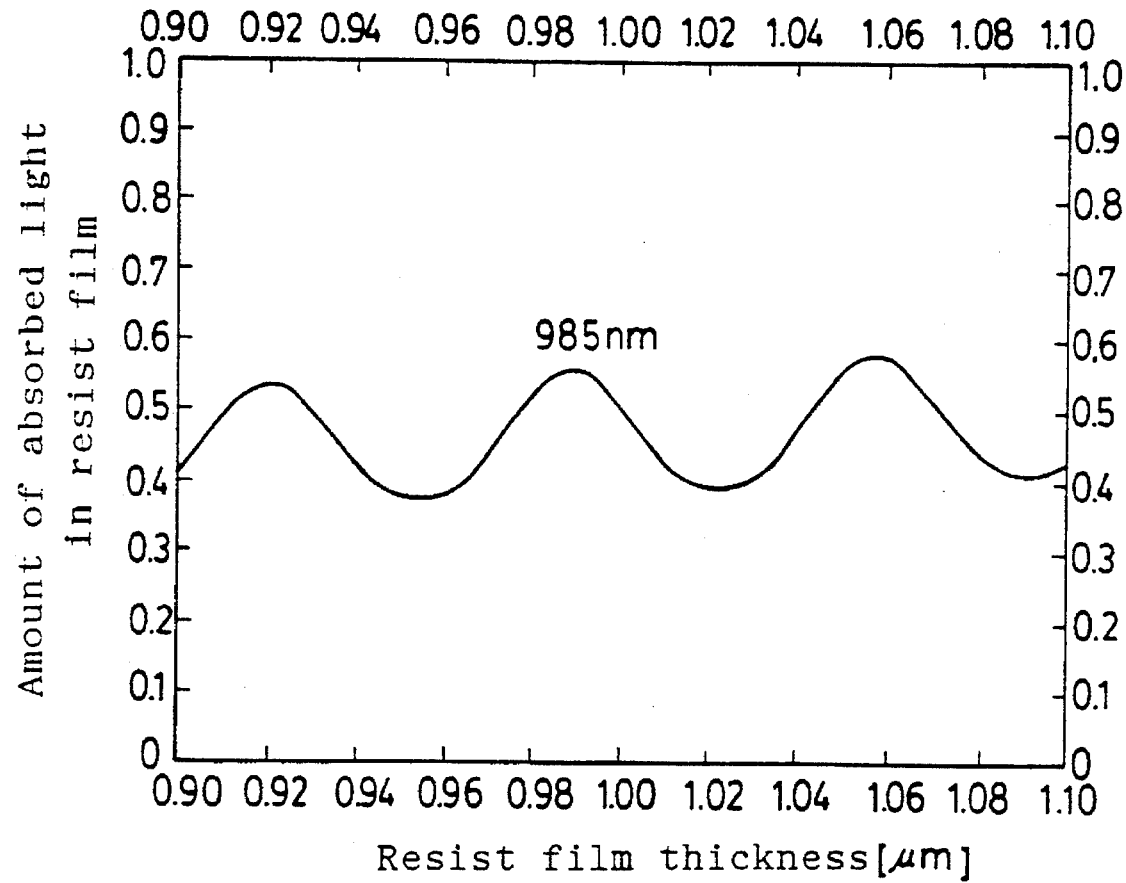
FIG. 7 is a graph illustrating the standing wave effect to be solved.

In this example, the present invention is applied to a determination of conditions to be satisfied by an anti-reflective layer (layer thickness, optical constant) for forming a stable pattern on a W—Si film by using an KrF excimer lithography. This example is practiced in accordance with the following steps (1)–(6):

(1) FIG. 7 shows a standing wave effect when XP 8843 resist (Shipley Microelectronics Co.) was coated on a W—Si film without an anti-reflective layer and exposed by an KrF excimer laser beam at a wavelength of 248 nm, followed by development. From FIG. 7, the standing wave effect was about ±20%.

Figure 8:
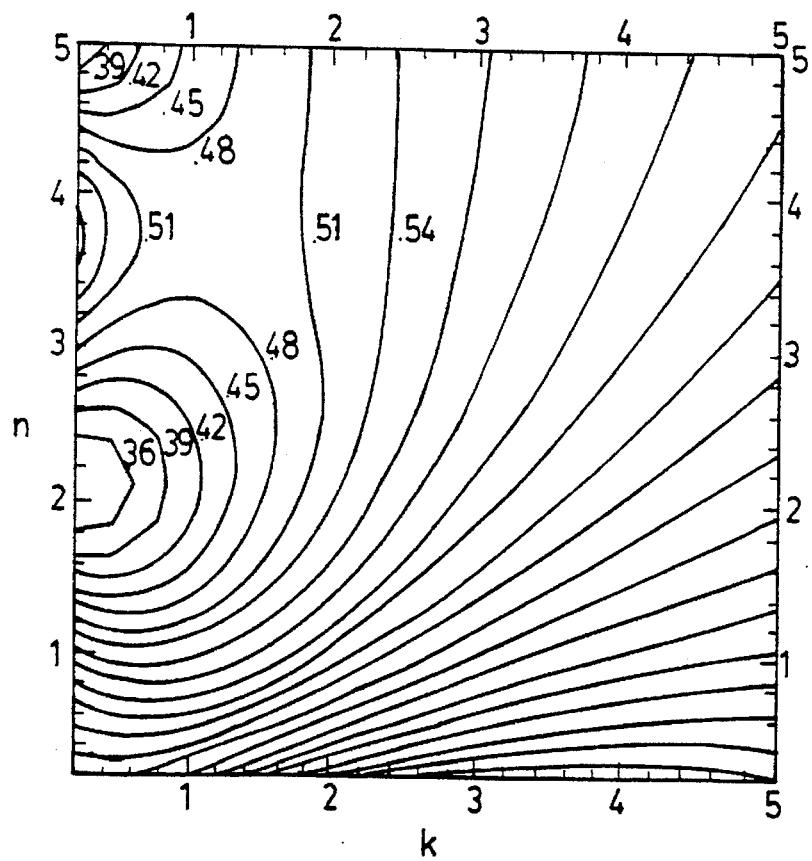
FIG. 8 is a graph of a trace of fluctuations for the amount of absorbed light in the resist film relative to variation of $n_{arl}$, $k_{arl}$, (equi-contour lines of absorbed light amount) for the resist film thickness of 985 nm in a case where the thickness of the anti-reflective layer is 30 nm.

(2) in FIG. 7, the maximum value of the standing wave effect is at a resist film thickness, for example, of 985 nm. FIG. 8 shows the fluctuation for the amount of absorbed light in the resist film relative to the change of optical constants $n_{arl}$ and $k_{arl}$ of the anti-reflective layer (equi-contour lines for the mount of absorbed light), taking notice on the resist film thickness of 985 nm and setting the layer thickness of the anti-reflective layer at 30 nm. In FIG. 8, a W—Si layer has an anti-reflective layer of 30 nm thickness covered by a resist film of 985 nm thickness.

Figure 9:
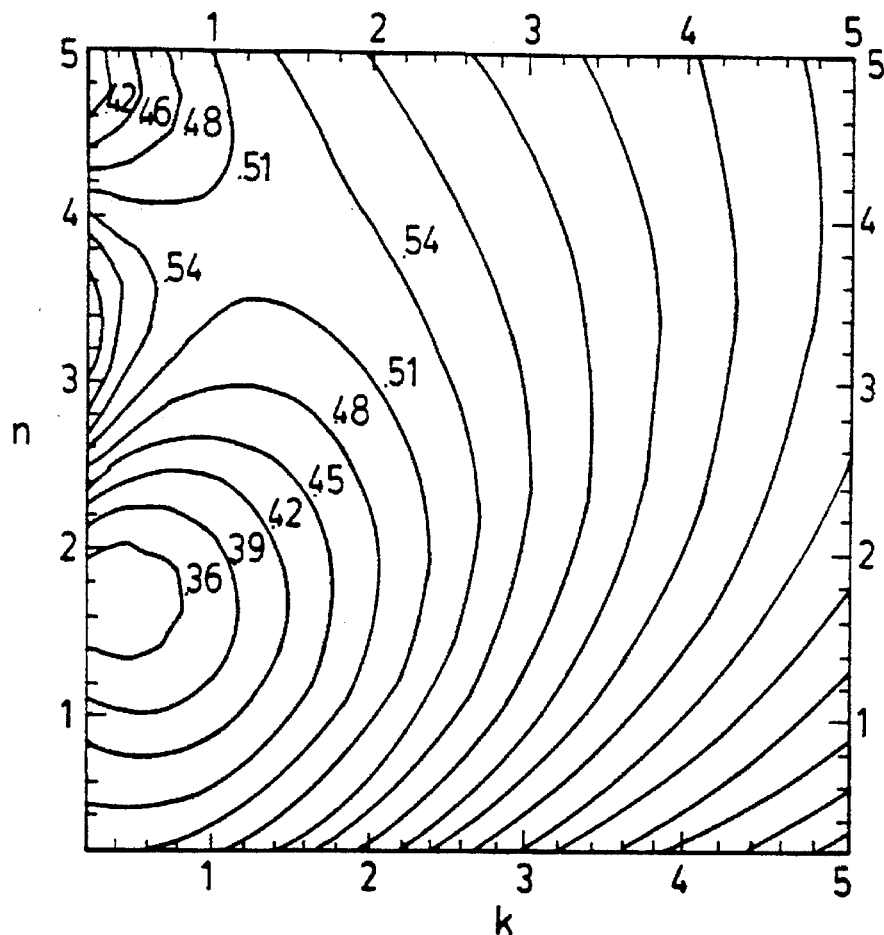
FIG. 9 is a graph illustrating a trace (equi-contour lines) for the resist film thickness of 1000 nm.
Figure 10:
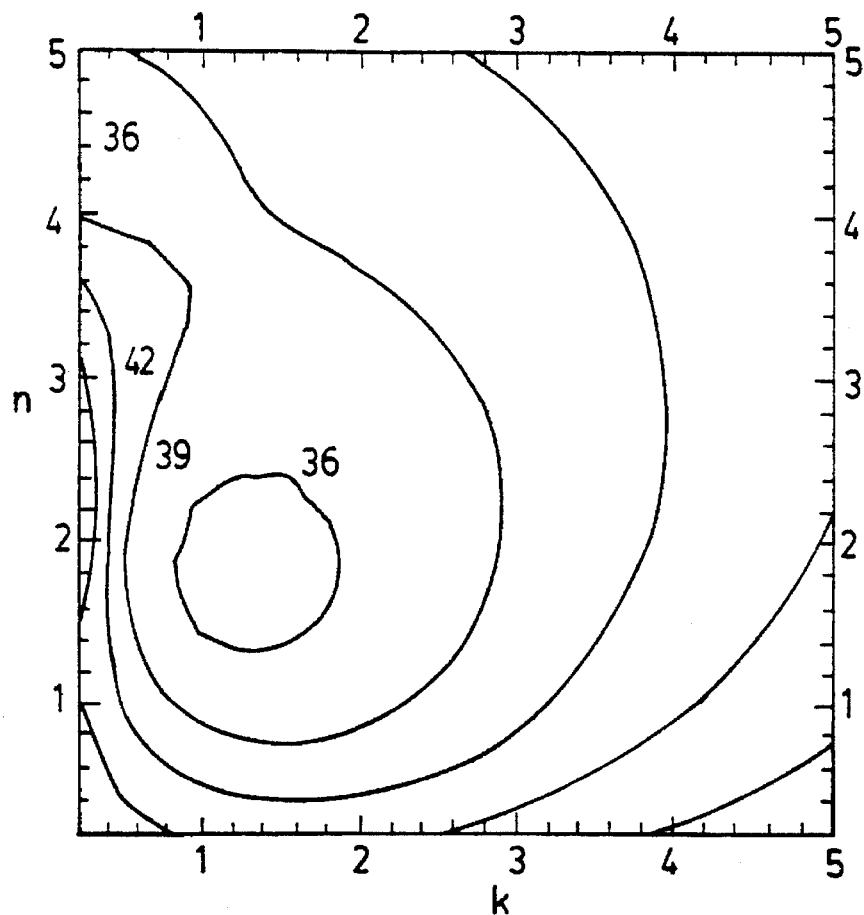
FIG. 10 is a graph illustrating the trace (equi-contour lines) for the resist film thickness of 1017.5 nm.
Figure 11:
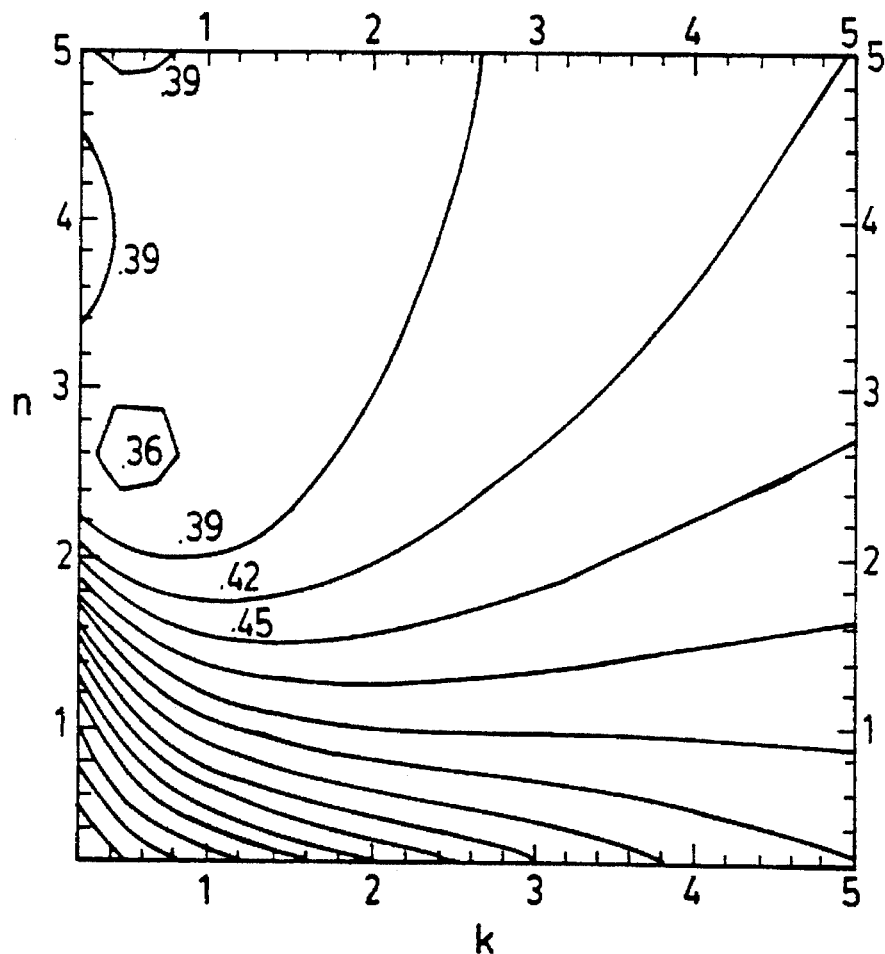
FIG. 11 is a graph illustrating the trace (equi-contour lines) for the resist film thickness of 1035 nm.

(3) FIGS. 9, 10 and 11 show the results of repeating the procedures (2) above to each of the resist film thicknesses of 1000 nm, 1017.5 nm and 1035 nm, respectively.

(4) As a result of determining a common region of FIGS. 8–11, $n_{arl}$=4.9, $k_{arl}$=0.1, or $n_{arl}$=2.15, $k_{arl}$=0.67 were obtained.

That is, the condition to be satisfied by the optimum anti-reflective layer with the thickness of the anti-reflective layer being set as 30 nm is:

$n_{arl}$=4.9, $k_{arl}$=0.1, or $n_{arl}$=2.15, $k_{arl}$=0.67.

Figure 12:
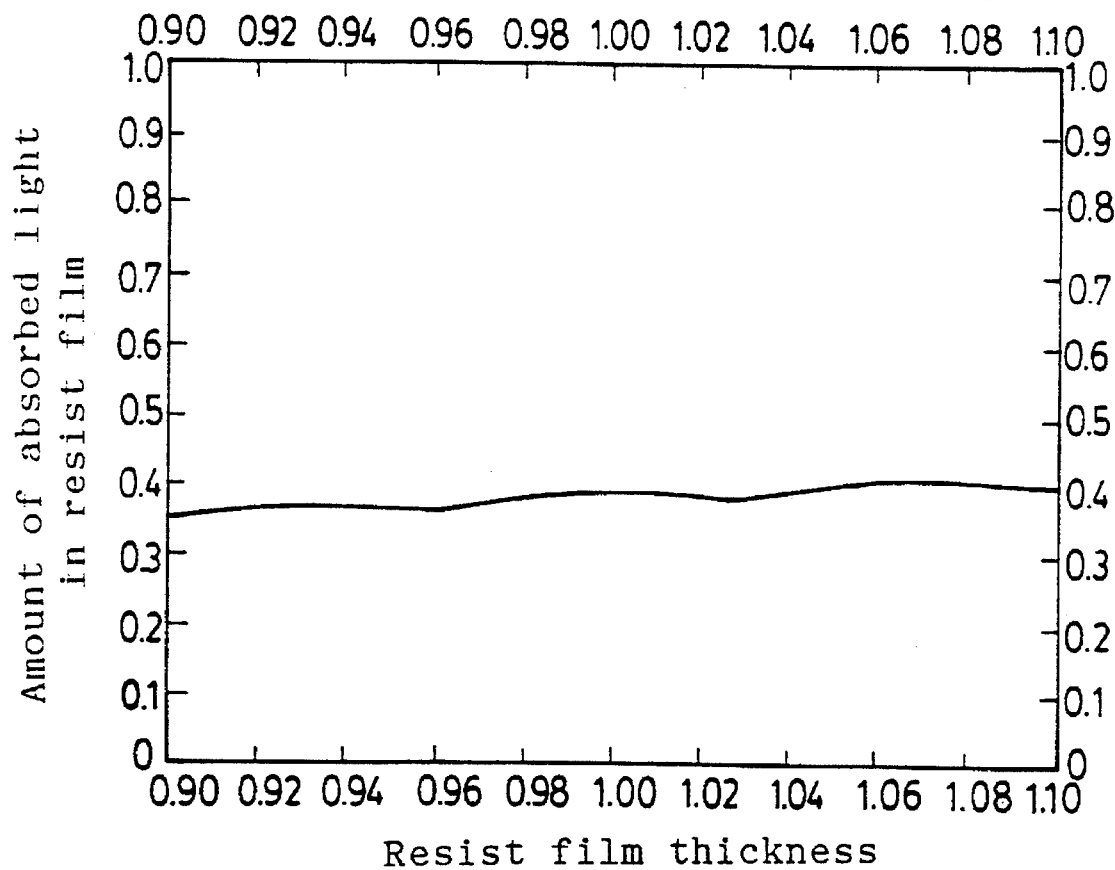
FIG. 12 is a graph illustrating the standing wave effect at the optimum condition (Example 1)
Figure 13:
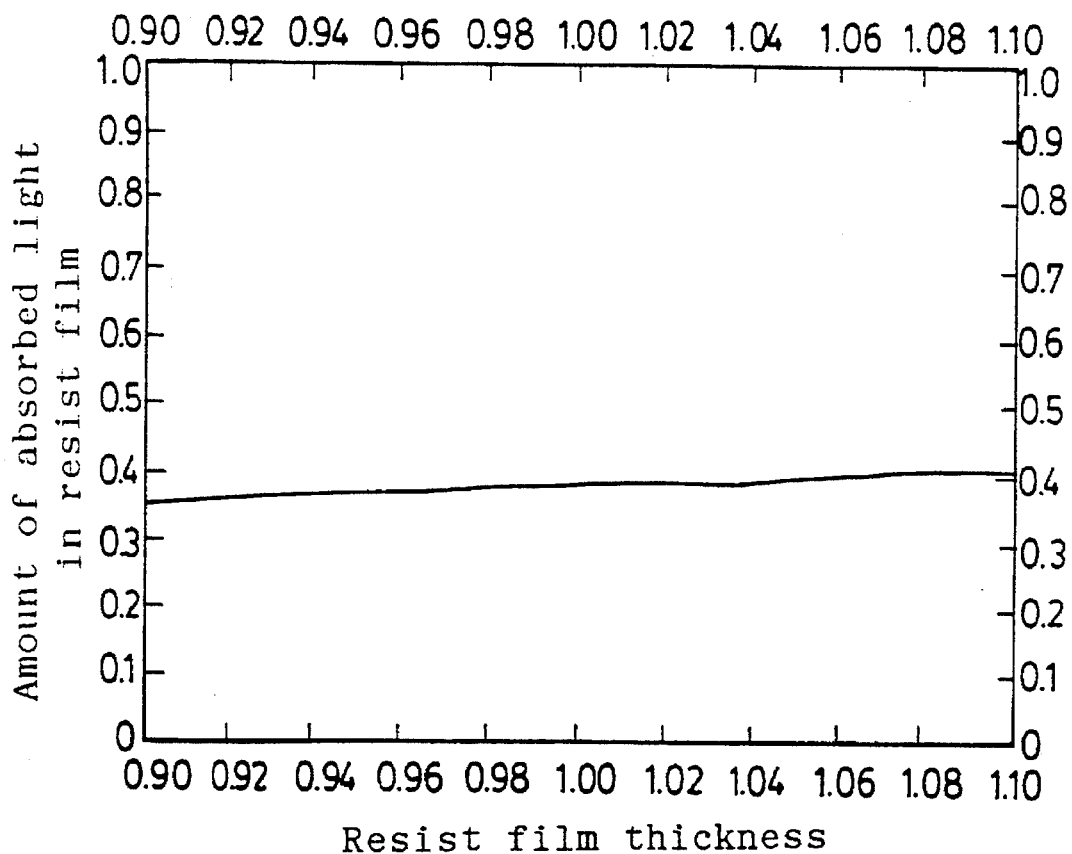
FIG. 13 is a graph illustrating the standing wave effect at the optimum condition (Example 1)

When the standing wave effect was determined by using the above-mentioned condition, the results shown in FIGS. 12 and 13 were obtained, with FIG. 12 having $n_{arl}$=2.15, $k_{arl}$=0.67 and FIG. 13 having $n_{arl}$=4.9 and $k_{arl}$=0.1. In FIGS. 12 and 13, the standing wave effect was extremely small and it was about ±1% in each of the cases. The standing wave effect was reduced to about 1/20 as compared with the case of not using the anti-reflective layer.

Figure 14:
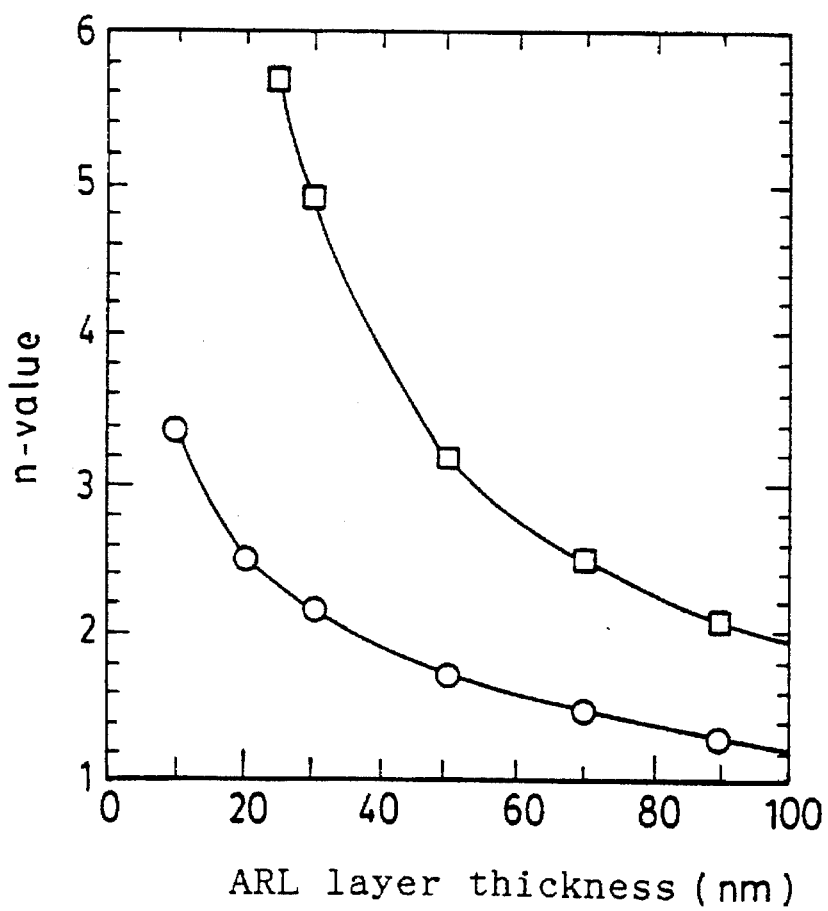
FIG. 14 is a graph illustrating a relationship between the thickness of the anti-reflective layer and reflection refractive index n as the optical condition.
Figure 15:
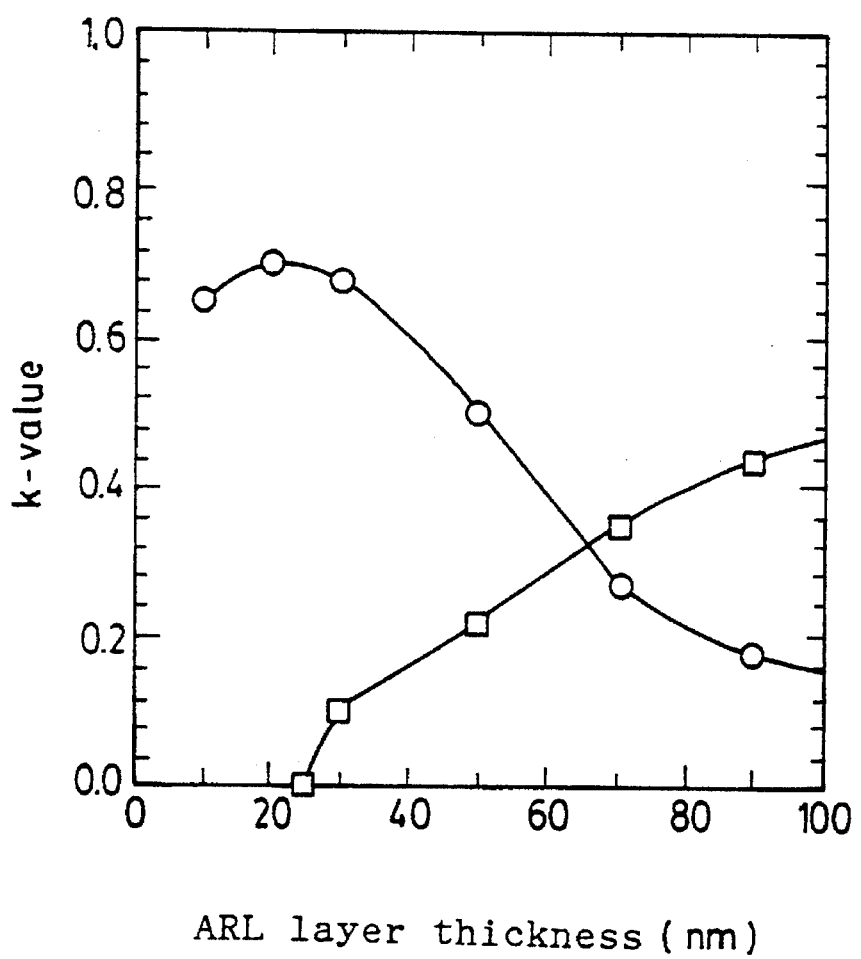
FIG. 15 is a graph illustrating a relationship between the thickness of the anti-reflective layer and absorptive refractive index k as the optical condition.

(5) The procedures (2)–(4) described above were conducted in a case of setting the thickness of the anti-reflective layer as 30 nm. When the procedures (2)–(4) were repeated also for other different layer thicknesses of anti-reflective layers (ARL thickness), an optimum condition for the anti-reflective layer in accordance with the thickness of the anti-reflective layer can be determined. FIGS. 14 and 15 show the obtained results, with FIG. 14 showing the relationship for n and FIG. 15 showing the relationship for k.

Figure 16:
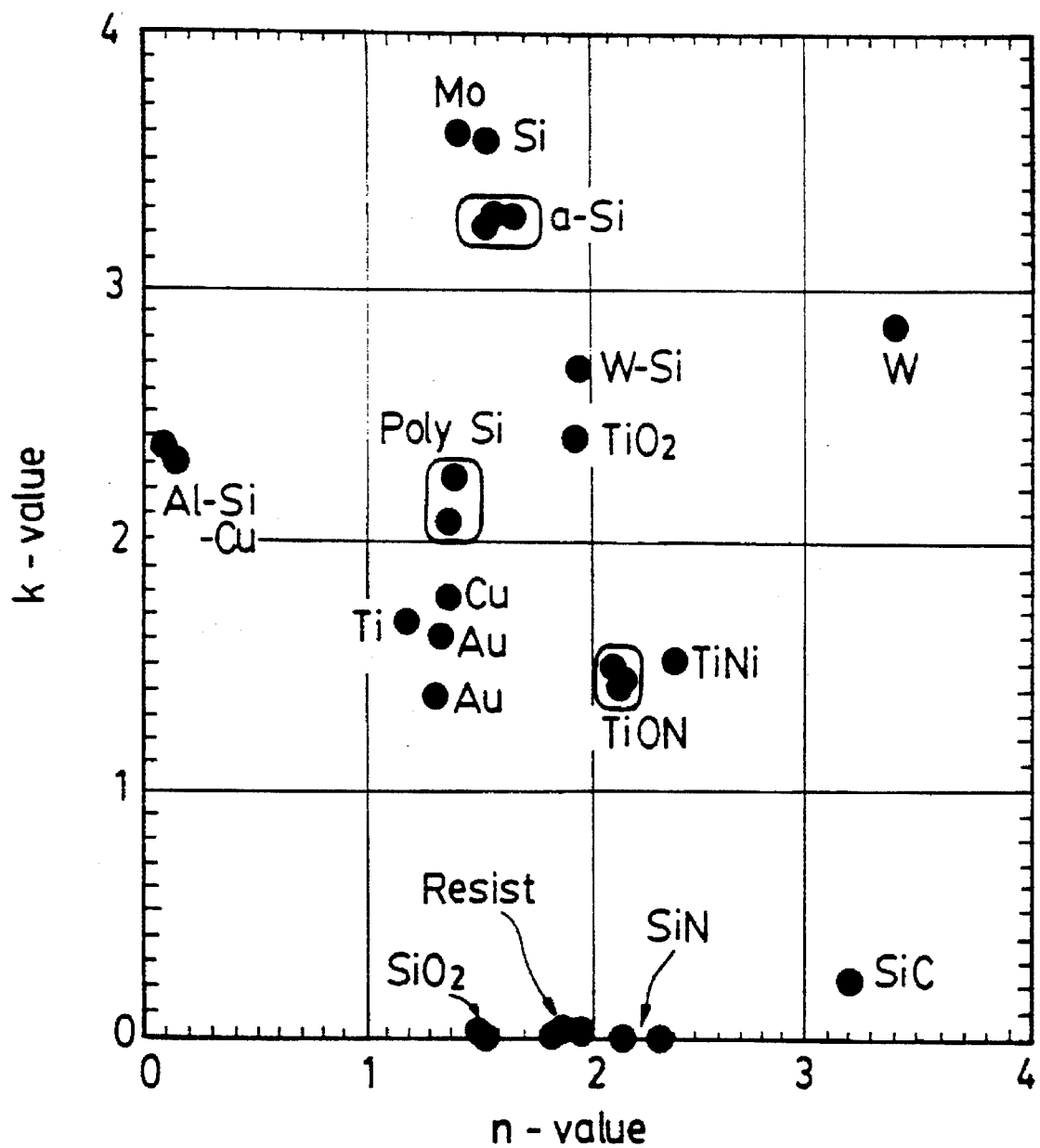
FIG. 16 is a chart illustrating n, k values for different reflective layer material.
Figure 17:
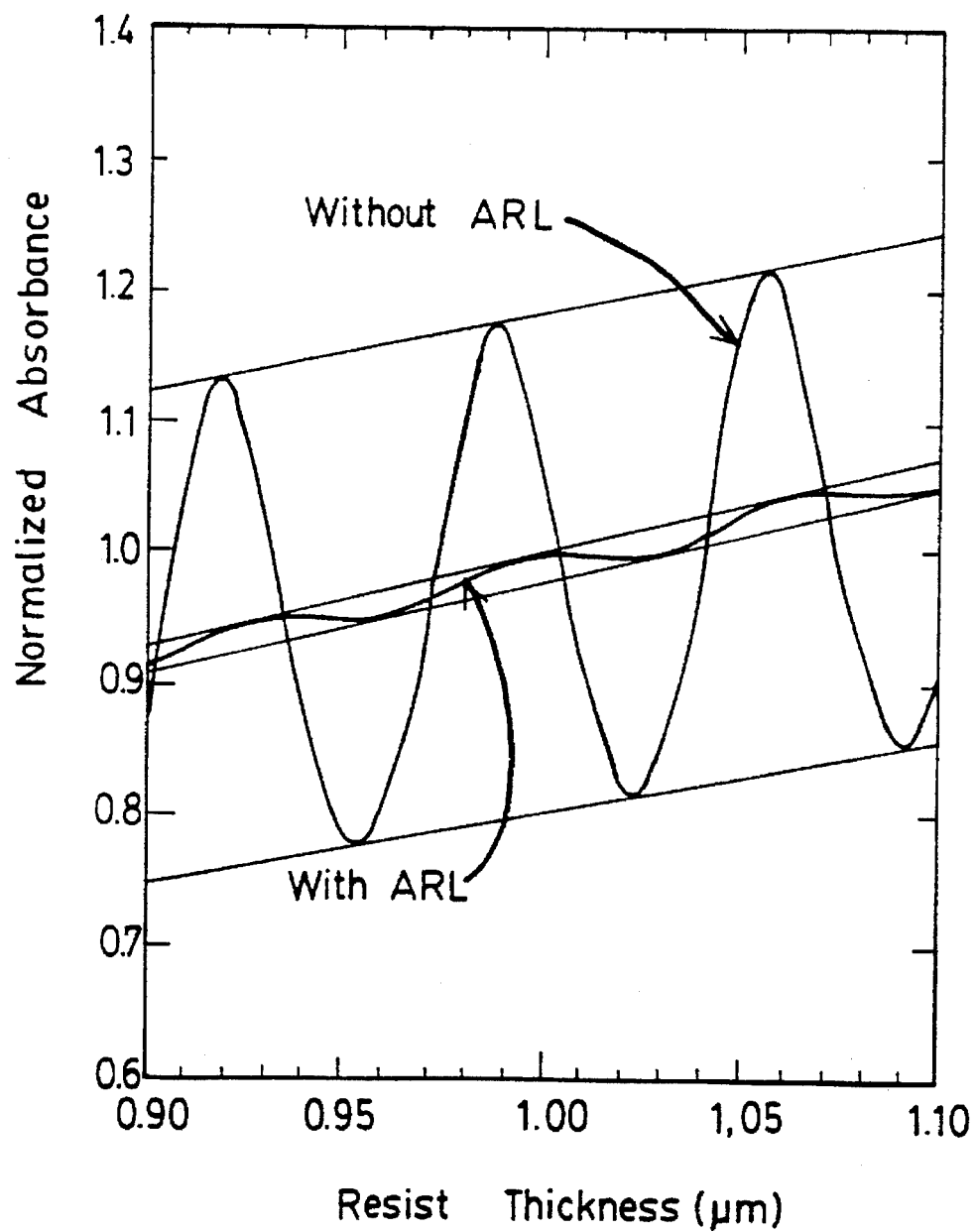
FIG. 17 is a graph illustrating the effect of an anti-reflective layer of SiC (50 nm film thickness) on W—Si in comparison with the prior art.
Figure 18:
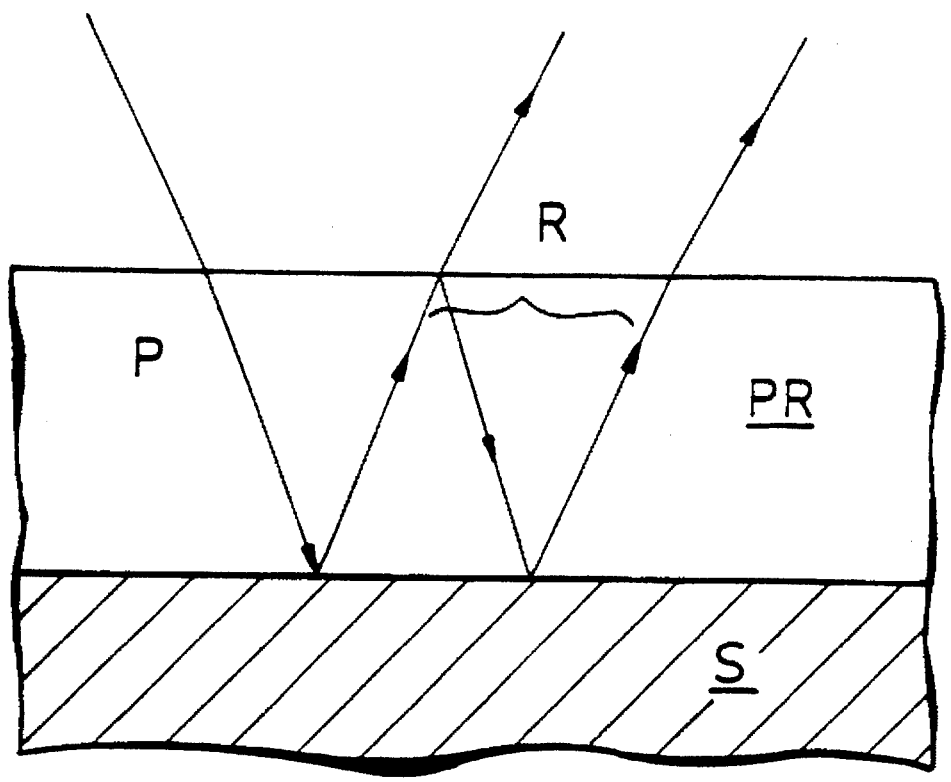
FIG. 18 is a diagrammatic view for the explanation of a problem in the prior art, which shows the interference of light in the resist film.
Figure 19:
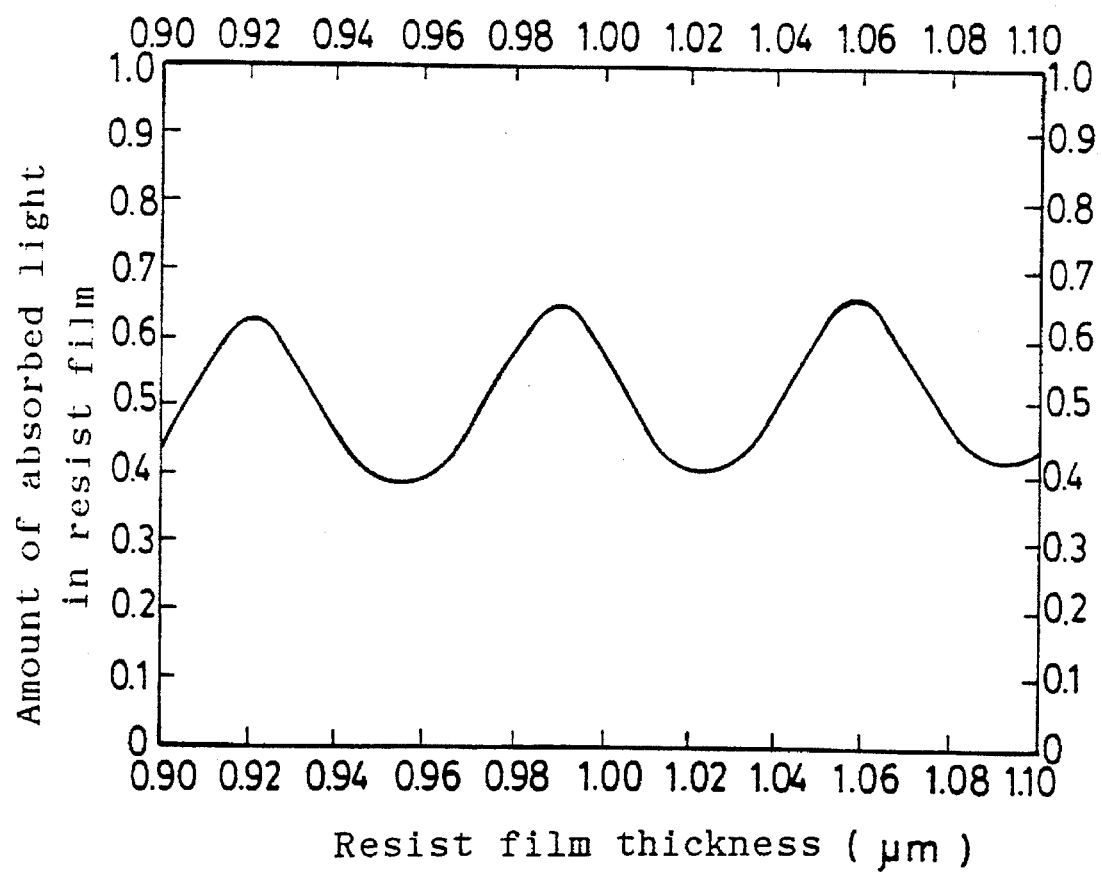
FIG. 19 is a graph for the explanation of a problem in the prior art, which shows the standing wave effect.

(6) It was investigated as to whether the film species capable of satisfying the condition to be met by the anti-reflective layer determined in (5) above is present or not, by using a spectroscopic ellipsometer ("MOSS System" manufactured by SOPRA Co.) and "Handbook of Optical Constants of Solids" (E. D. Palik, Academy press, 1985). As a result, an n, k chart shown in FIG. 16 was obtained. Substances having corresponding n, k are shown on the chart. From FIG. 16, it has been found that SiC (silicon carbide) at 50 nm can completely satisfy the conditions in FIGS. 14 and 15. FIG. 17 shows the standing wave effect in the case of using SiC at 50 nm thickness as an anti-reflective layer on W—Si and in a case of not using the anti-reflective layer. In a case of using SiC at 50 nm as the anti-reflective layer (graph for "with ARL" in the Figure), the standing wave effect was ±1%, which was reduced to about 1/20 as compared with the case of not using the anti-reflective layer (graph for "without ARL" in the Figure).

Example 2

In this example, an anti-reflective layer was formed by forming a SiC film with n=3.16±0.2 and k=0.24±0.1 shown in Example 1 by the following method:

That is, in this example, a film was formed by utilizing a thermal CVD process at a temperature of 100° C. to 1500° C. and under a pressure of 0.01 to 10,000 Pa by using the following gas as the starting material gas:

$SiCl_4+C_3H_8+H_2$,
$SiHCl_3+C_3H_8+H_2$,
$SiH_4+C_3H_8+H_2$,
$SiH_4+C_2H_4+H_2$,
$SiH_4+C_3H_8+H_2$,
$SiCl_3+CH_3+H_2$,
$SiH_4+C_3H_8+H_2$ or
$SiH_4+C_3H_8+H_2$.

Thus, SiC film having a desired anti-reflective effect could be obtained.

Example 3

In this example, a SiC film was formed as below to obtain an anti-reflective layer.

That is, in this example, a film was formed by utilizing a plasma CVD process and using a photochemical reaction from a gas mixture comprising: $Si_2H_5+Si(CH_3)H_3+C_2H_2$.

Example 4

In this example, a SiC film was formed as below to obtain an anti-reflective layer.

A film was formed by utilizing an ECR plasma process using a microwave (2.45 GHz) from a gas mixture comprising: $SiH_4+CH_4+H_2$.

Example 5

In this example, a SiC film was formed as below to obtain an anti-reflective layer. That is, a film was formed by utilizing a sputtering method using SiC as a target.

Example 6

In this example, an anti-reflective layer was formed by patterning a SiC film by etching.

In this case, the SiC film was etched by a reactive ion etching process using a $CF_4$, $CHF_3$, $C_2F_6$, $C_3F_8$, $SF_6$ or $NF_3$ series gas as an etchant and adding Ar to improve the ionic property, thereby obtaining an anti-reflective layer of a desired pattern.

Example 7

In this example, the present invention was applied by using SiC as an anti-reflective layer for forming a stable pattern on a W—Si film using KrF excimer lithography.

Figure 27:
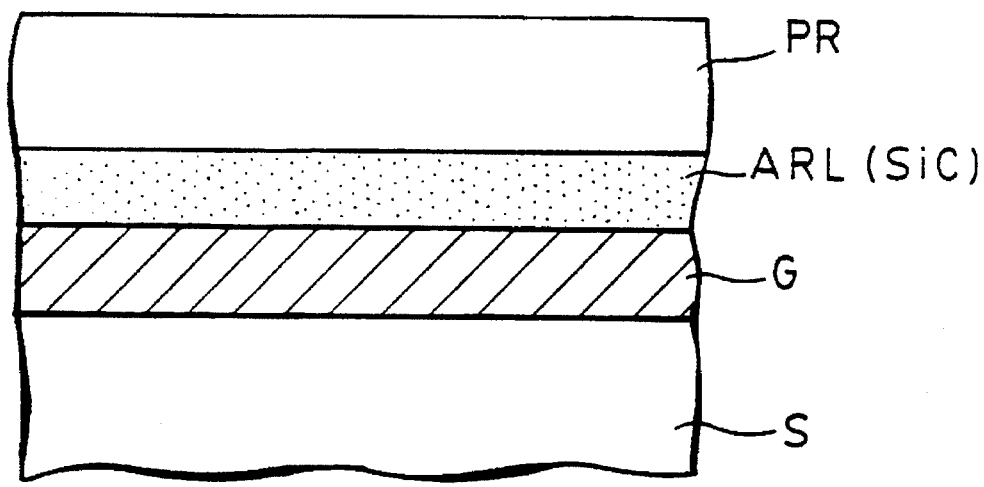
FIG. 27 is a cross sectional view for a portion illustrating the structure of Example 7.

In the method of forming a resist pattern in this example, as shown in FIG. 27, an anti-reflective layer ARL was formed with silicon carbide on a W—Si underlying material which was a high melting metal silicide and a photoresist PR was formed on the anti-reflective layer ARL, thereby forming a resist pattern.

In this example, the present invention is applied by using SiC as the anti-reflective layer ARL, particularly in a case of forming a material layer with W—Si as a gate, on a substrate, such as an Si semiconductor substrate and patterning the same by a photolithographic step using a photoresist PR and an etching step, thereby obtaining a gate structure.

At first, description will be made to the procedures for selecting SiC as the anti-reflective layer to be used on W—Si and a method of determining a condition to be satisfied by SiC. The following procedures (1)-(6) were conducted:

(1) XP 8843 resist (Shipley Microelectronics Co.) was coated on a W—Si film without an anti-reflective layer, which resist was exposed by an KrF excimer laser beam at a wave length of 248 nm, followed by development. FIG. 7 shows a standing wave effect in this case. From FIG. 7, the standing wave effect was about ±20%.

(2) In FIG. 7, the maximum value of the standing wave effect is at a resist film thickness, for example, of 985 nm. FIG. 8 shows fluctuation for the amount of absorbed light in the resist film relative to the change of optical constants $n_{arl}$ and $k_{arl}$ of the anti-reflective layer, which is between the resist film and W—Si film. The resist film has a thickness of 985 nm and the layer thickness of the anti-reflective layer is set to 30 nm.

(3) FIGS. 9, 10 and 11 show the results of repeating the procedures (2) above to each of the resist film thicknesses of 1000 nm, 1017.5 nm and 1035 nm, respectively.

(4) As a result of determining a common region in FIGS. 8–11:

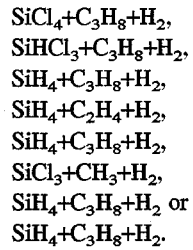

$n_{arl}$=4.9, $k_{arl}$=0.1, or $n_{arl}$=2.15, $k_{arl}$=0.67 were obtained.

That is, the condition to be satisfied by the optimum anti-reflective layer with the thickness of the anti-reflective layer being set as 30 nm is:

$n_{arl}$=4.9, $k_{arl}$=0.1, or $n_{arl}$=2.15, $k_{arl}$=0.67.

When the standing wave effect was determined by using the above-mentioned condition, the results shown in FIGS. 12 and 13 were obtained. In FIGS. 12 and 13, the standing wave effect was extremely small and it was about ±1% in each of the cases. The standing wave effect was reduced to about 1/20 as compared with the case of not using the anti-reflective layer.

(5) The procedures (2)-(4) described above were conducted in a case of setting the thickness of the anti-reflective layer as 30 nm. When the procedures (2)-(4) were repeated also for other different layer thicknesses of anti-reflective layer (ARL thickness), an optimum condition for the anti-reflective layer in accordance with the thickness of the anti-reflective layer could be determined. FIGS. 14 and 15 show the obtained results.

(6) It was investigated as to whether the film species capable of satisfying the condition to be met by the anti-reflective layer determined in (5) above is present or not by using a spectroscopic ellipsometer ("MOSS System" manufactured by SOPRA Co.) and "Handbook of Optical Constants of Solids" (E. D. Palik, Academy Press, 1985). As a result, an n, k chart shown in FIG. 16 was obtained. Substances having corresponding n, k are shown on the chart. From FIG. 16, it has been found that SiC (silicon carbide) at 50 nm can completely satisfy the conditions in FIGS. 14 and 15. FIG. 17 shows the standing wave effect in a case of using SiC at 50 nm thickness as the anti-reflective layer on W—Si and in a case of not using the anti-reflective layer. In a case of using SiC at 50 nm as the anti-reflective layer (graph for "with ARL" in the Figure), the standing wave effect was ±1%, which was reduced to about 1/20 as compared with the case of not using the anti-reflective layer (graph for "without ARL" in the Figure).

Example 8

In this example, an anti-reflective layer was formed by forming an SiC film with n=3.16±0.2 and k=0.24±0.1 shown in Example 1 by the following methods.

That is, in this example, a film was formed by utilizing a thermal CVD process at a temperature of 100° C. to 1500° C. and under a pressure of 0.01 to 10,000 Pa by using the following gas as the starting material:

$SiCl_4+C_3H_8+H_2$,
$SiHCl_3+C_3H_8+H_2$,
$SiH_4+C_3H_8+H_2$,
$SiH_4+C_2H_4+H_2$,
$SiH_4+C_3H_8+H_2$,
$SiCl_3+CH_3+H_2$,
$SiH_4+C_3H_8+H_2$ or
$SiH_4+C_3H_8+H_2$.

Thus, SiC films having a desired anti-reflective effect could be obtained.

Example 9

In this example, a SiC film was formed as below to obtain an anti-reflective layer.

That is, in this example, a film was formed by utilizing a plasma CVD process and using a photochemical reaction for a gas mixture comprising: $Si_2H_6+Si(CH_3)H_3+C_2H_2$.

Example 10

In this example, a SiC film was formed as below to obtain an anti-reflective layer.

A film was formed by utilizing an ECR plasma process using a microwave (2.45 GHz) from a gas mixture comprising: $SiH_4+CH_4+H_2$.

Example 11

In this example, a film was formed by utilizing an ECR plasma CVD process from $SiH_4+C_2H_4$ gas by a plasma process using a microwave at 2.45 GHz.

Example 12

A SiC film was formed as below to obtain an anti-reflective layer. A film was formed by a sputtering method using SiC as a target.

Example 13

In this example, an anti-reflective layer was formed by patterning a SiC film by etching.

In this case, the SiC film was etched by a reactive ion etching process using $CF_4$, $CHF_3$, $C_2F_6$, $C_3F_8$, $SF_6$ or $NF_3$ series gas (or a mixed gas system) as an etchant and adding Ar to improve the ionic property, thereby obtaining an anti-reflective layer of a desired pattern.

Example 14

In this example, the present invention was applied by using SiC as the anti-reflective layer for forming a stable pattern on an Al, Al—Si or Al—Si—Cu film as the Al series material using KrF excimer lithography.

Figure 28:
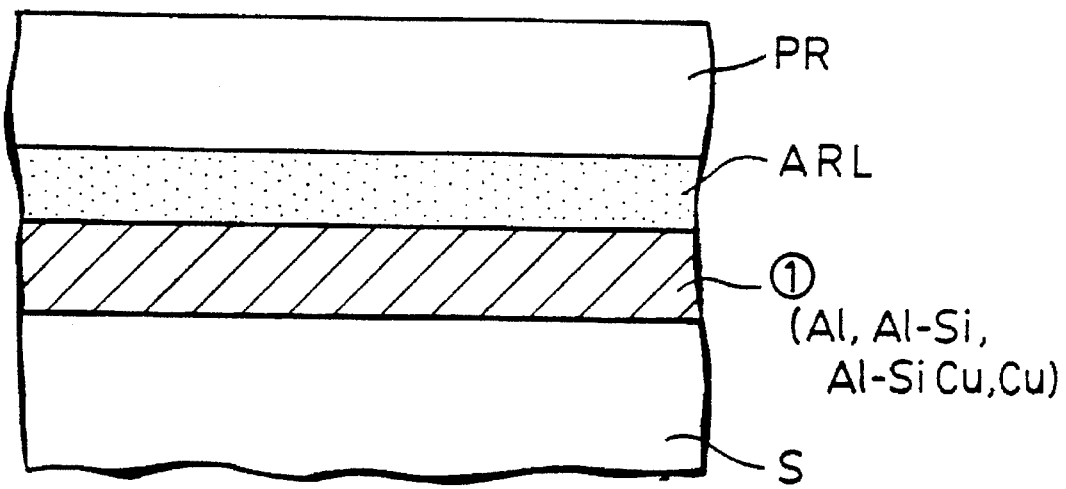
FIG. 28 is a cross sectional view for a portion illustrating the structure of Example 14.

As shown in FIG. 28, in the method of forming the resist pattern in this example, an anti-reflective layer ARL was formed with silicon carbide on Al, Al—Si or Al—Si—Cu as an Al series metal wiring material (1) and forming a photoresist PR on the anti-reflective layer ARL thereby forming a resist pattern.

In this example, the present invention was applied, particularly, in the case of obtaining a wiring structure by forming a material layer as a wiring with Al, Al—Si or Al—Si—Cu on a substrate S, such as a Si semiconductor substrate, and patterning the same by a photolithographic step using the photoresist PR and an etching step, in which SiC was used as the anti-reflective layer ARL. As Al—Si, there can be preferably used, in addition to a generally used Al—Si alloy containing 1 wt % Si generally used, an alloy with lower or higher Si content. This example is preferably applicable to Al—Si—Cu in which Si is about 1 wt % and Cu is about 0.1 to 2 wt %, with no particular restriction only thereto. Typically, Al—Si—Cu alloy of 1 wt % Si, 0.5 wt % Cu is used.

At first, a description will be made of the procedures for selecting SiC as an anti-reflective layer used on Al, Al—Si or Al—Si—Cu as the Al series metal, as well as a method of determining the condition to be satisfied by SiC. The following procedures (1)–(6) were conducted.

Figure 29:
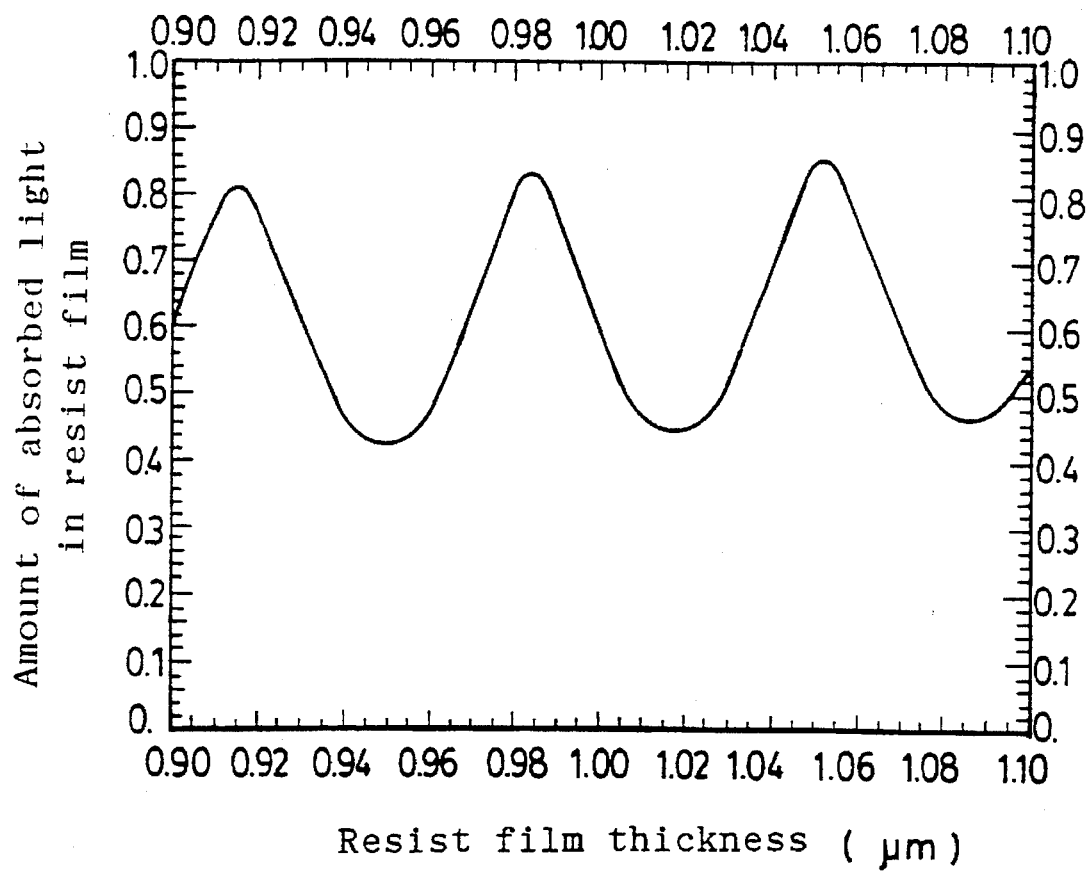
FIG. 29 is a graph illustrating the standing wave effect.

(1) XP 8843 resist (manufactured by Shipley Microelectronics Co.) was coated on an Al, Al—Si or Al—Si—Cu film without an anti-reflective layer and exposed by a KrF excimer laser beam at a wave length of 248 nm, followed by development. FIG. 29 shows the standing wave effect in this case. As shown in FIG. 29, the standing wave effect was about ±29.6%.

Figure 30:
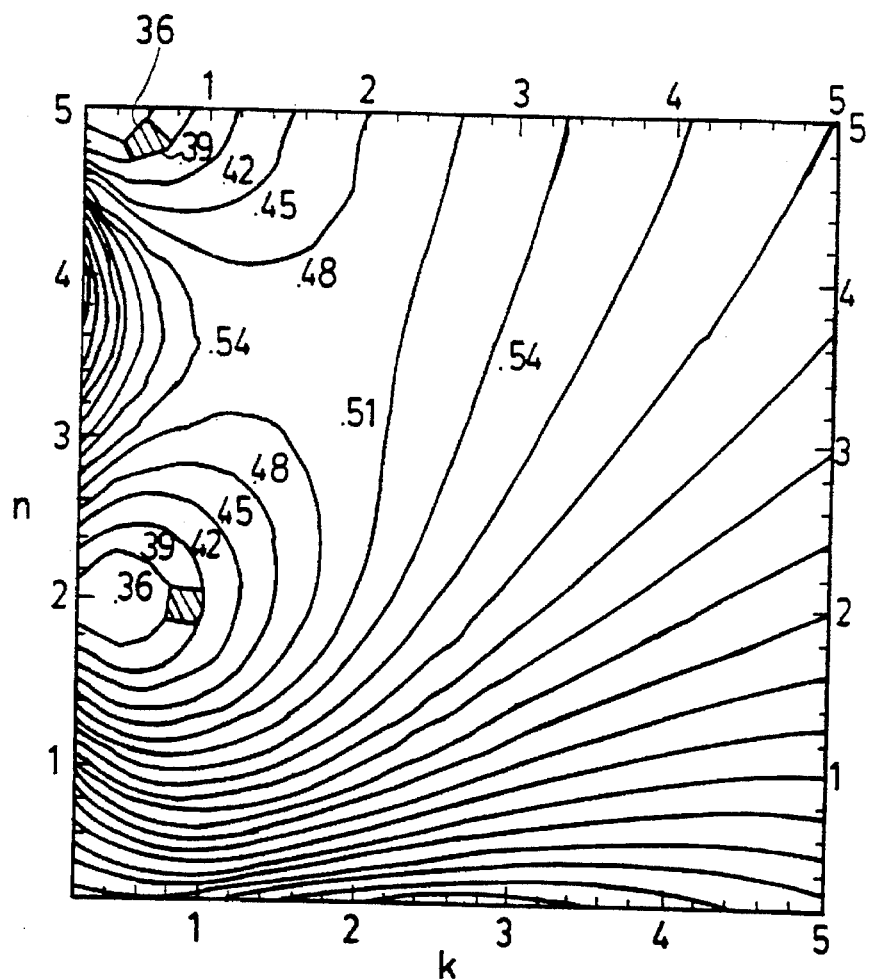
FIG. 30 is a graph of a trace of fluctuations for the amount of absorbed light in the resist film relative to variation of $n_{arl}$, $k_{arl}$, (equi-contour lines of absorbed light amount) for the resist film thickness of 982 nm in a case where the thickness of the anti-reflective layer is 30 nm.

(2) In FIG. 29, the maximum value of the standing wave effect situates, for example, at 982 nm of the resist film thickness. FIG. 30 shows the fluctuation for the amount of absorbed light (equi-contour lines for the amount of absorbed light) in the resist film relative to the change of optical constants $n_{arl}$, $k_{arl}$ of the anti-reflective layer that is between the resist layer and the Al, Al—Si or Al—Si—Cu film. The resist film has a thickness of 982 nm, and the thickness of the anti-reflective layer is set at 30 nm.

Figure 31:
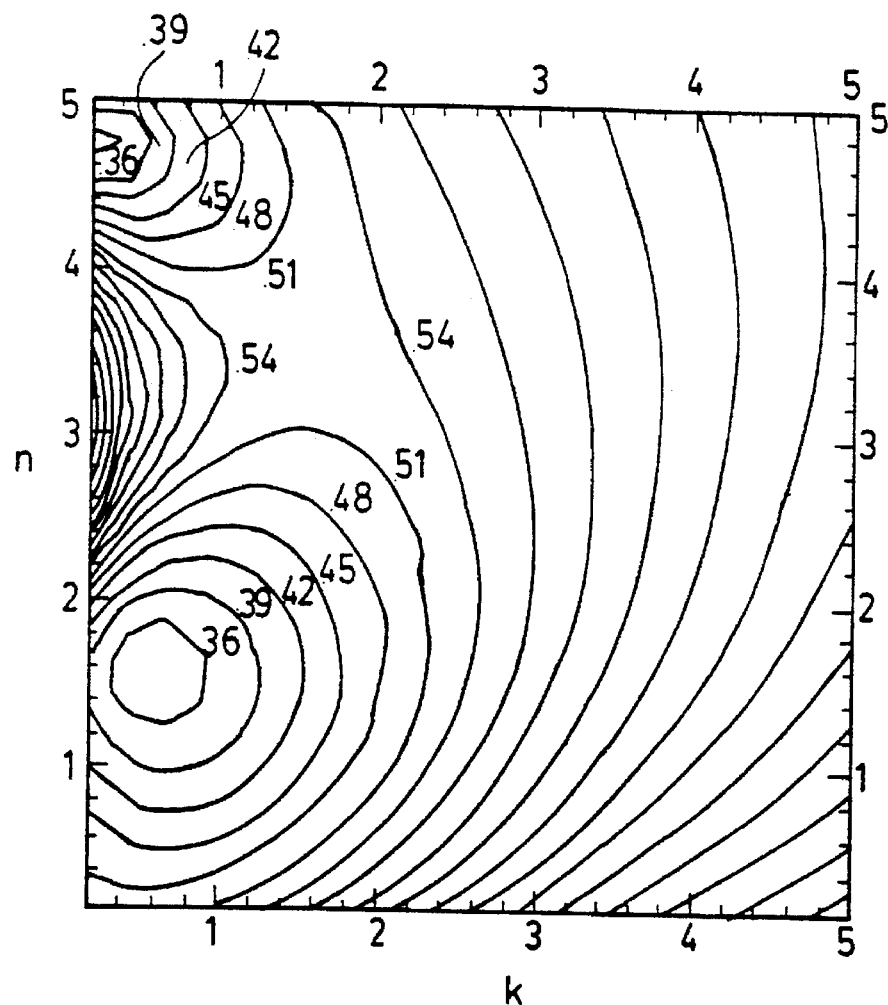
FIG. 31 is a graph illustrating the trace (equi-contour lines) for the resist film thickness of 1000 nm.
Figure 32:
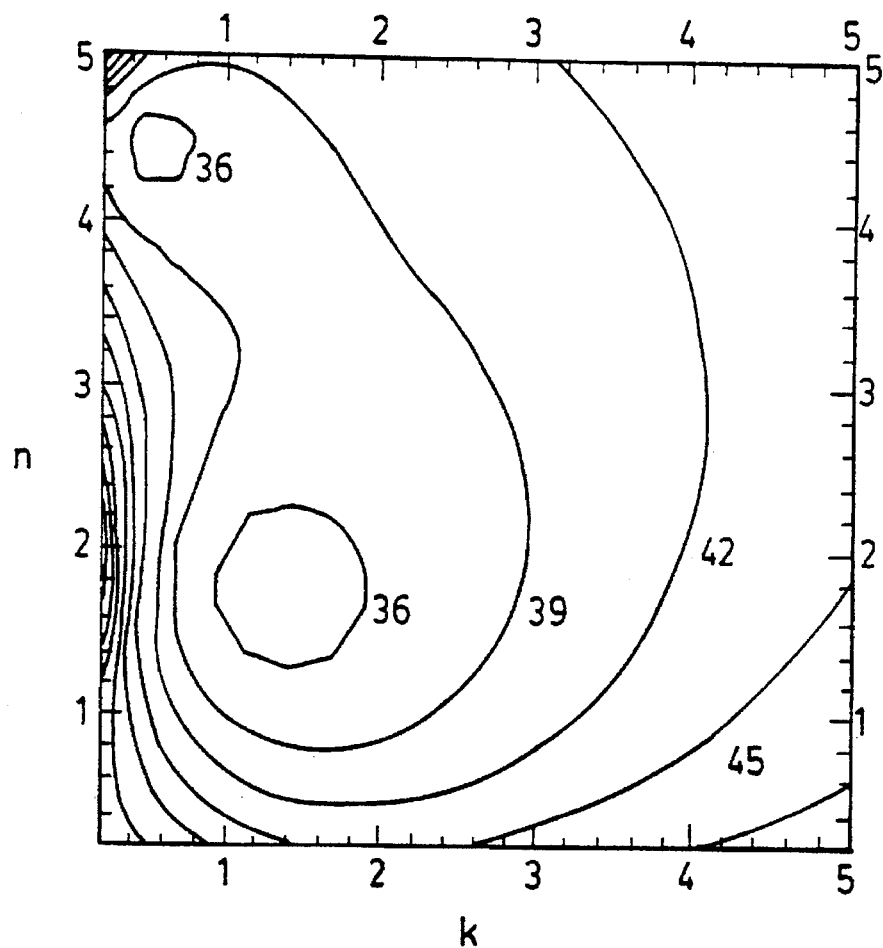
FIG. 32 is a graph illustrating the trace (equi-contour lines) for the resist film thickness of 1018 nm.
Figure 33:
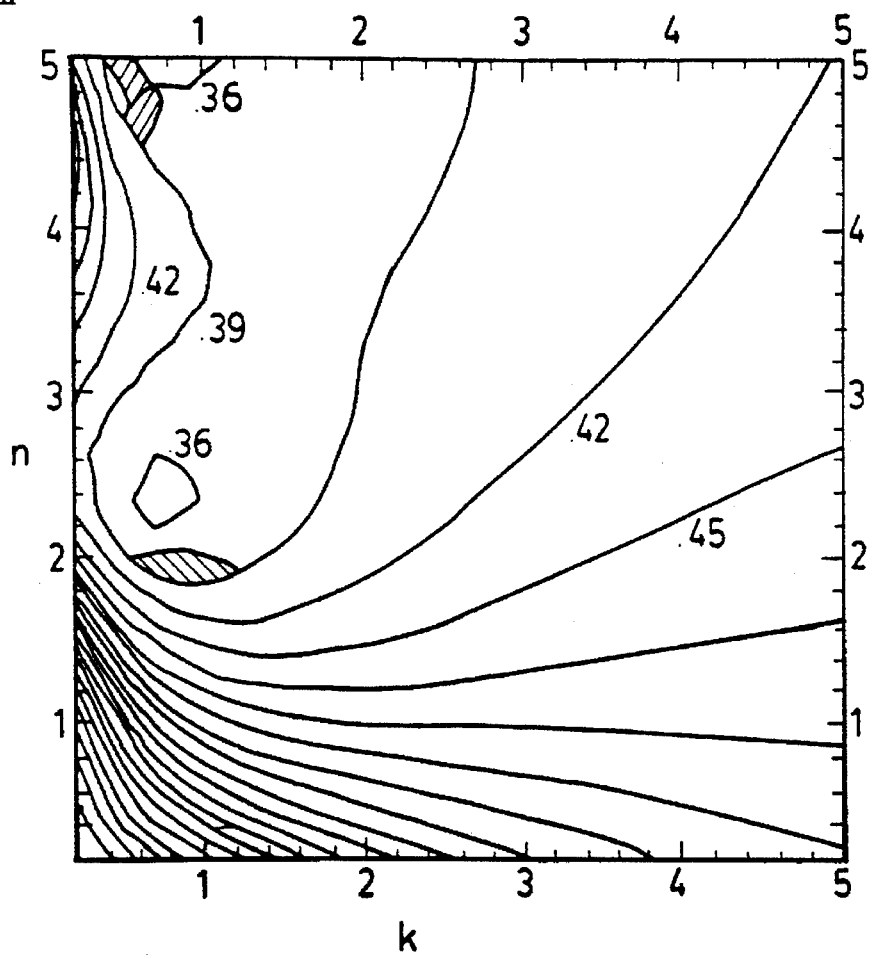
FIG. 33 is a graph illustrating the trace (equi-contour lines) for the resist film thickness of 1035 nm.

(3) FIGS. 31, 32 and 33 show results of repeating the procedure (2) described above for the resist film thicknesses of 1000 nm, 1018 nm and 1035 nm, respectively.

(4) As a result of determining a common region in FIG. 30 to FIG. 33, $n_{arl}=4.8$, $k_{arl}=0.45$, or $n_{arl}=2.0$, $k_{arl}=0.8$ was obtained.

That is, the condition to be satisfied by the optimum anti-reflective layer upon setting the thickness of the anti-reflective layer as 30 nm was:

$n_{arl}=4.8, k_{arl}=0.45$, or $n_{arl}=2.0, k_{arl}=0.8$.

Figure 34:
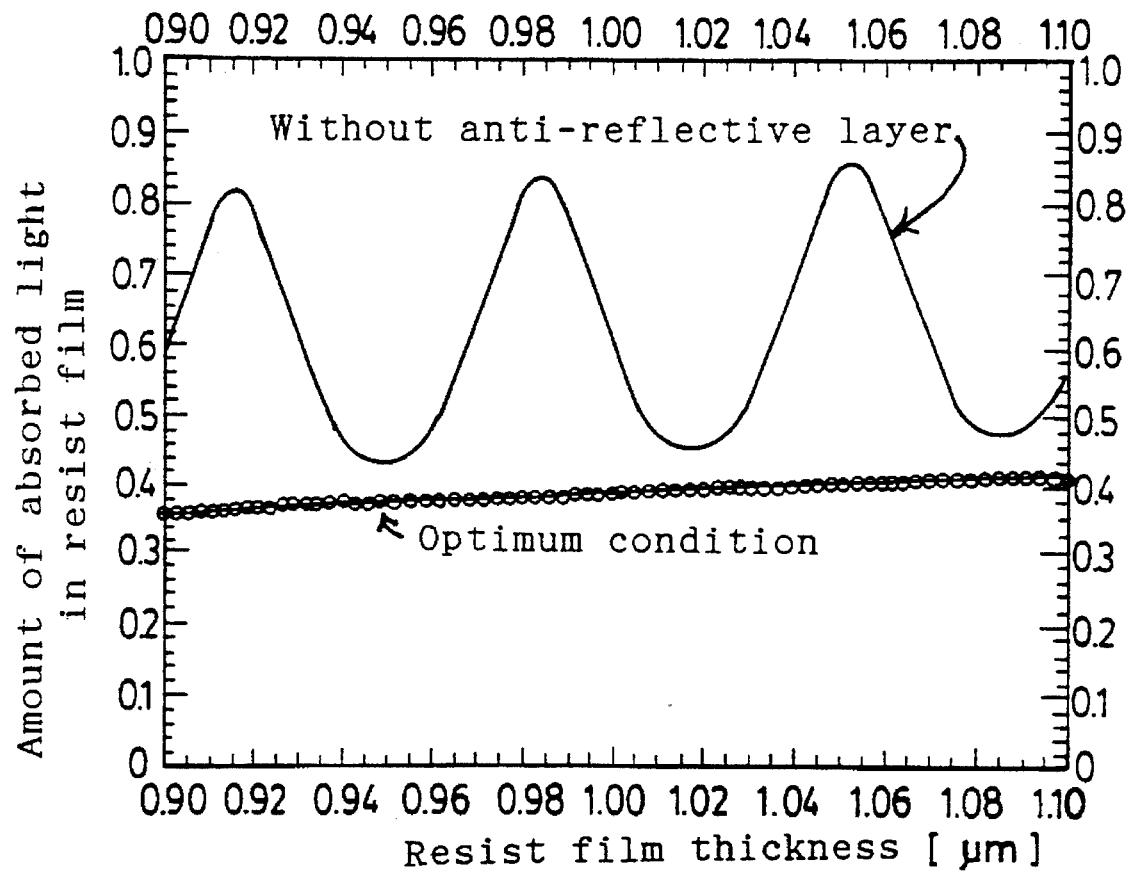
FIG. 34 is a graph illustrating the standing wave effect at the optimum condition.
Figure 35:
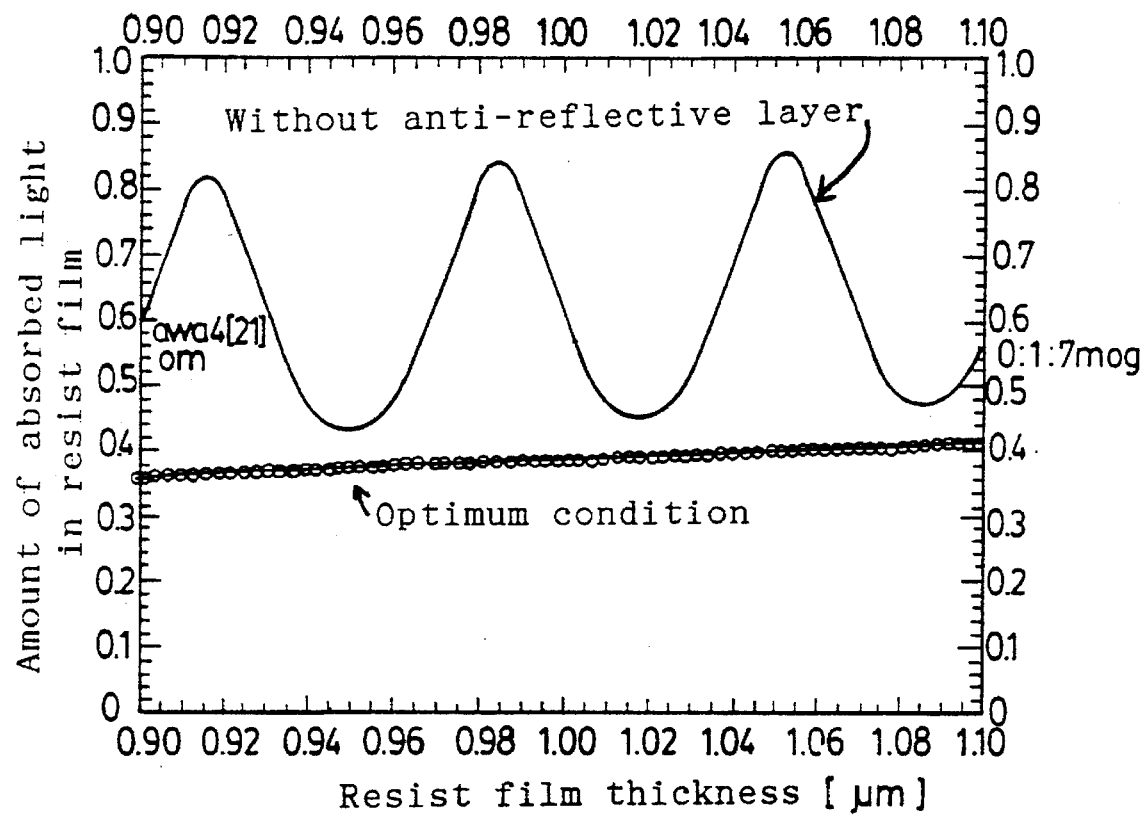
FIG. 35 is a graph illustrating the standing wave effect at the optimum condition.

When the standing wave effect was determined by using this condition, results shown by the "optimum condition" in FIG. 34 and FIG. 35 were obtained. As apparent from the comparison with "without anti-reflective layer" in FIGS. 34 and 35, the standing wave effect was extremely small, which was about less than ±1% in each of the cases. As compared with the case without anti-reflective layer, the standing wave effect was reduced to about 1/30.

Figure 36:
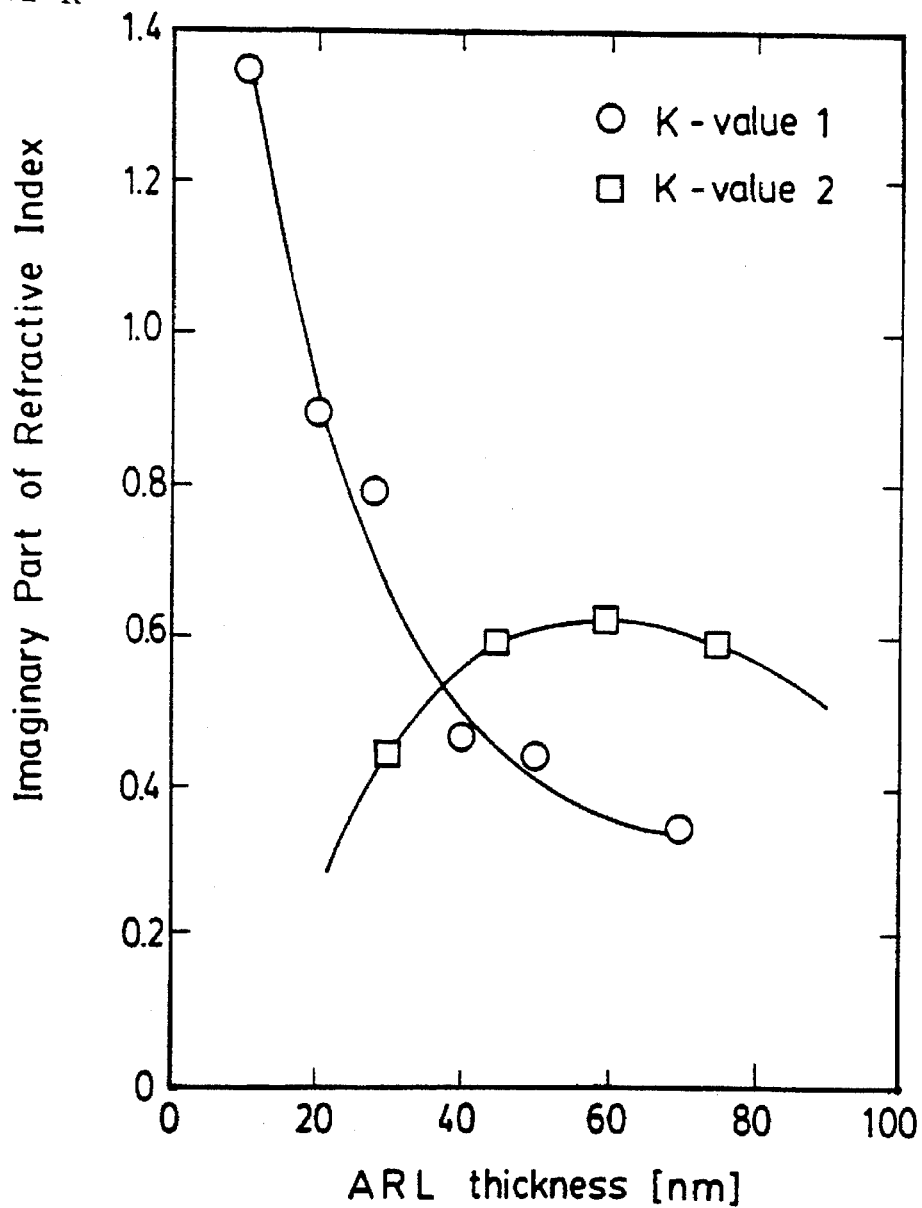
FIG. 36 is a graph illustrating a relationship between the film thickness and k as the optical condition of the anti-reflective film.

(5) The procedures (2)–(4) above are for the case of setting the thickness of the anti-reflective layer to 30 nm. When the procedures (2)–(4) were repeated also to the anti-reflective layers of different thicknesses (ARL thickness), the optimum condition for the anti-reflective layer depending on the thickness of the anti-reflective layer was determined. FIGS. 14 and 36 show the, thus, obtained results.

Figure 37:
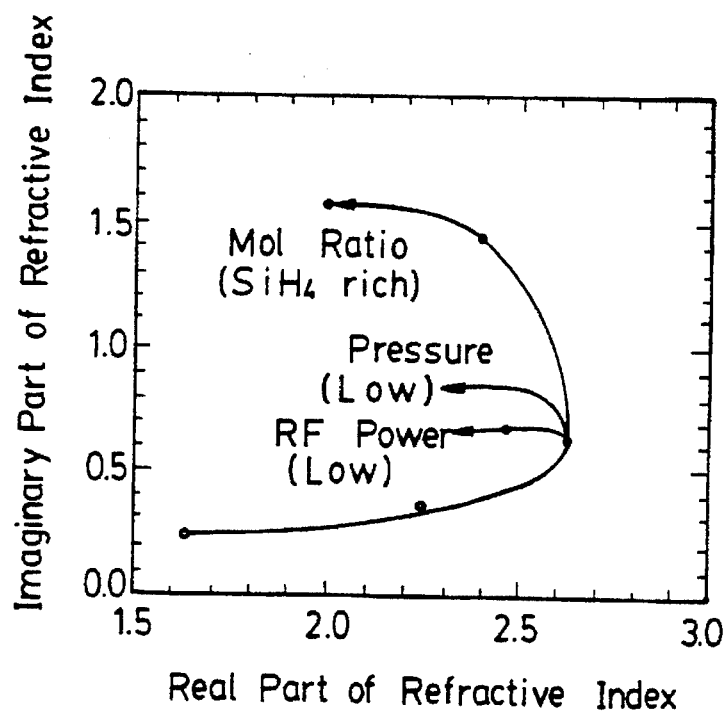
FIG. 37 is a graph illustrating the dependence of n, k values of the SiC film on the film forming condition.
Figure 38:
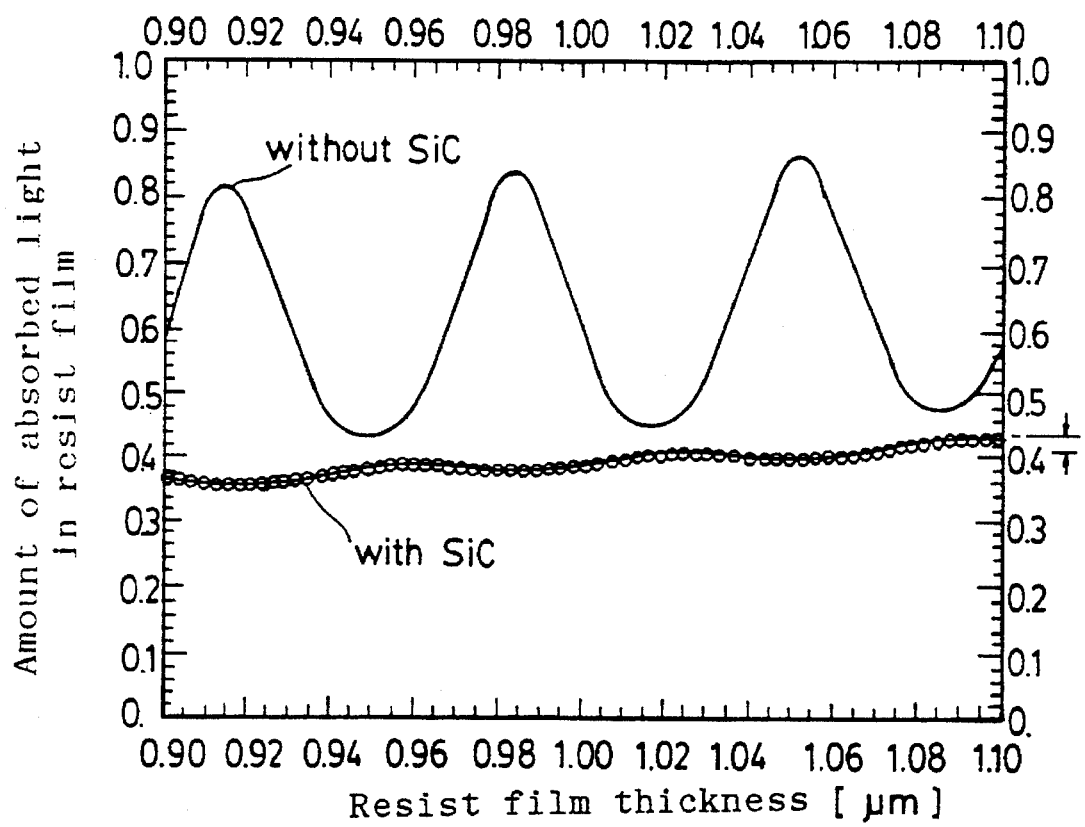
FIG. 38 is a graph illustrating the effect of an anti-reflective layer of SiC (20 nm film thickness) on Al, Al—Si, Al—Si—Cu in comparison with a comparative case.

(6) It was investigated as to whether the film species capable of satisfying the condition to be met by the anti-reflective layer obtained in (5) described above are present or not, by using a spectroscopic ellipsometer ("MOSS System", manufactured by SOPRA Co.) and "Handbook of Optical Contacts of Solids" (E. D. Palik, Academy Press, 1985). As a result, an n, k chart was obtained as shown in FIG. 16. Substances having corresponding n, k are shown on the chart. From FIG. 16, it has been found that SiC (silicon carbide) at 20 nm can completely satisfy the conditions in FIGS. 14 and 36. FIG. 38 shows the standing wave effect in a case of using or not using SiC at 20 nm as an anti-reflective layer on Al, Al—Si or Al—Si—Cu. The standing wave effect in a case of using SiC at 20 nm as the anti-reflective layer (graph for "with ARL" in FIG. 38) was ±2.2 (1.4%) and the standing wave effect was reduced to about 1/15 compared with the case of not using the anti-reflective layer (graph for "without ARL" in the Figure). FIG. 37 shows the dependence of n, k values of the SiC film on the film forming condition.

Example 15

In this example, an anti-reflective layer as shown in FIG. 28 was formed by forming a SiC film with n=2.3±0.2 and k=0.8±0.2 shown in Example 1 by the following method.

That is, in this example, a film was formed by utilizing a thermal CVD process at a temperature of 100° C. to 1500° C. and usually under a pressure, preferably 0.01 to 10,000 Pa, more preferably, 100 to 10,000 Pa by using the following gas as the starting material gas:

$SiCl_4+C_3H_8+H_2$,
$SiHCl_3+C_3H_8+H_2$,
$SiH_4+C_3H_8+H_2$,
$SiH_4+C_2H_4+H_2$,
$SiH_4+C_3H_8+H_2$,
$SiCl_3+CH_3+H_2$,
$SiH_4+C_3H_8+H_2$ or
$SiH_4+C_3H_8+H_2$.

Thus, a SiC film having an aimed anti-reflective effect could be obtained.

Example 16

In this example, a SiC film was formed as below to obtain an anti-reflective layer. That is, in this example, a film was formed by utilizing a plasma CVD process and using a photochemical reaction in a gas mixture comprising: $Si_2H_6+Si(CH_3)H_3+C_2H_2$.

Example 17

In this example, a SiC film was formed as below to obtain an anti-reflective layer.

A film was formed by an ECR plasma process by utilizing an ECR plasma CVD process using a microwave (at 2.45 GHz) from a gas mixture comprising $SiH_4+CH_4+H_2$, $SiH_4+C_2H_4+H_2$ or $SiH_4+CH_4+H_2$.

Example 18

In this example, an SiC film was formed as below to obtain an anti-reflective layer. That is, a film was formed by utilizing a sputtering method using SiC as a target.

Example 19

In this example, an anti-reflective layer was formed by patterning a SiC film by etching.

In this case, the SiC film was etched by a reactive ion etching process using a $CF_4$, $CHF_3$, $C_2F_6$, $C_3F_8$, $SF_6$ or $NF_3$ series gas as an etchant and adding Ar to improve the ionic property, thereby obtaining an anti-reflective layer of a desired pattern.

Example 20

In this example, the present invention was applied by using SiO as an anti-reflective layer for forming a stable pattern on an Al, Al—Si or Al—Si—Cu film using KrF excimer lithography.

In the method of forming a resist pattern in this example, as shown in FIG. 28, an anti-reflective layer ARL was formed with silicon oxide SiC on an Al, Al—Si or Al—Si—Cu as the Al series metal wiring material and a photoresist PR was formed on the anti-reflective layer ARL, thereby forming the resist pattern.

In this example, the present invention was applied by using SiC as the anti-reflective layer ARL, particularly in a case of forming a material layer as a wiring with Al, Al—Si or Al—Si—Cu on a substrate S, such as a Si semiconductor substrate, and patterning the same by a photolithographic step using a photoresist PR and an etching step, thereby obtaining a gate structure.

At first, description will be made to procedures for selecting SiC as the anti-reflective layer to be used on Al, Al—Si or Al—Si—Cu as the Al series material and a method of determining a condition to be satisfied by SiC. The following procedures (1)–(6) were conducted in the same manner as in Example 14.

(1) XP 8843 resist (Shipley Microelectronics Co.) was coated on an Al, Al—Si or Al—Si—Cu film without an anti-reflective layer and exposed by an KrF excimer laser beam at a wavelength of 248 nm, followed by development. FIG. 29 shows a standing wave effect in this case. From FIG. 29, the standing wave effect was about ±29.6%.

(2) In FIG. 29, the maximum value of the standing wave effect is at a resist film thickness, for example, of 982 nm. FIG. 30 shows fluctuation for the amount of absorbed light in the resist film relative to the change of optical constants $n_{arl}$ and $k_{arl}$ of the anti-reflective layer, which is between the resist layer and the Layer of Al, Al—Si or Al—Si—Cu. The resist film thickness is 982 nm and the layer thickness of the anti-reflective layer is set at 30 nm.

(3) FIGS. 31, 32 and 33 show the results of repeating the procedures (2) above to each of the resist film thicknesses of 1000 nm, 1018 nm and 1035 nm, respectively.

(4) As a result of determining a common region in FIGS. 30 to 33, $n_{arl}$=4.8, $k_{arl}$=0.45, or $n_{arl}$=2.0, $k_{arl}$=0.8 were obtained.

That is, the condition to be satisfied by the optimal anti-reflective layer with the thickness of the anti-reflective layer being set at 30 nm is:

$n_{arl}$=4.8, $k_{arl}$=0.45, or $n_{arl}$=2.0, $k_{arl}$=0.8.

When the standing wave effect was determined by using the above-mentioned condition, the results shown in FIG. 34 and FIG. 35 as described in Example 14 were obtained. In FIG. 34 and FIG. 35, the standing wave effect was extremely small and it was about less than ±1% in each of the cases. The standing wave effect was reduced to about 1/30 as compared with the case of not using the anti-reflective layer.

(5) The procedures (2)–(4) described above were conducted in a case of setting the thickness of the anti-reflective layer as 30 nm. When the procedures (2)–(4) were repeated also for anti-reflective layer (ARL thickness) of other different layer thicknesses, an optimal condition for the anti-reflective layer in accordance with the thickness of the anti-reflective layer could be determined. FIG. 14 and FIG. 36 show the obtained results.

Figure 39:
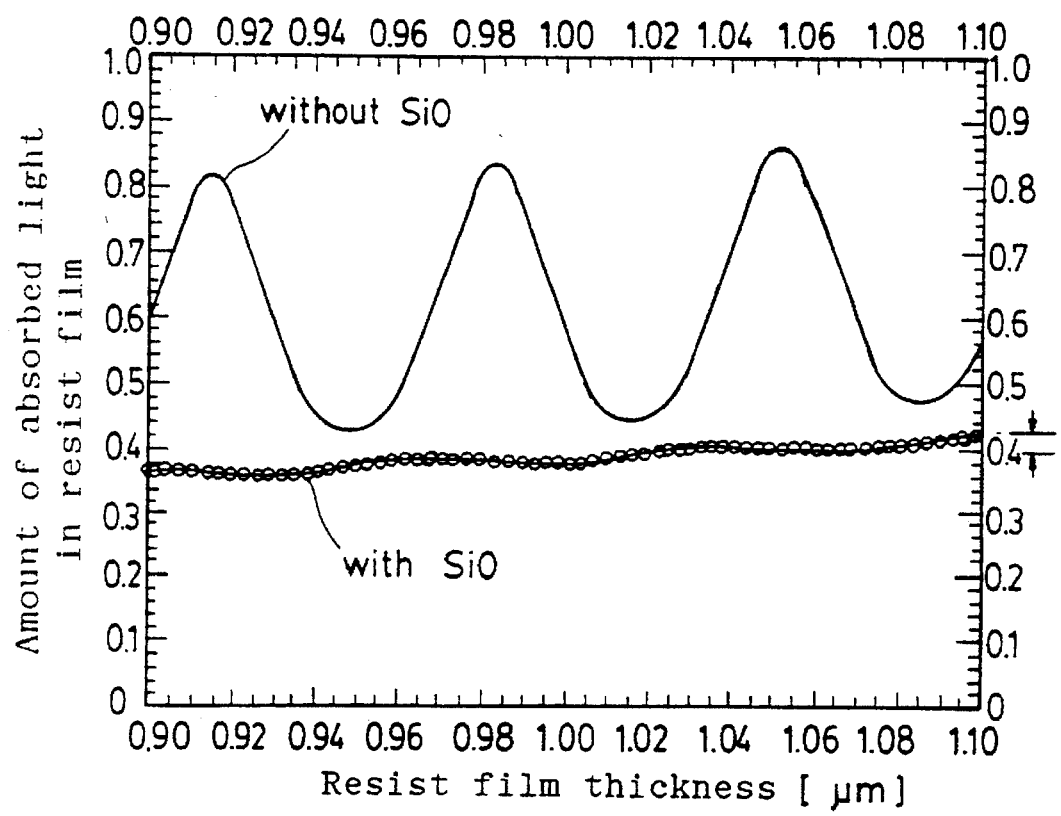
FIG. 39 is a graph illustrating the effect of an anti-reflective layer of SiO (30 nm film thickness) on Al, Al—Si, Al—Si—Cu in comparison with the comparative case.

(6) It was investigated as to whether the film species capable of satisfying the condition to be met by the anti-reflective layer determined in (5) above are present or not by using a spectroscopic ellipsometer ("MOSS System" manufactured by SOPRA Co.) and "Handbook of Optical Constants of Solids" (E. D. Palik, Academy Press, 1985). As a result, an n, k chart shown in FIG. 16 was obtained. Substances having corresponding n, k are shown on the chart. From FIG. 16, it has been found that SiO (silicon oxide) at 30 nm can completely satisfy the conditions in FIG. 14 and FIG. 36. FIG. 39 shows the standing wave effect in a case of using SiO at 50 nm thickness as the anti-reflective layer on Al, Al—Si or Al—Si—Cu and in a case of not using the anti-reflective layer. In a case of using SiO at 30 nm as the anti-reflective layer (graph for "with SiO" in the Figure), the standing wave effect was ±2.2% (1.4%), which was reduced to about 1/20 as compared with the case of not using the anti-reflective layer (graph for "without SiO" in the Figure).

Example 21

In this example, an anti-reflective layer was formed by forming a SiO film with n=1.83±0.2 and k=0.75±0.2 shown in Example 20 by the following method.

That is, in this example, a film was formed at a temperature from normal +temperature to 500° and under a pressure of 0.01 to 10 Pa by using a gas mixture of $SiH_4O_2+N_2$. Thus, a SiO film having an aimed anti-reflective effect could be obtained.

Example 22

In this example, an anti-reflective layer was formed by patterning a SiO film by etching.

In this case, the SiO film was etched by a reactive ion etching process using $CF_4$, $CHF_3$, $C_2F_6$, $C_3F_8$, $SF_6$ or $NF_3$ series gas (or a mixed gas system) as an etchant and adding Ar to improve the ionic property, thereby obtaining an anti-reflective layer of a desired pattern.

Example 23

In this example, an organic or inorganic substance suitable for forming a stable pattern on an Al, Al—Si or Al—Si—Cu film was obtained and using it as an anti-reflective layer by using KrF excimer lithography.

As shown in FIG. 28, in the method of forming the resist pattern in this example, an anti-reflective layer ARL was formed on Al, Al—Si or Al—Si—Cu as an Al series metal wiring material (1) and forming a photoresist PR on the anti-reflective layer ARL, thereby forming a resist pattern, in which an appropriate material was selected to form the anti-reflective layer.

In this example, the anti-reflective layer was designed, particularly in a case of obtaining a wiring structure by forming a material layer as wiring with Al, Al—Si, or Al—Si—Cu on a substrate S, such as a Si semiconductor substrate, and patterning the same by a photolithographic step using the photoresist PR and an etching step.

(1) XP 8843 resist (manufactured by Shipley Microelectronics Co.) was coated on an Al, Al—Si or Al—Si—Cu film without an anti-reflective layer and exposed by a KrF excimer laser beam at a wavelength of 248 nm, followed by development. FIG. 29 shows the standing wave effect in this case. As shown in FIG. 29, the standing wave effect was about ±29.6%.

(2) In FIG. 29, the maximum value of the standing wave effect situates, for example, at 982 nm of the resist film thickness. FIG. 30 shows fluctuation for the amount of absorbed light in the resist film relative to the change of optical constants $n_{arl}$, $k_{arl}$ of the anti-reflective layer. The resist film has a thickness of 982 nm, and the thickness of the anti-reflective layer is set to 30 nm.

(3) FIGS. 31, 32 and 33 show the results of repeating the procedure (2) described above to each of resist film thicknesses of 1000 nm, 1018 nm and 1035 nm, respectively.

(4) As a result of determining a common region in FIG. 30 to FIG. 33, $n_{arl}$=4.8, $k_{arl}$=0.45, or $n_{arl}$=2.0, $k_{arl}$=0.8 were obtained.

That is, the condition to be satisfied by the optimum anti-reflective layer upon setting the thickness of the anti-reflective layer as 30 nm was:

$n_{arl}$=4.8, $k_{arl}$=0.45, or $n_{arl}=2.0$, $k_{arl}=0.8$.

When the standing wave effect was determined by using this condition, results shown in FIG. 34 and FIG. 35 were obtained. The standing wave effect shown by "optimum condition" in FIGS. 34 and 35 was extremely small, which was about less than ±1% in each of the cases. As compared with the case without anti-reflective layer, the standing wave effect was reduced to about 1/30.

(5) The procedures (2)–(4) above are for the case of setting the thickness of the anti-reflective layer to 30 nm. When the procedures (2)–(4) were repeated also to the anti-reflective layers of different thicknesses (ARL thickness), the optimum condition for the anti-reflective layer depending on the thickness of the anti-reflective layer was determined. FIGS. 14 and 36 show the, thus, obtained results.

The standing wave effect was reduced to less than ±3% by using an organic or inorganic substance capable of satisfying the optical property on the curve in FIGS. 14 and 36, or within a range of a value on the curve ±0.2 for n and a value on the curve ±0.15 for k. Accordingly, such an organic or inorganic substance was determined to form an anti-reflective layer. As compared with the case of not using the anti-reflective layer, the standing wave effect was reduced to about 1/10.

Examples 24–33

In these examples, Cu wiring was formed by using Cu as the Cu series metal material instead of the Al series metal material, such as Al, Al—Si or Al—Si—Cu, as the underlying material in Examples 14–23, and an anti-reflective layer was formed thereon in the same manner as in each of the examples (an anti-reflective layer comprising an organic or inorganic substance determined by the same method as in Example 23 in a case where SiC, SiO or Cu was used as the underlying material), thereby performing the resist patterning.

As a result, the standing wave effect was reduced and satisfactory patterning was conducted in the same manner as in each of the previous examples.

Example 34

In this example, the present invention was applied by using SiC as an anti-reflective layer for forming a stable pattern on a Si substrate using KrF excimer lithography.

Figure 40:
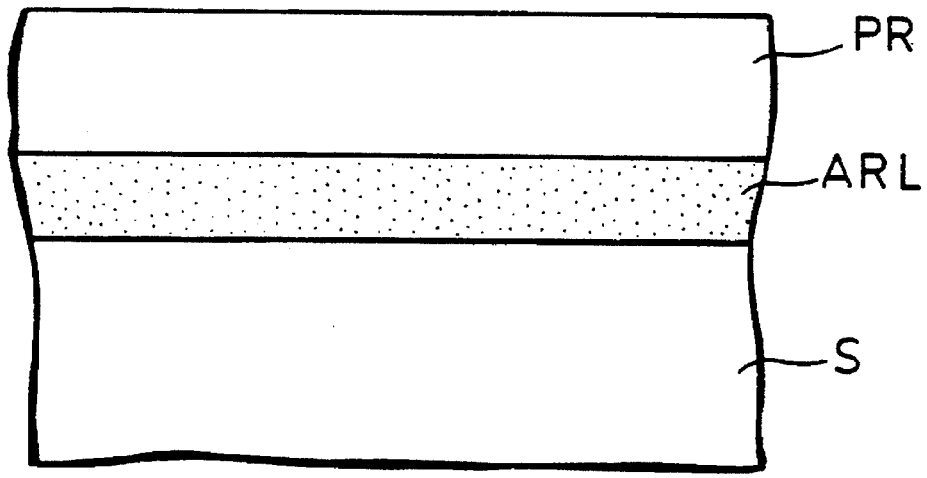
FIG. 40 is a cross sectional view for a portion illustrating the structure of Example 34.

In the method of forming a resist pattern in this example, as shown in FIG. 40, an anti-reflective layer ARL was formed with silicon carbide on a silicon substrate as the Si series underlying material and a photoresist PR was formed on the anti-reflective layer ARL, thereby forming the resist pattern.

At first, description will be made to the procedures for selecting SiC as the anti-reflective layer and the method of determining the condition to be satisfied by SiC. The following procedures were conducted.

Figure 41:
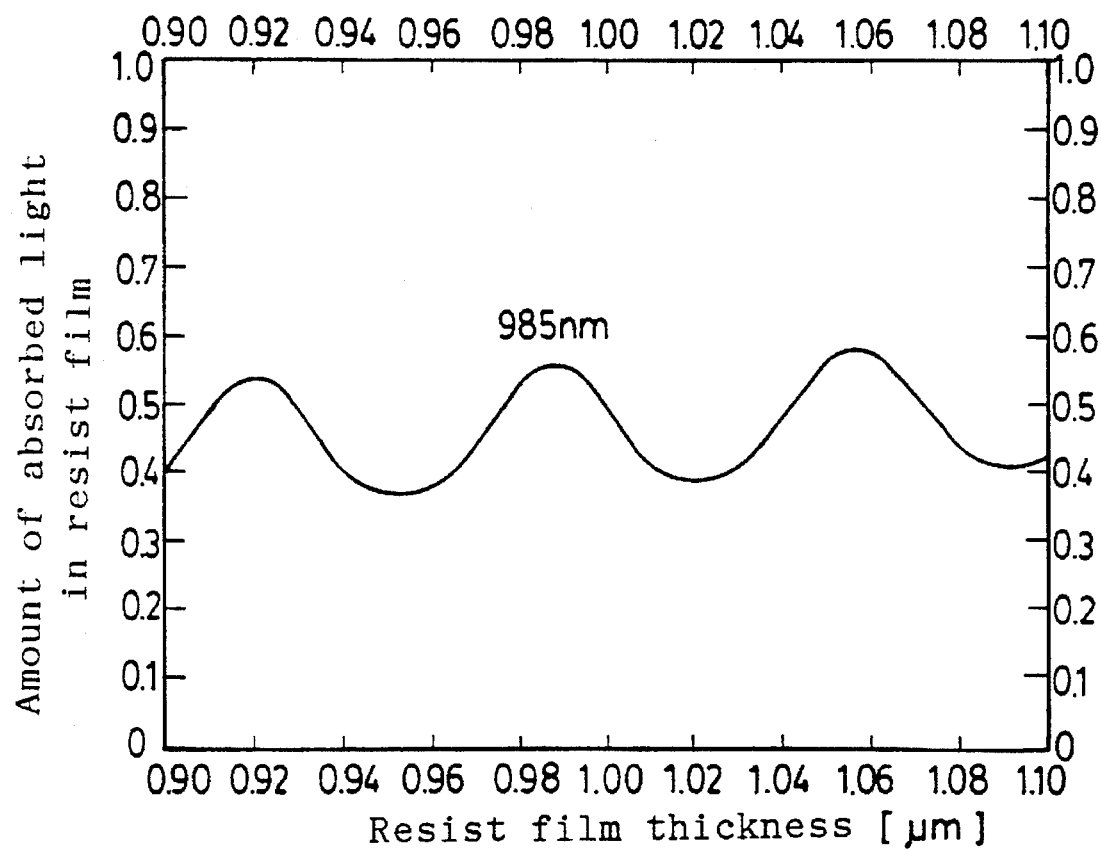
FIG. 41 is a graph illustrating the standing wave effect.

(1) XP 8843 resist (manufactured by Shipley Microelectronics Co.) was coated on a Si substrate without an anti-reflective layer, which was exposed by a KrF excimer laser beam at a wavelength of 248 nm, followed by development. FIG. 41 shows the standing wave effect in this case. As shown in FIG. 41, the standing wave effect was about ±20%.

(2) In FIG. 41, the maximum value of the standing wave effect situates, for example, at 985 nm of the resist film thickness. Fluctuation for the amount of absorbed light in the resist film was determined relative to the change of optical constants $n_{arl}$, $k_{arl}$ of the anti-reflective layer, while taking notice on the resist film thickness of 965 nm, and setting the thickness of the anti-reflective layer to 30 nm.

(3) The procedure (2) was repeated for each of a plurality of other resist film thicknesses.

(4) The results are shown in the Figures and a common region in them was determined. Such a procedure was determined for each of the film thicknesses of the anti-reflective layers, by which an optimum value (n value, k value) for the optical property of a certain film thickness was determined.

The optimum condition for the anti-reflective layer was determined. Based on the result, SiC having n=2.3 and k=0.65 was used at a layer thickness of 25 nm as the anti-reflective layer, to greatly reduce the standing wave effect.

Figure 42:
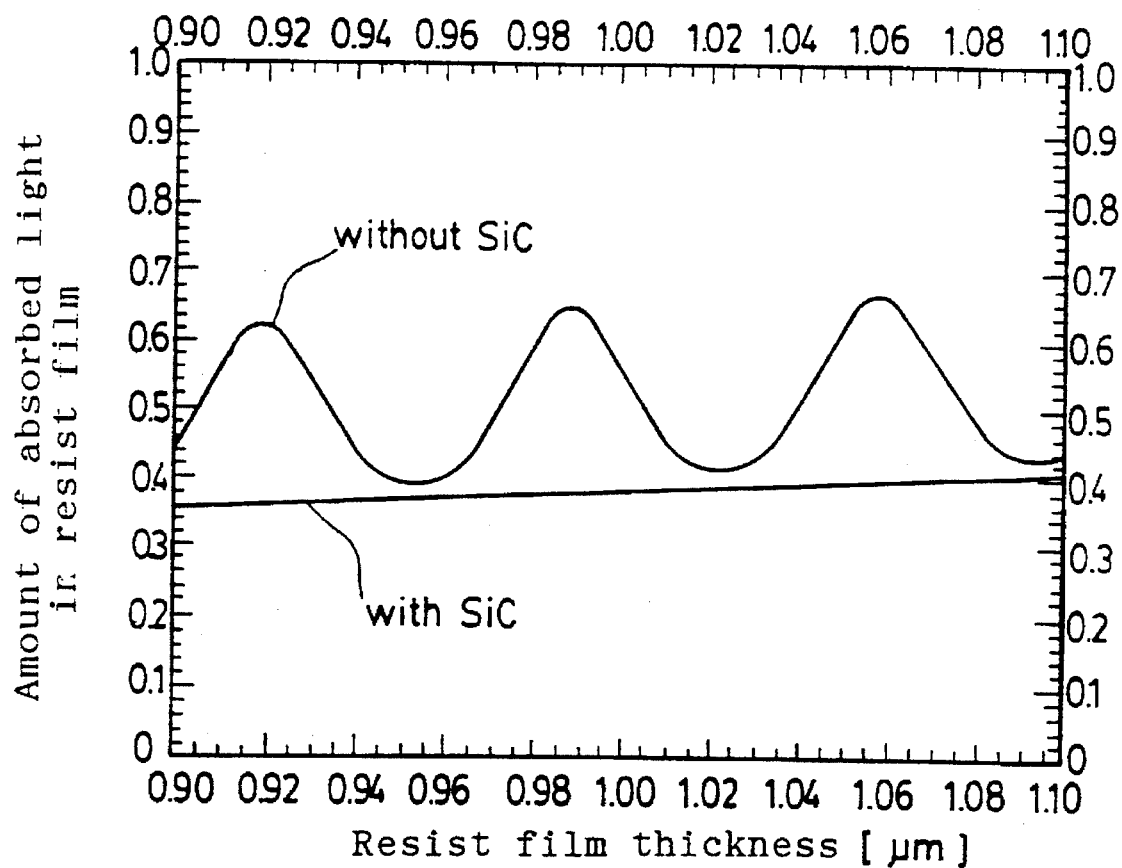
FIG. 42 is a graph illustrating the effect of an anti-reflective layer of SiC film (25 nm) on a silicon substrate in comparison with a comparative case.

FIG. 42 shows a comparison between a case of using SiC at 25 nm as the anti-reflective layer (graph for "with SiC") and a case of not using the anti-reflective layer (graph for "without SiC"). In the case of using SiC at 25 nm, the standing wave effect was reduced to less than ±1%. The standing wave effect in the case of not using SiC was ±23%. Accordingly, the standing wave effect was reduced to less than 1/23 by using SiC as the anti-reflective layer on Si.

Example 35

Also in this example, silicon oxide (SiO) having an optimal condition as the anti-reflective layer was determined by using the same method as in the previous example. That is, in this example, SiO having n=2.1, k=0.7 was used at a film thickness of 30 nm as the anti-reflective layer to greatly reduce the standing wave effect.

Figure 43:
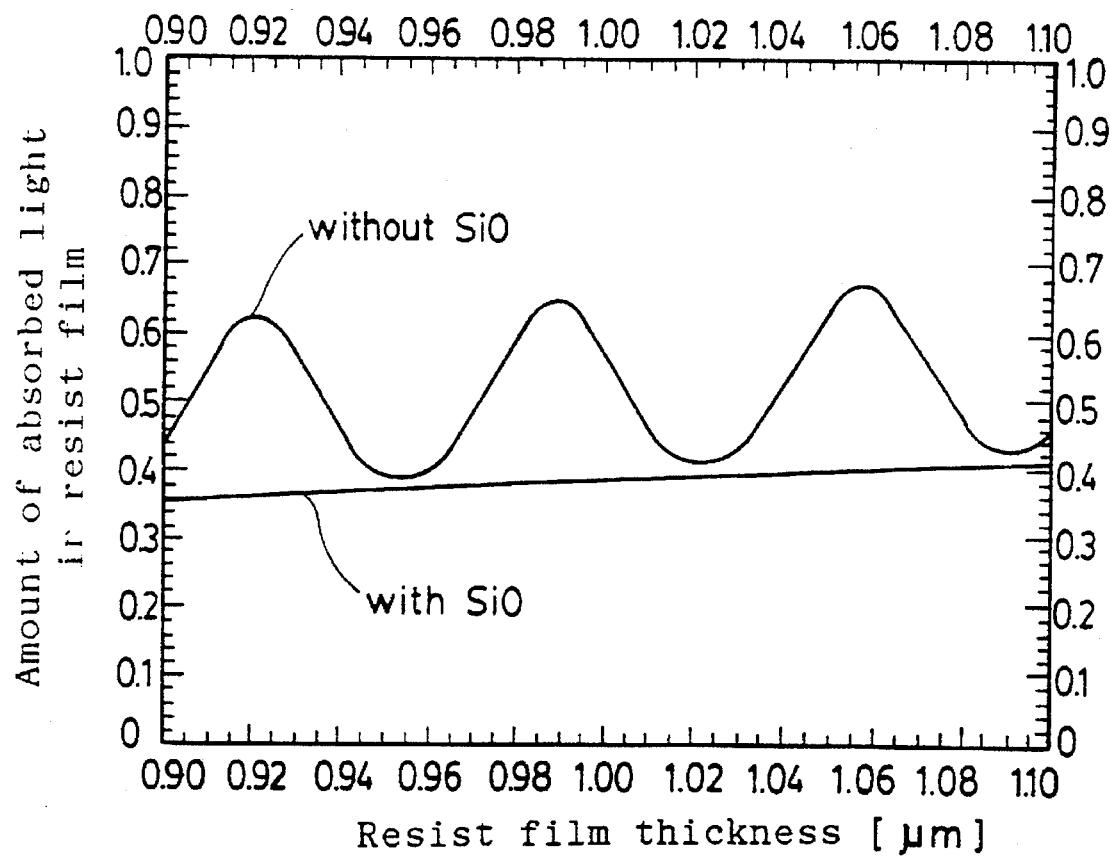
FIG. 43 is a graph illustrating the effect of an anti-reflective layer of SiO film (30 nm) on a silicon substrate in comparison with a comparative case.

FIG. 43 shows a comparison between a case of using SiO at 30 nm as the anti-reflective layer (graph for "with SiO") and a case of not using the anti-reflective layer (graph for "without SiO"). As in the case of using SiC at 25 nm in Example 34, the standing wave effect for SiO was about ±1%. The standing wave effect in the case of not using SiO was ±23%. Accordingly, the standing wave effect was reduced to less than about 1/23 by using SiO as the anti-reflective layer on Si.

Example 36

In this example, an anti-reflective layer as shown in FIG. 40 was formed by forming a SiC film with n=2.3±0.2 and k=0.8±0.2 shown in Example 34 by the following method.

That is, in this example, a film was formed by utilizing a thermal CVD process at a temperature of 100° C. to 1500° C. and usually under a pressure, preferably from 0.01 to 10,000 PA, more preferably 100 to 10,000 Pa by using the following gas as the staring material gas:

$SiCl_4+C_3H_8+H_2$,
$SiHCl_3+C_3H_8+H_2$,
$SiH_4+C_3H_8+H_2$,
$SiH_4+C_2H_4+H_2$,
$SiH_4+C_3H_8+H_2$,
$SiCl_3+CH_3+H_2$,
$SiH_4+C_3H_8+H_2$ or
$SiH_4+C_3H_8+H_2$.

Thus, a SiC film having a desired anti-reflective effect could be obtained.

Example 37

In this example, an SiC film was formed as below to obtain an anti-reflective layer. That is, in this example, a film was formed by utilizing a plasma CVD process and using a photochemical reaction in a gas mixture comprising: $Si_2H_6 + Si(CH_3)H_3 + C_2H_2$.

Example 38

In this example, a SiC film was formed as below to obtain an anti-reflective layer.

A film was formed by an ECR plasma process by utilizing an ECR plasma CVD process using microwave (at 2.45 GHz) from a gas mixture comprising: $SiH_4 + CH_4 + H_2$, $SiH_4 + C_2H_4 + H_2$ or $SiH_4 + CH_4 + H_2$.

Example 39

In this example, a SiC film was formed as below to obtain an anti-reflective layer. That is, a film was formed by utilizing a sputtering method using SiC as a target.

Example 40

In this example, an anti-reflective layer was formed by patterning a SiC film by etching.

In this case, the SiC film was etched by a reactive ion etching process using $CF_4$, $CHF_3$, $C_2F_6$, $C_3F_8$, $SF_6$ or $NF_3$ series gas as an etchant and adding Ar to improve the ionic property, thereby obtaining an anti-reflective layer of a desired pattern.

Example 41

In this example, a SiO film having n=2.1±0.2 and k=0.7±0.2 shown in Example 35 was formed by the following method to form an anti-reflective layer shown in FIG. 40 and described for the function in FIG. 43.

That is, a film was formed by using a gas mixture of $SiH_4 + O_2 + N_2$ at a temperature from normal temperature to 500° C. under a pressure of 0.01 Pa–10 Pa. Thus, a SiO layer having a desired anti-reflective effect was obtained.

Example 42

The SiC layer and the SiO layer in each of the examples described above were formed on the underlying single crystal silicon, underlying polycrystalline silicon and underlying amorphous silicon, respectively, to form anti-reflective layers. As a result, a desired anti-reflective effect could be obtained to attain a satisfactory pattern formation.

Example 43

In this example, the present invention was applied by using $SiO_x$ as an anti-reflective layer for forming a stable pattern on a W—Si film using KrF excimer lithography.

Figure 44:
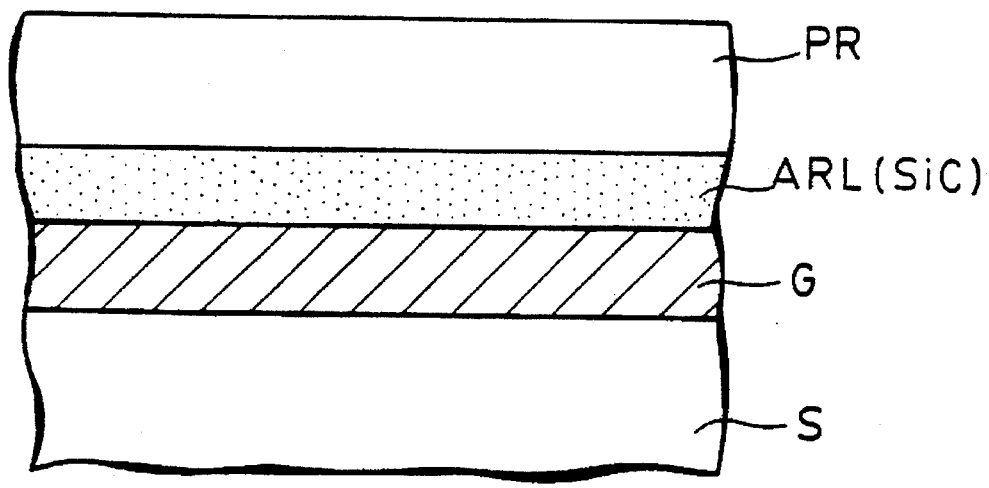
FIG. 44 is a cross sectional view illustrating the structure of Example 43.

In the method of forming a resist pattern in this example, as shown in FIG. 44, an anti-reflective layer ARL was formed with $SiO_x$ on an underlying W—Si material as high melting metal silicide and a photoresist PR was formed on the anti-reflective layer ARL, thereby forming the resist pattern.

In this example, the present invention is applied by using $SiO_x$ as the anti-reflective layer ARL, particularly in a case of forming a material layer as a gate with W—Si on a substrate 1, such as a Si semiconductor substrate, and patterning the same by a photolithographic step using a photoresist PR and an etching step, thereby obtaining a gate structure.

At first, description will be made to the procedures for selecting $SiO_x$ as the anti-reflective layer to be used on W—Si and the method of determining the condition to be satisfied by $SiO_x$. The following procedures (1)–(6) were conducted:

(1) XP 8843 resist (manufactured by Shipley Microelectronics Co.) was coated on W—Si without an anti-reflective layer and exposed by a KrF excimer laser beam at a wavelength of 248 nm, followed by development. FIG. 7 shows the standing wave effect in this case. As shown in FIG. 7, the standing wave effect was about ±20%.

(2) In FIG. 7, the maximum value of the standing wave effect situates, for example, at 985 nm of the resist film thickness. FIG. 8 shows the equi-contour lines for the amount of absorbed light in the resist film relative to the change of optical constants $n_{arl}$, $k_{arl}$ of the anti-reflective layer, with the resist film thickness of 985 nm, and the thickness of the anti-reflective layer set to 30 nm.

(3) FIGS. 9, 10 and 11 show the results of repeating the procedures (2) above to each of the resist film thicknesses of 1000 nm, 1017.5 nm and 1035 nm, respectively.

(4) As a result of determining a common region in FIG. 8 to FIG. 11, $n_{arl}=4.9$, $k_{arl}=0.1$, or $n_{arl}=2.15$, $k_{arl}=0.67$ were obtained.

That is, the condition to be satisfied by the optimal anti-reflective layer with the thickness of the anti-reflective layer being set as 30 nm is:

$n_{arl}=4.9$, $k_{arl}=0.1$, or $n_{arl}=2.15$, $k_{arl}=0.67$.

When the standing wave effect was determined by using the above-mentioned condition, the results shown in FIG. 12 and FIG. 13 were obtained. In each of the cases, the standing wave effect was extremely small and it was about less than 1%. The standing wave effect was reduced to about 1/20 as compared with the case of not using the anti-reflective layer.

(5) The procedures (2)–(4) described above were conducted in a case of setting the thickness of the anti-reflective layer as 30 nm. When the procedures (2)–(4) were repeated also for anti-reflective layer (ARL thickness) of other different layer thicknesses, an optimal condition for the anti-reflective layer in accordance with the thickness of the anti-reflective layer could be determined. FIG. 14 and FIG. 15 show the obtained results.

Figure 45:
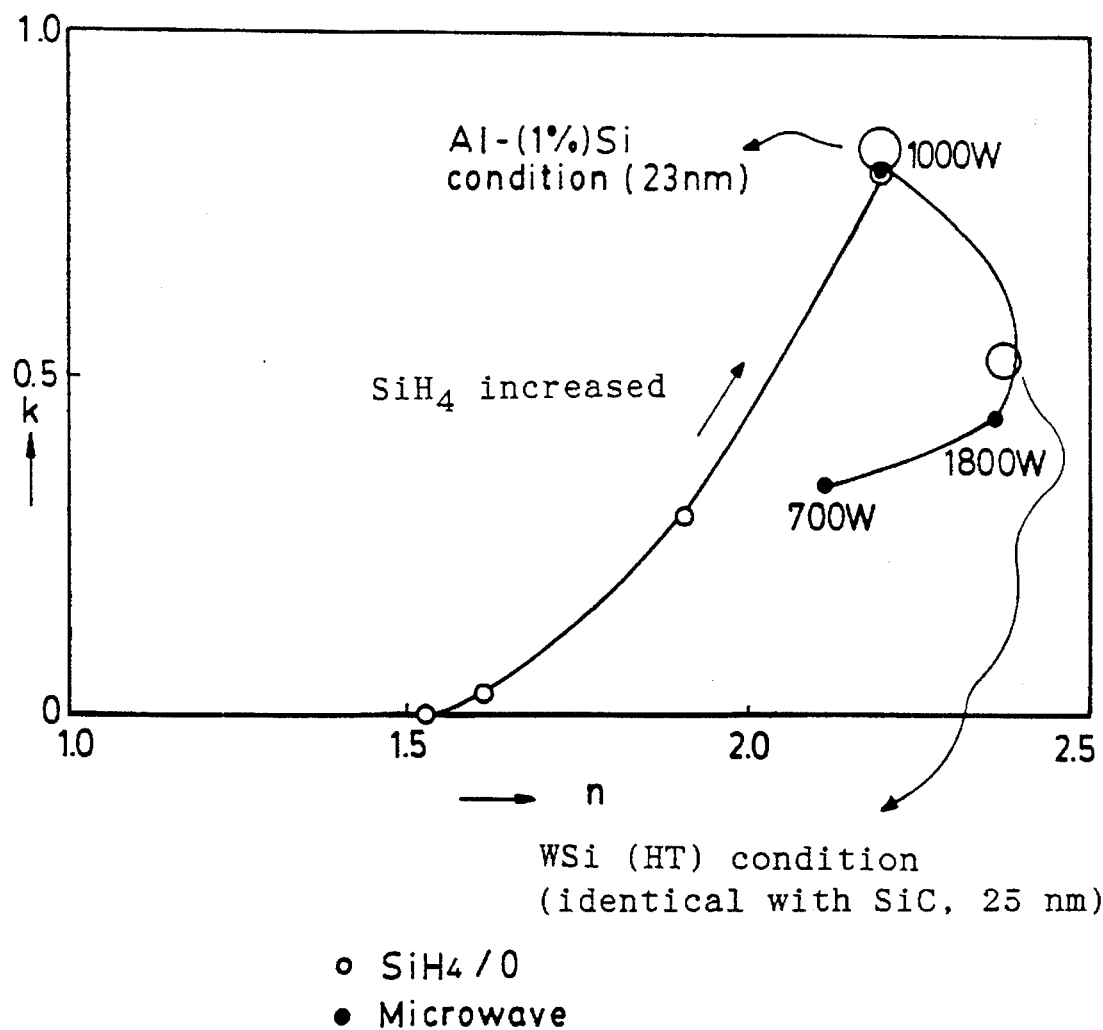
FIG. 45 is a graph illustrating the behavior of SiO film formation by CVD.
Figure 46:
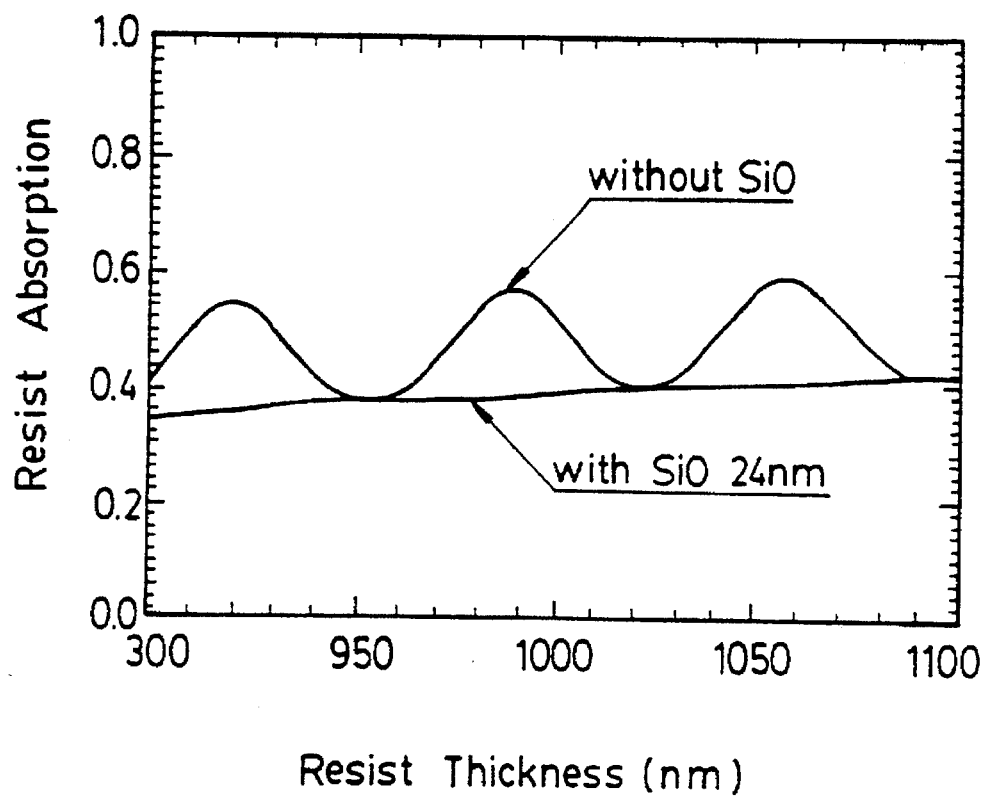
FIG. 46 is a graph illustrating the effect of an anti-reflective layer of SiO (24 nm) on W—Si.

(6) It was investigated as to whether the film species capable of satisfying the condition to be met by the anti-reflective layer determined in (5) above are present or not by using a spectroscopic ellipsometer (SOPRA Co.). As a result, it has been found that the optical constant shows changes in FIG. 45 corresponding to the film forming conditions upon forming the $SiO_x$ film by using the CVD process. In FIG. 45, regions shown by open circles satisfy the conditions in FIGS. 14 and 15. That is, FIG. 46 shows the standing wave effect in a case of using the $SiO_x$ film at 25 nm thickness as an anti-reflective layer and in a case of not using the anti-reflective layer. In the case of using a $SiO_x$ film at 25 nm, the standing wave effect was about ±1.8% and the standing wave effect was reduced to less than about 1/12 as compared with the case of not using the anti-reflective layer.

Example 44

In this example, a $SiO_x$ film having n=2.4±0.6 and k=0.7±0.2 shown in Example 43 was formed by the following method to form an anti-reflective layer as shown in FIG. 46.

That is, in this example, a film was formed by utilizing a parallel plate plasma CVD process and using a microwave (2.45 GHz) from a gas mixture of $SiH_4+O_2$.

Example 45

In this example, a $SiO_x$ film having n=2.4±0.6 and k=0.7±0.2 shown in Example 46 was formed by the following method to form an anti-reflective layer having an anti-reflective function as shown in FIG. 46.

That is, in this example, a film was formed by utilizing a parallel plate type plasma CVD process and using a microwave (2.45 GHz) from a gas mixture of $SiH_4+O_2$ and using Ar as a buffer gas.

Example 46

In this example, a $SiO_x$ film having n=2.4±0.6 and k—0.7±0.2 shown in Example 43 was formed by the following method to form an anti-reflective layer having an anti-reflective function as shown in FIG. 46.

That is, in this example, a film was formed by utilizing an ECR type plasma CVD process and using a microwave (2.45 GHz) from a gas mixture of $SiH_4+O_2$.

Example 47

In this example, a $SiO_x$ film having n=2.4±0.6 and k=0.7±0.2 shown in Example 43 was formed by the following method to form an anti-reflective layer having an anti-reflective function as shown in FIG. 46.

That is, in this example, a film was formed by utilizing an ECR type plasma CVD process and using a microwave (2.45 GHz) from a gas mixture of $SiH_4+O_2$ and using Ar as a buffer gas.

Example 48

In this example, a $SiO_x$ film having n=2.4±0.6 and k=0.7±0.2 shown in Example 43 was formed by the following method to form an anti-reflective layer having an anti-reflective function as shown in FIG. 46.

That is, in this example, a film was formed by utilizing a bias ECR plasma CVD process and using a microwave (2.45 GHz) from a gas mixture of $SiH_4+O_2$.

Example 49

In this example, a $SiC_x$ film having n=2.4±0.6 and k=0.7±0.2 shown in Example 43 was formed by the following method to form an anti-reflective layer having an anti-reflective function as shown in FIG. 46.

That is, in this example, a film was formed by utilizing a bias ECR type plasma CVD process and using a microwave (2.45 GHz) from a gas mixture of $SiH_4+O_2$ and using Ar as a buffer gas.

Example 50

In this example, the $SiC_x$ film having n=2.4±0.6 and k=0.7±0.2 shown in Example 3 was etched for the underlying material using a resist pattern as a mask by the following method.

That is, the $SiO_x$ film was etched by a reactive etching process using a gas system of $CHF_3$ (50–100 SCCM)+$O_2$ (3–20 SCCM) under a pressure of about 2 Pa and with a power of about 100 to 1000 W, to obtain a desired pattern by etching.

Example 51

In this example, the $SiC_x$ film having n=2.4±0.6 and k=0.7±0.2 shown in Example 43 was etched for the underlying material using a resist pattern as a mask by the following method.

That is, the $SiO_x$ film was etched by a reactive etching process using a gas system of $C_4F_8$ (30–70 SCCM)+$CHF_3$ (10–30 SCCM) under a pressure of about 2 Pa and with a power of about 100 to 1000 W, to obtain a desired pattern by etching.

Example 52

In this example, the $SiO_x$ film having n=2.4±0.6 and k=0.7±0.2 shown in Example 43 was etched for the underlying material using a resist pattern as a mask by the following method.

That is, the $SiO_x$ film was etched by a reactive etching process using a gas system of $S_2F_2$ (5–30 SCCM) under a pressure of about 2 Pa and with a power of about 100 to 1000 W, to obtain a desired pattern by etching.

Example 53

In this example, the present invention was applied by using a $Si_xO_yN_z$ or $Si_xN_y$ film as an anti-reflective layer for forming a stable pattern on a W—Si film by using KrF excimer lithography.

Figure 47:
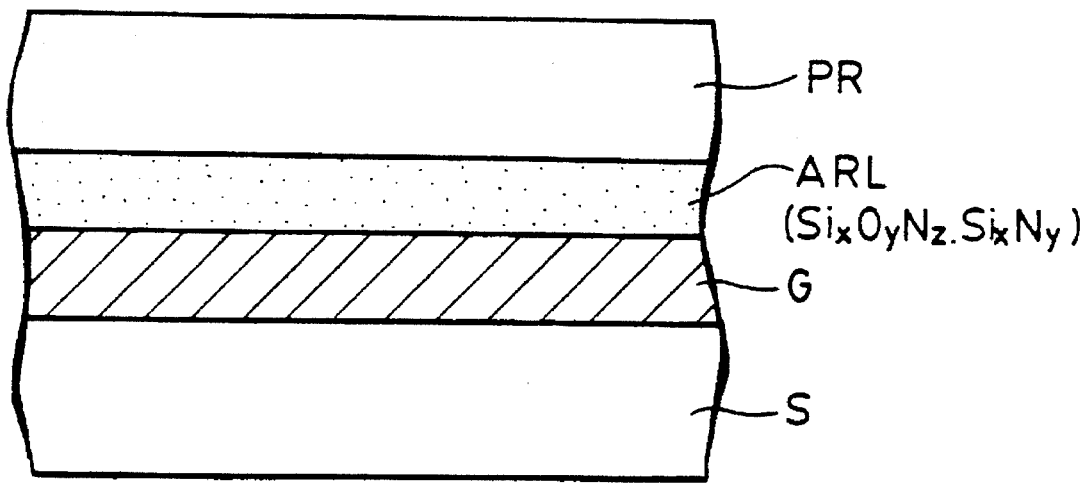
FIG. 47 is a cross sectional view illustrating the structure of Example 53.

In the method of forming a resist pattern in this example, as shown in FIG. 47, an anti-reflective layer ARL was formed with $Si_xO_yN_z$ or $Si_xN_y$ on the underlying W—Si as a high melting metal silicide G and a photoresist PR was formed on the anti-reflective layer ARL, thereby forming the resist pattern.

In this example, the present invention is applied by using $Si_xO_yN_z$ or $Si_xN_y$ as the anti-reflective layer ARL, particularly in a case of forming a material layer with W—Si as a gate on a substrate S, such as a Si semiconductor substrate, and patterning the same by a photolithographic step using a photoresist PR and an etching step, thereby obtaining a gate structure.

At first, description will be made to the procedures for selecting $Si_xO_yN_z$ or $Si_xN_y$ as the anti-reflective layer to be used on W—Si and the method of determining the condition to be satisfied by $Si_xO_yN_z$ or $Si_xN_y$. The following procedures (1)–(6) were conducted.

(1) XP 8843 resist (manufactured by Shipley Microelectronics Co.) was coated on W—Si without an anti-reflective layer and exposed by a KrF excimer laser beam at a wavelength of 248 nm, followed by development. FIG. 7 shows the standing wave effect in this case. As shown in FIG. 7, the standing wave effect was about ±20%.

(2) In FIG. 7, the maximum value of the standing wave effect situated, for example, at 985 nm of the resist film thickness. FIG. 8 shows equi-contour lines for the amount of absorbed light in the resist film relative to the change of optical constants $n_{arl}$, $k_{arl}$ of the anti-reflective layer, wherein the resist film has a thickness of 985 nm, and the thickness of the anti-reflective layer is set to 30 nm.

(3) FIGS. 9, 10 and 11 show the results of repeating the procedures (2) above to each of the resist film thicknesses of 1000 nm, 1017.5 nm and 1035 nm, respectively.

(4) As a result of determining a common region in FIG. 8 to FIG. 11, $n_{arf}=4.9, k_{arf}=0.1$, or $n_{arf}=2.15, k_{arf}=0.67$ were obtained.

That is, the condition to be satisfied by the optimal anti-reflective layer with the thickness of the anti-reflective layer being set at 30 nm is:

$n_{arf}=4.9, k_{arf}=0.1$, or $n_{arf}=2.15, k_{arf}=0.67$.

When the standing wave effect was determined by using the above-mentioned condition, the results shown in FIG. 12 and FIG. 13 were obtained. In FIG. 12 and FIG. 13, the standing wave effect was extremely small and it was about less than ±1% in each of the cases. The standing wave effect was reduced to about 1/20 as compared with the case of not using the anti-reflective layer.

(5) The procedures (2)–(4) described above were conducted in a case of setting the thickness of the anti-reflective layer as 30 nm. When the procedures (2)–(4) were repeated also for anti-reflective layer (ARL thickness) of other different layer thicknesses, an optimal condition for the anti-reflective layer in accordance with the thickness of the anti-reflective layer could be determined. FIG. 14 and FIG. 15 show the obtained results.

(6) It was investigated as to whether the film species capable of satisfying the condition to be met by the anti-reflective layer determined in (5) above are present or not by using a spectroscopic ellipsometer (SOPRA Co.).

Figure 48:
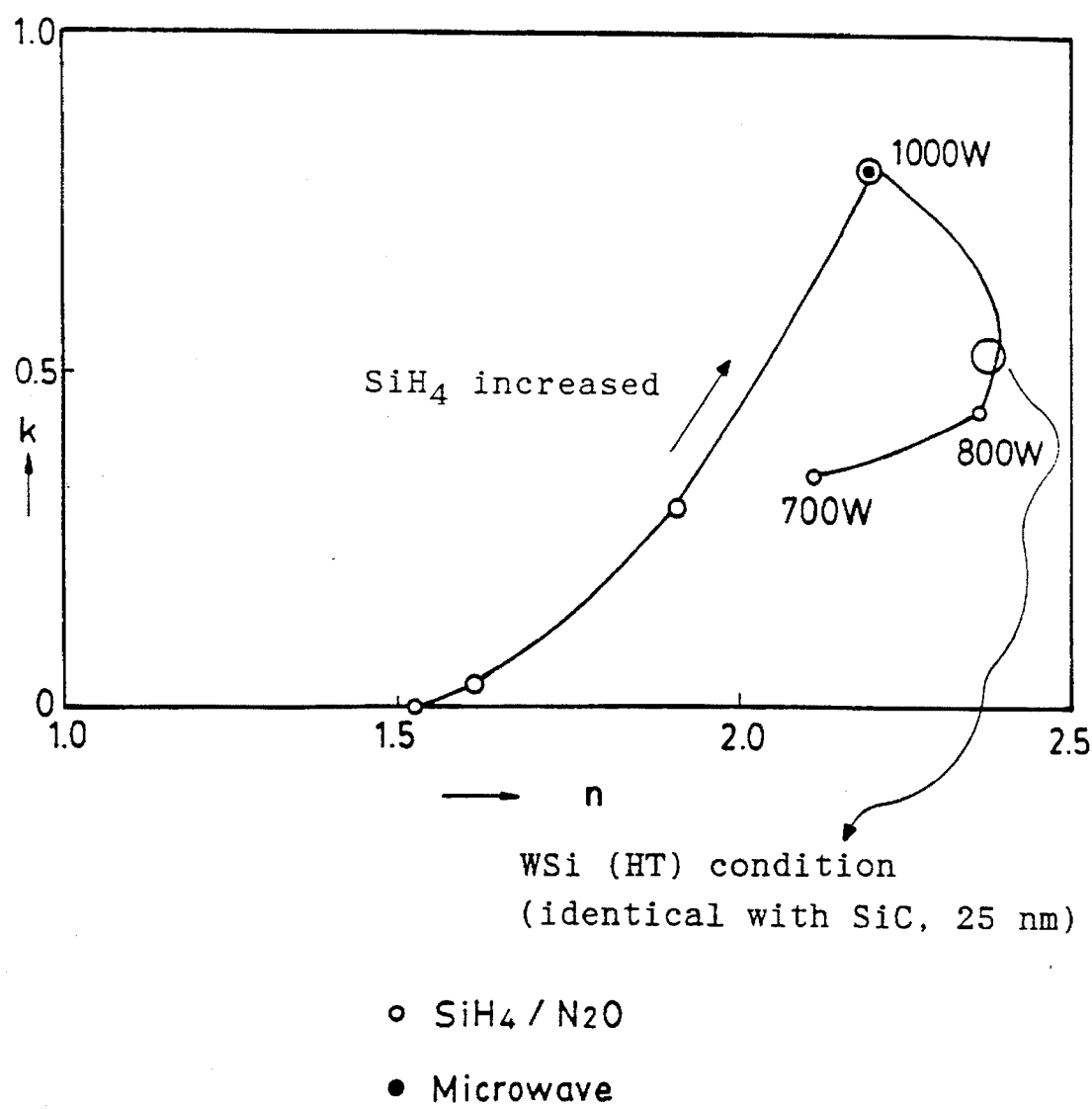
FIG. 48 is a graph illustrating the behavior in forming a $Si_xO_yN_z$ film by CVD.
Figure 49:
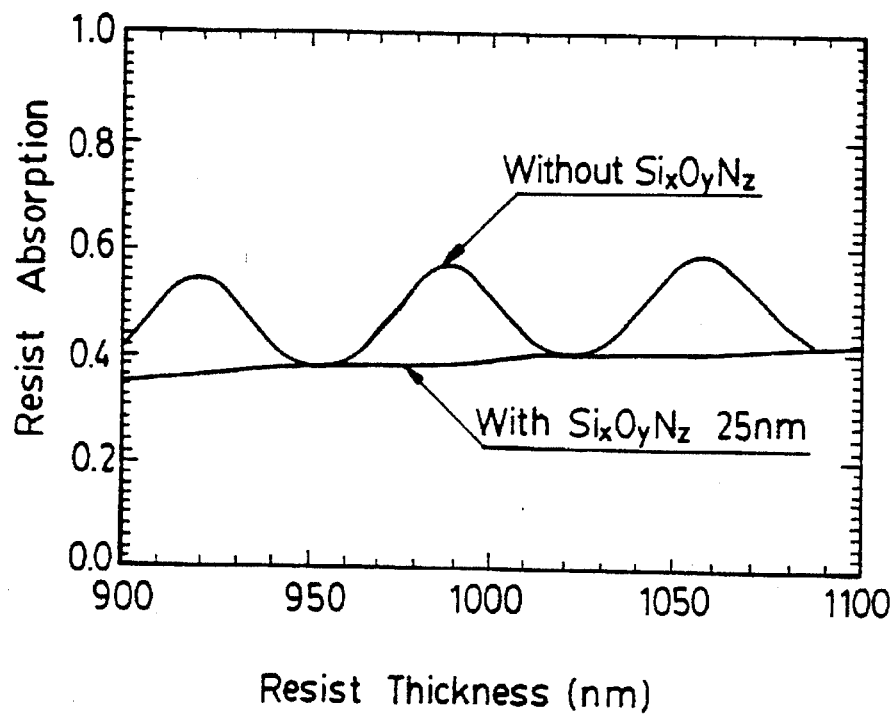
FIG. 49 is a graph illustrating the effect of an anti-reflective layer of $Si_xO_yN_z$ (25 nm) on W—Si.

As a result, it has been found that the optical constant shows changes in FIG. 48 corresponding to the film forming conditions upon forming the $Si_xO_yN_z$ or $Si_xN_y$ film by using the CVD process. In FIG. 48, regions shown by open circles satisfy the conditions in FIGS. 14 and 15. That is, FIG. 49 shows the standing wave effect in a case of using the $Si_xO_yN_z$ or $Si_xN_y$ film at 25 nm thickness as an anti-reflective layer and in a case of not using the anti-reflective layer. In the case of using the $Si_xO_yN_z$ or $Si_xN_y$ film at 25 nm, the standing wave effect was about ±1.8% and the standing wave effect was reduced to less than about 1/12 as compared with the case of not using the anti-reflective layer.

Example 54

In this example, a $Si_xO_yN_z$ film having n=2.4±0.6 and k=0.7±0.2 shown in Example 53 was formed by the following method to form an anti-reflective layer as shown in FIG. 47.

That is, in this example, a film was formed by utilizing a parallel plate plasma CVD process, ECR plasma CVD process or bias ECR plasma CVD process, by using a microwave (2.45 GHz), from a gas mixture of $SiH_4+O_2+N_2$ or a gas mixture of $SiH_4+N_2O$.

Example 55

In this example, a $Si_xO_yN_z$ film having n=2.4±0.6 and k=0.7±0.2 shown in Example 53 was formed by the following method to form an anti-reflective layer as shown in FIG. 47.

That is, in this example, a film was formed by utilizing a parallel plate plasma CVD process, ECR plasma CVD process or bias ECR plasma CVD process, by using a microwave (2.45 GHz), from a gas mixture of $SiH_4+O_2+N_2$ or a gas mixture of $SiH_4+N_2O$ and using Ar as a buffer gas.

Example 56 in this example, a $Si_xO_yN_z$ film having n=2.4±0.6 and k=0.7±0.2 shown in Example 53 was formed by the following method to form an anti-reflective layer as shown in FIG. 47.

That is, in this example, a film was formed by utilizing a parallel plate plasma CVD process, ECR plasma CVD process or bias ECR plasma CVD process, from a gas mixture of $SiH_4+O_2+N_2$ or a gas mixture of $SiH_4+N_2O$.

Example 57

In this example, a $Si_xO_yN_z$ film having n=2.4±0.6 and k=0.7±0.2 shown in Example 53 was formed by the following method to form an anti-reflective layer as shown in FIG. 47.

That is, in this example, a film was formed by utilizing a parallel plate plasma CVD process, ECR plasma CVD process or bias ECR plasma CVD process, from a gas mixture of $SiH_4+O_2+N_2$ or a gas mixture of $SiH_4+N_2O$ and using Ar as a buffer gas.

Example 58

In this example, a $Si_xN_y$ film having n=2.4±0.6 and k=0.7±0.2 shown in Example 53 was formed by the following method to form an anti-reflective layer as shown in FIG. 47.

That is, in this example, a film was formed by utilizing a parallel plate plasma CVD process, ECR plasma CVD process or bias ECR plasma CVD process, by using a microwave (2.45 GHz), from a gas mixture of $SiH_4+NH_3$ or a gas mixture of $SiH_2Cl_2+NH_3$.

Example 59

In this example, an $Si_xN_y$ film having n=2.4±0.6 and k=0.7±0.2 shown in Example 53 was formed by the following method to form an anti-reflective layer as shown in FIG. 47.

That is, in this example, a film was formed by utilizing a parallel plate plasma CVD process, ECR plasma CVD process or bias ECR plasma CVD process, from a gas mixture of $SiH_4+O_2$ or a gas mixture of $SiH_2Cl_2+NH_3$ and using Ar as a buffer gas.

Example 60

In this example, an $Si_xN_y$ film having n=2.4±0.6 and k=0.7±0.2 shown in Example 53 was formed by the following method to form an anti-reflective layer as shown in FIG. 47.

That is, in this example, a film was formed by utilizing a parallel plate plasma CVD process, ECR plasma CVD process or bias ECR plasma CVD process, by using a microwave (2.45 GHz), from a gas mixture of $SiH_4+NH_3$ or a gas mixture of $SiH_2Cl_2+NH_3$.

Example 61

In this example, an $Si_xN_y$ film having n=2.4±0.6 and k=0.7±0.2 shown in Example 53 was formed by the following method to form an anti-reflective layer as shown in FIG. 47.

That is, in this example, a film was formed by utilizing a parallel plate plasma CVD process, ECR plasma CVD process or bias ECR plasma CVD process, from a gas mixture of $SiH_4+O_2$ or a gas mixture of $SiH_2Cl_2+NH_3$ by using Ar as a buffer gas.

Example 62

In this example, a $Si_xO_yN_z$ or $Si_xN_y$ film having n=2.4±0.6 and k=0.7±0.2 shown in Example 53 was etched by the following method using a resist pattern as a mask.

That is, the $Si_xO_yN_z$ or $Si_xN_y$ film was etched by using a gas system of $CHF_3$ (50–100 SCCM)+$O_2$ (3–20 SCCM), under a pressure of about 2 Pa and with a power of about 100–1000 V by using a reactive etching process with improved ionic property, thereby etching a desired pattern.

Example 63

In this example, a $Si_xO_yN_z$ or $Si_xN_y$ film having n=2.4±0.6 and k=0.7±0.2 shown in Example 53 was etched by the following method using a resist pattern as a mask.

That is, the $Si_xO_yN_z$ or $Si_xN_y$ film was etched by using a gas system of $C_4F_8$ (30–70 SCCM)+$CHF_3$ (10–30 SCCM), under a pressure of about 2 Pa and with a power of about 100–1000 V by using a reactive ion etching process with improved ionic property, thereby etching a desired pattern.

Example 64

In this example, a $Si_xN_y$ film having n=2.4±0.6 and k=0.7±0.2 shown in Example 53 was etched by the following method using a resist pattern as a mask.

That is, the $Si_xO_yN_z$ or $Si_xN_y$ film was etched by using a gas system $S_2F_2$ (5–30 SCCM), under a pressure of about 2 Pa and with a power of about 100–1000 V by using a reactive etching process with improved ionic property, thereby etching a desired pattern.

Example 65

In this example, the present invention was applied by using a $Si_xO_yN_z$ or $Si_xN_y$ film as an anti-reflective layer for forming a stable resist pattern on an underlying Al, Al—Si or Al—Si—Cu material or by way of a silicon oxide film, such as $SiO_2$, on the underlying material by using KrF excimer lithography.

Figure 50:
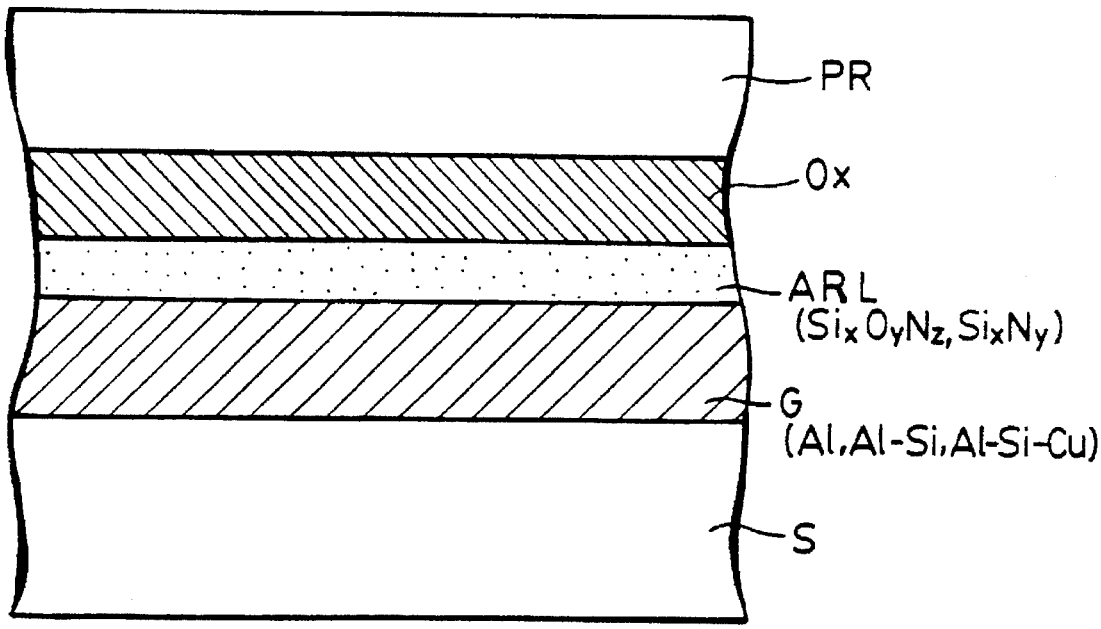
FIG. 50 is a cross sectional view illustrating the structure of Example 65.

In the method of forming the resist pattern in this pattern, as shown in FIG. 50, an anti-reflective layer ARL is formed with $Si_xO_yN_z$ or $Si_xN_y$ on the underlying Al, Al—Si or Al—Si—Cu material as a metal wiring material, a photoresist PR was formed on the anti-reflective layer ARL or the photoresist PR was formed on the anti-reflective layer after forming a silicon oxide film such as $SiO_2$ to form a resist pattern. In this example, the present invention was applied by using $Si_xO_yN_z$ or $Si_xN_y$ as the anti-reflective layer ARL, particularly in a case of obtaining a wiring structure by forming a material layer as wiring with Al, Al—Si or Al—Si—Cu on a substrate, such as a Si semiconductor substrate, or forming a silicon oxide film, such as $SiO_2$, on the material layer, which was then patterned by a photolithographic step using the photoresist PR and an etching step.

At first, description will be made to the procedures for selecting $Si_xO_yN_z$ or $Si_xN_y$ as the anti-reflective layer to be used on the underlying Al, Al—Si or Al—Si—Cu material and the method of determining the condition to be satisfied by $Si_xO_yN_z$ or $Si_xN_y$. The following procedures (1)–(6) were conducted.

Figure 20:
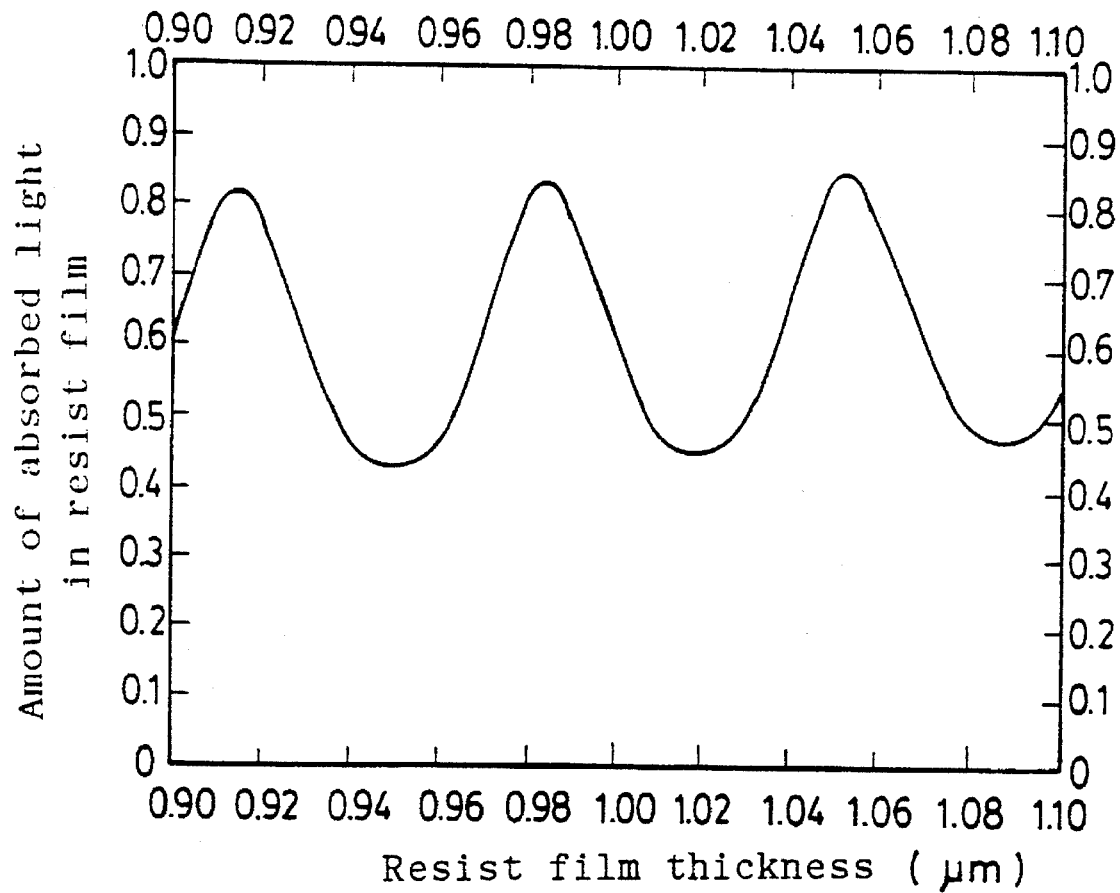
FIG. 20 is a graph for the explanation of a problem in the prior art, which shows the standing wave effect.
Figure 21:
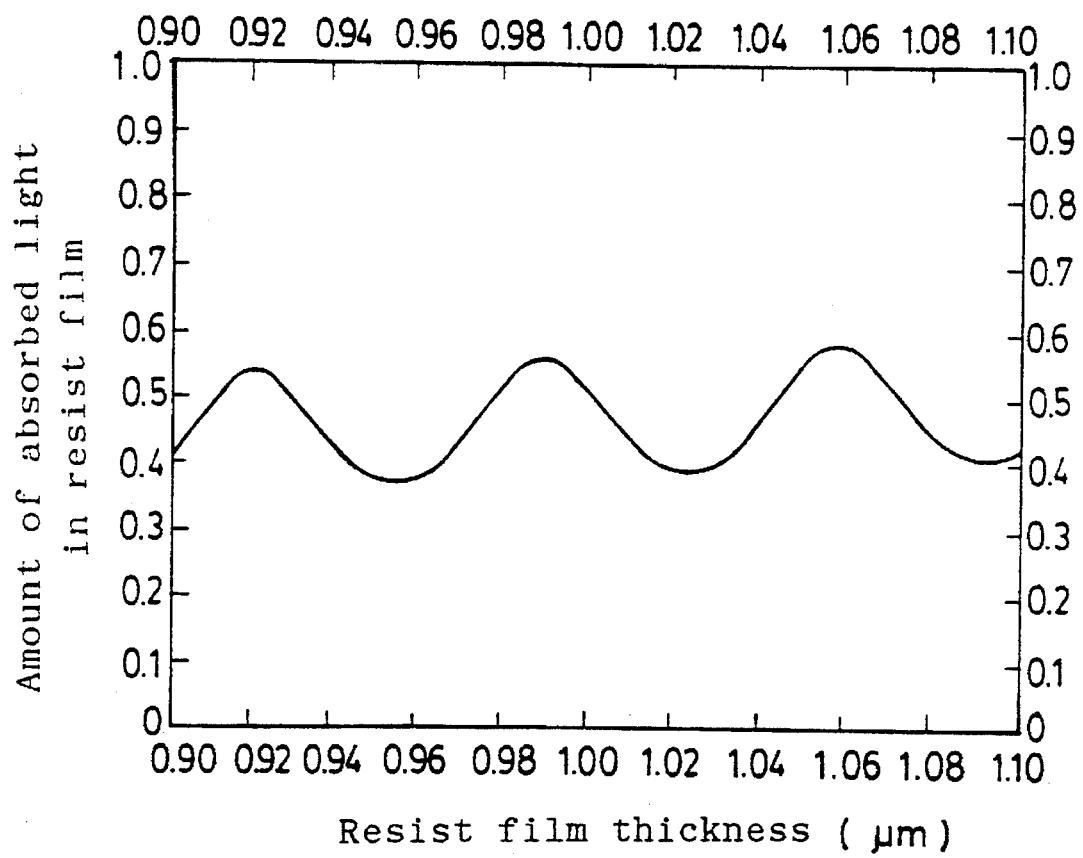
FIG. 21 is a graph for the explanation of a problem in the prior art, which shows the standing wave effect.
Figure 22:
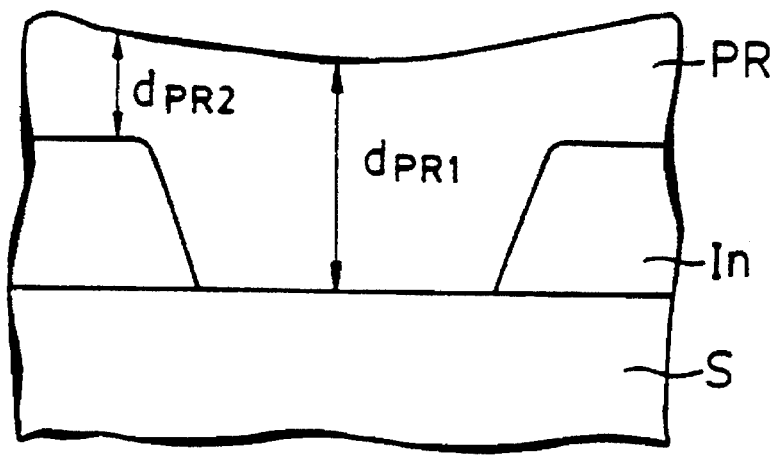
FIG. 22 is a diagrammatic cross sectional view for the explanation of a problem in the prior art, which shows the effect of a step.
Figure 23:
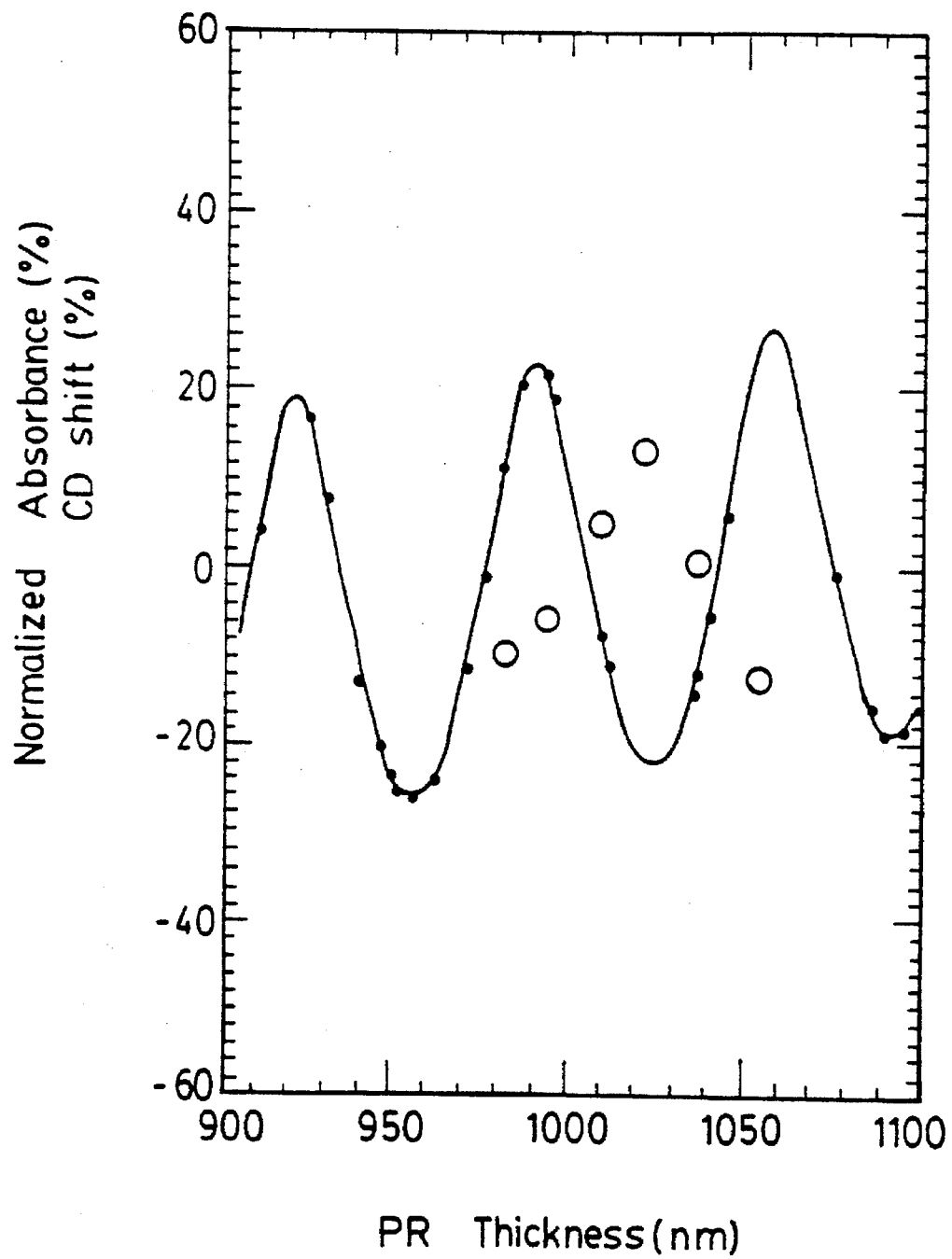
FIG. 23 is a graph illustrating the effect of the standing wave effect.
Figure 24:
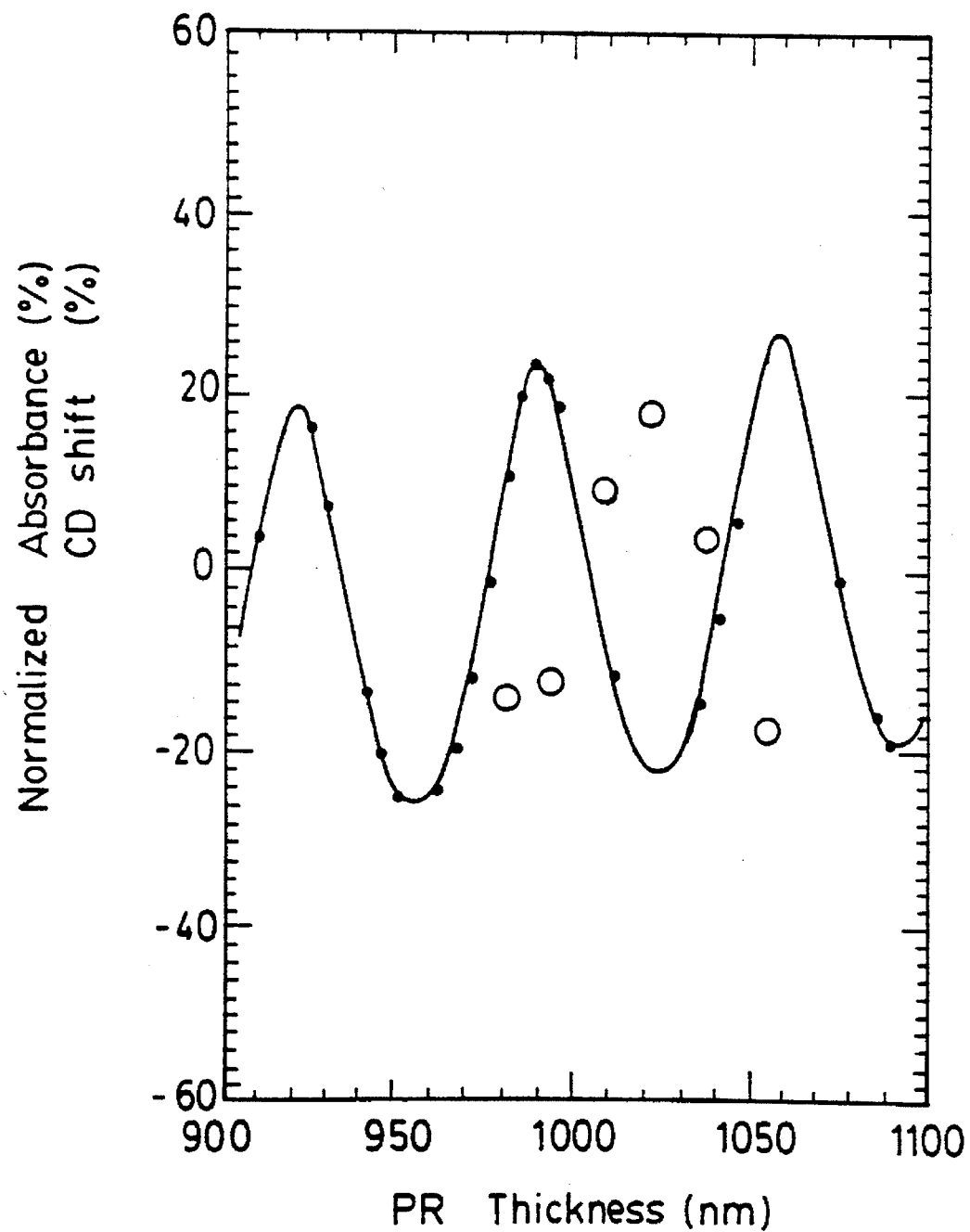
FIG. 24 is a graph illustrating the effect of the standing wave effect.
Figure 25:
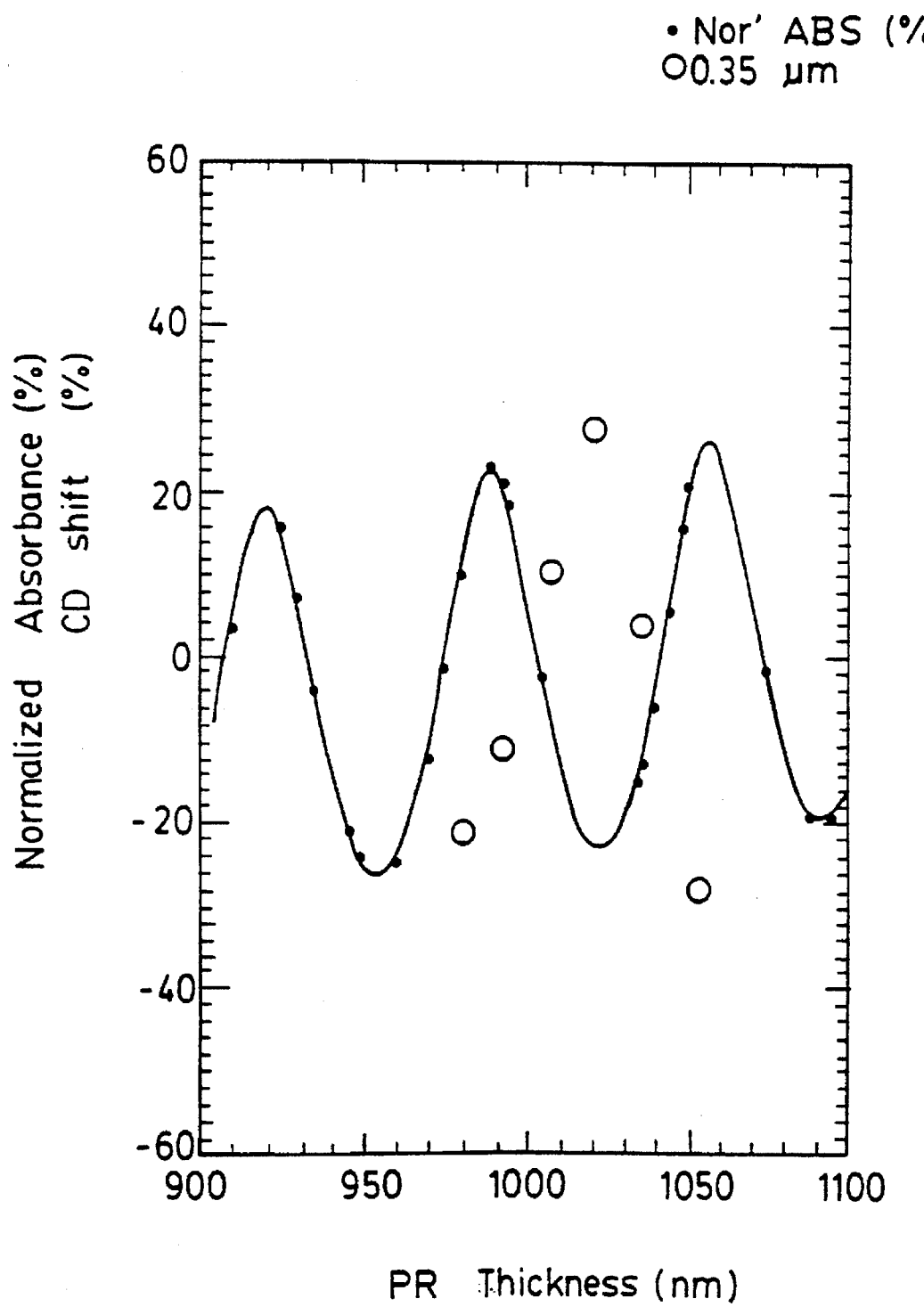
FIG. 25 is a graph showing the effect of the standing wave effect.
Figure 26:
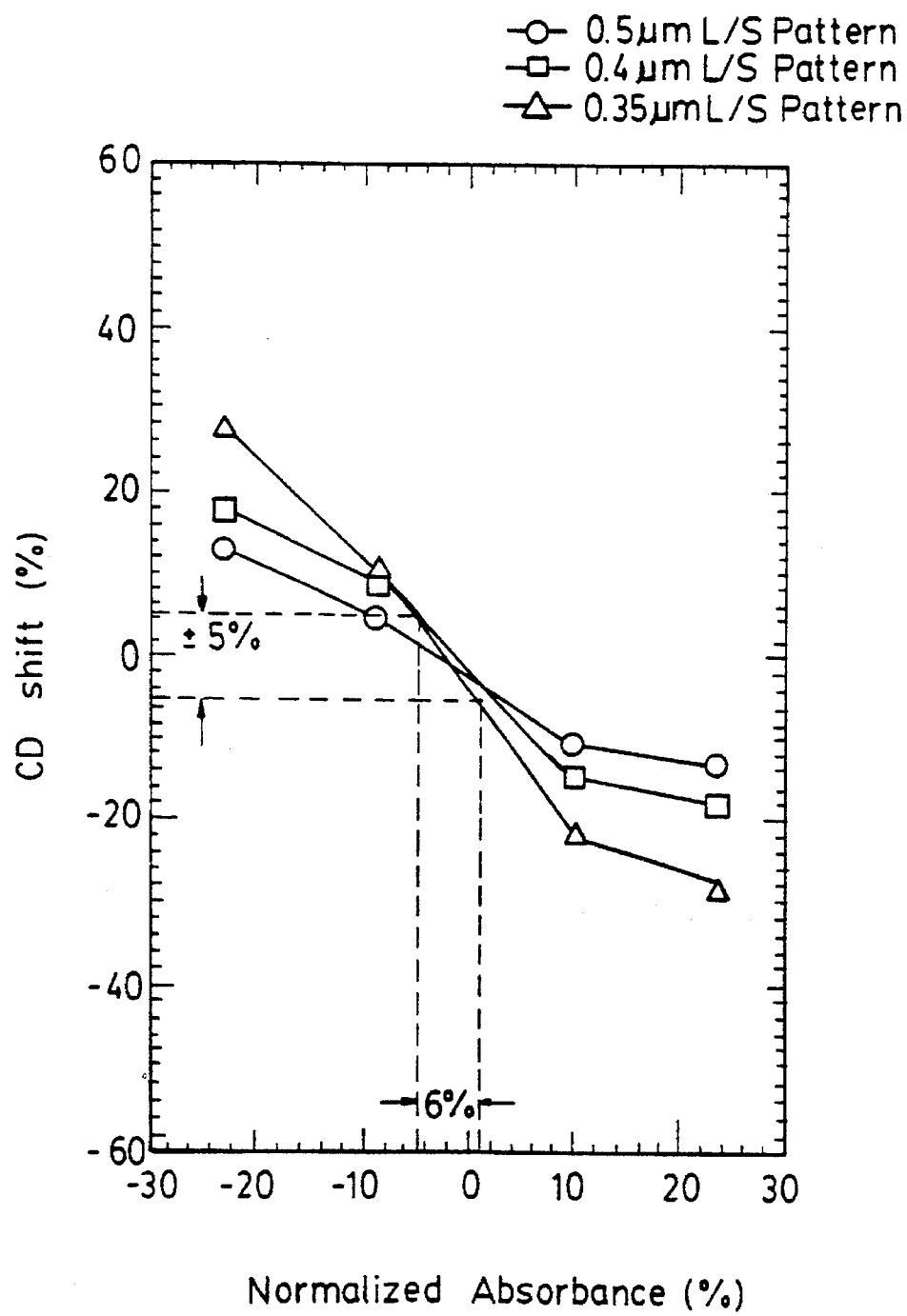
FIG. 26 is a graph illustrating a relationship between the fluctuation for the amount of absorbed light and the dimensional variation of the pattern.

(1) XP 8843 resist (manufactured by Shipley Microelectronics Co.) was coated on an Al, Al—Si or Al—Si—Cu substrate without an anti-reflective layer and exposed by a KrF excimer laser beam at a wavelength of 248 nm, followed by development. FIG. 20 shows the standing wave effect in this case. As shown in FIG. 20, the standing wave effect was about ±29.6%.

(2) In FIG. 20, the maximum value of the standing wave effect situates, for example, at 982 nm of the resist film thickness. FIG. 30 shows equi-contour lines for the amount of absorbed light in the resist film relative to the change of optical constants $n_{arl}$, $k_{arl}$ of the anti-reflective layer, wherein the resist film has a thickness of 982 nm, and the thickness of the anti-reflective layer is set to 30 nm.

(3) FIGS. 31, 32 and 33 show the results of repeating the procedures (2) above to each of the resist film thicknesses of 1000 nm, 1018 nm and 1035 nm, respectively.

(4) As a result of determining a common region in FIG. 30 to FIG. 33, $n_{arl}$=4.8, $k_{arl}$=0.45, or $n_{arl}$=2.0, $k_{arl}$=0.8 were obtained.

That is, the condition to be satisfied by the optimal anti-reflective layer with the thickness of the anti-reflective layer being set as 30 nm is:

$n_{arl}$=4.8, $k_{arl}$=0.45, or $n_{arl}$=2.0, $k_{arl}$=0.8.

When the standing wave effect was determined by using the above-mentioned condition, the results shown in FIG. 34 and FIG. 35 were obtained. In FIG. 34 and FIG. 35, the standing wave effect was extremely small and it was about less than ±1% in each of the cases. The standing wave effect was reduced to about 1/60 as compared with the case of not using the anti-reflective layer.

(5) The procedures (2)–(4) described above were conducted in a case of setting the thickness of the anti-reflective layer as 30 nm. When the procedures (2)–(4) were repeated also for anti-reflective layer (ARL thickness) of other different layer thicknesses, an optimal condition for the anti-reflective layer in accordance with the thickness of the anti-reflective layer could be determined. FIG. 14 and FIG. 36 show the obtained results.

Figure 51:
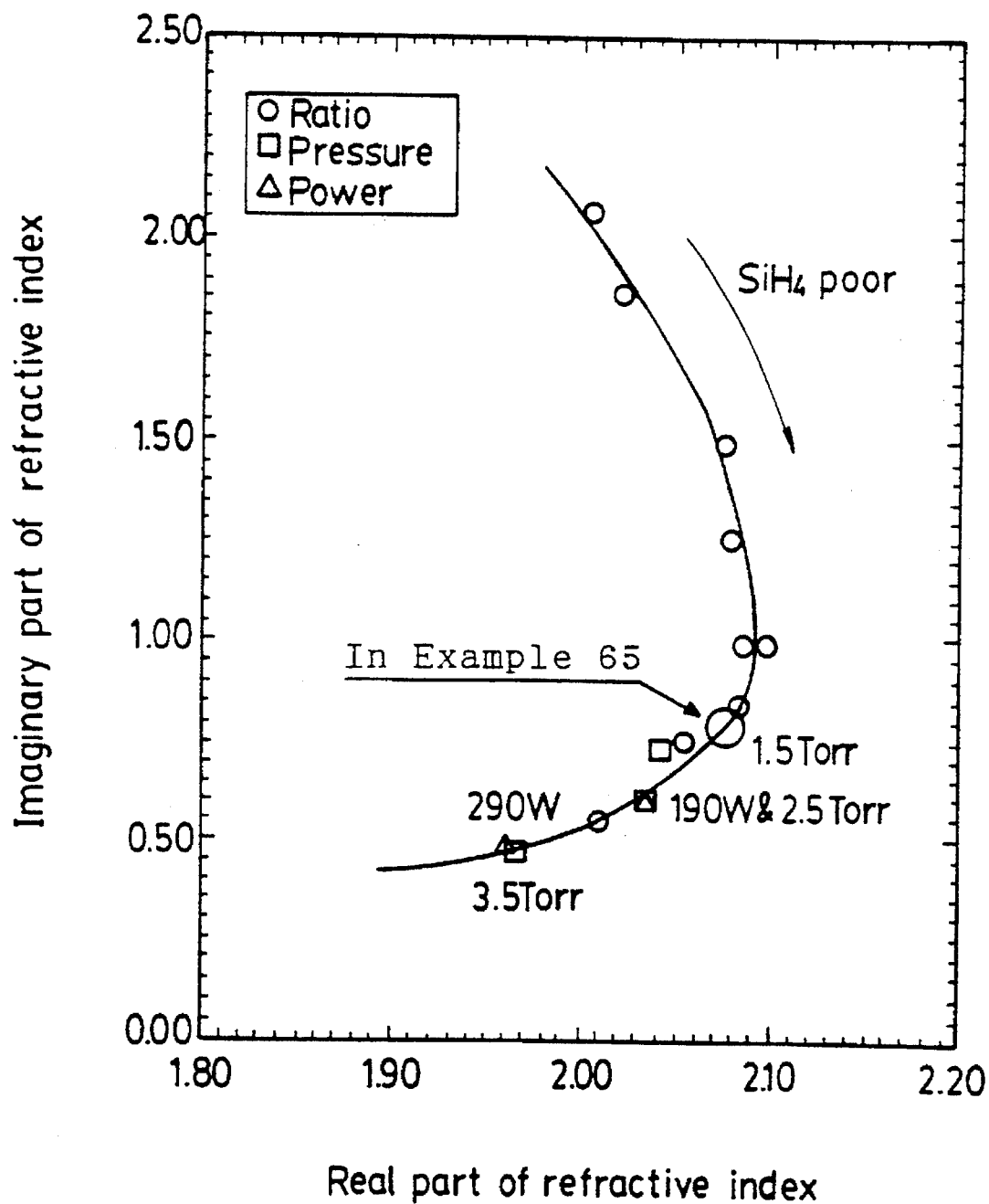
FIG. 51 is a graph illustrating the optical constant property of $Si_xO_yN_z$ or $Si_xN_y$.
Figure 52:
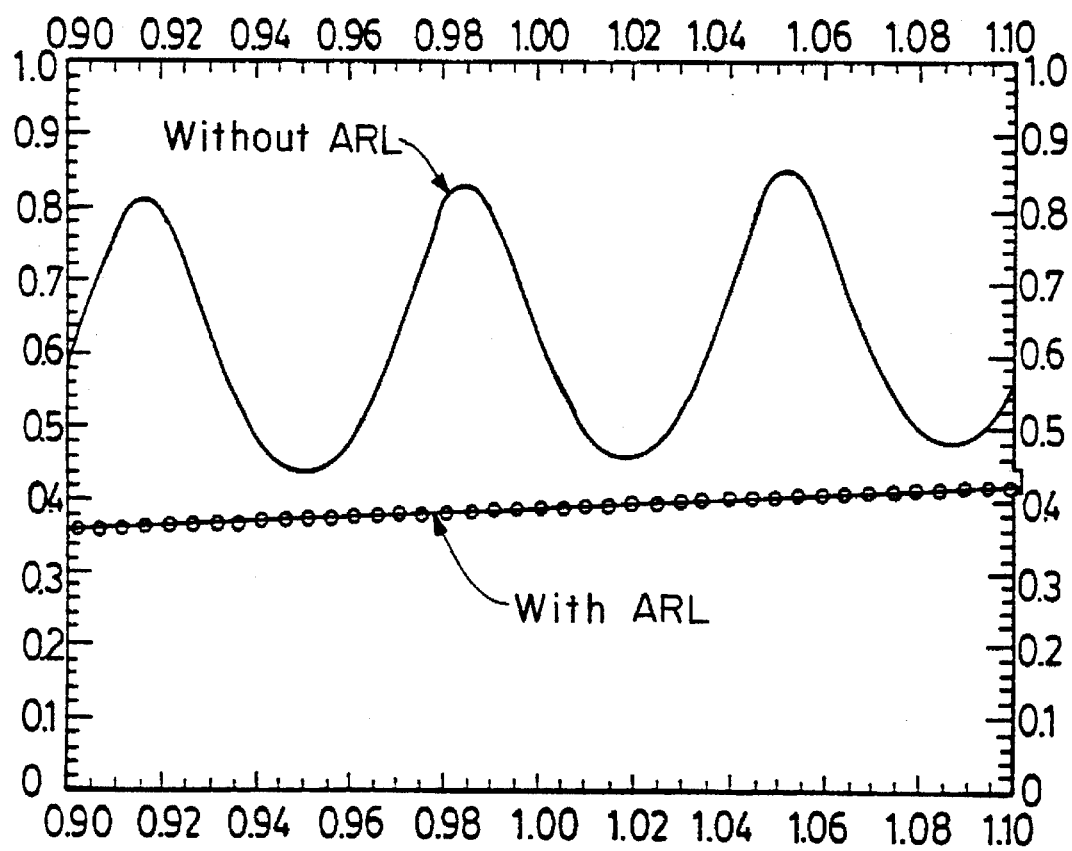
FIG. 52 is a graph illustrating the standing wave effect at the optimum condition in Example 65.

(6) It was investigated as to whether the film species capable of satisfying the condition to be met by the anti-reflective layer determined in (5) above were present or not by using a spectroscopic ellipsometer (SOPRA Co.). As a result, it has been found that the optical constants show the change in FIG. 51 corresponding to the condition upon forming the $Si_xO_yN_z$ or $Si_xN_y$ film by using the CVD process. The region shown by open circles in FIG. 51 satisfy the conditions in FIG. 14 and FIG. 36. That is, FIG. 52 shows the standing wave effect in a case of using the $Si_xO_yN_z$ or $Si_xN_y$ film at a 25 nm thickness as an anti-reflective layer on the underlying Al, Al—Si, Al—Si—Cu material and in a case of not using the anti-reflective layer. In the case of using the $Si_xO_yN_z$ or $Si_xN_y$ film at 25 nm, the standing wave effect was about ±0.5%, and the standing wave effect was reduced to about 1/60 as compared with the case of not using the anti-reflective layer.

Example 66

In this example, an $Si_xO_yN_z$ film within a range of values on the curve in the graph showing the relation between the thickness of the anti-reflective layer and the optical property to be satisfied by the optimum anti-reflective layer (FIG. 14, FIG. 36) or values on the curve ±0.3 for n and values on the curve ±0.3 for k shown in Example 65 was formed by the method described below to form an anti-reflective layer shown in FIG. 50.

That is, in this example, a film was formed by utilizing a parallel plate plasma CVD process, ECR plasma CVD process or bias ECR plasma CVD process, using a microwave (2.45 GHz) from a gas mixture of $SiH_4+O_2+N_2$ or a gas mixture of $SiH_4+N_2O$.

Example 67

In this example, an $Si_xO_yN_z$ film within a range of values on the curve in the graph showing the relation between the thickness of the anti-reflective layer and the optical property to be satisfied by the optimum anti-reflective layer (FIG. 14, FIG. 36) or values on the curve ±0.3 for n and values on the curve ±0.3 for k shown in Example 65 was formed by the method described below to form an anti-reflective layer shown in FIG. 50.

That is, in this example, a film was formed by utilizing a parallel plate plasma CVD process, ECR plasma CVD process or bias ECR plasma CVD process, using a microwave (2.45 GHz) from a gas mixture of $SiH_4+O_2+N_2$ or a gas mixture of $SiH_4+N_2O$ and using Ar as a buffer gas.

Example 68

In this example, an $Si_xO_yN_z$ film within a range of values on the curve in the graph showing the relation between the thickness of the anti-reflective layer and the optical property to be satisfied by the optimum anti-reflective layer (FIG. 14, FIG. 36) or values on the curve ±0.3 for n and values on the curve ±0.3 for k shown in Example 65 was formed by the method described below to form an anti-reflective layer shown in FIG. 50.

That is, in the example, a film was formed by utilizing a parallel plate plasma CVD process, ECR plasma CVD process or bias ECR plasma CVD process, from a gas mixture of $SiH_4+O_2+N_2$ or a gas mixture of $SiH_4+N_2O$.

Example 69

In this example, an $Si_xO_yN_z$ film within a range of values on the curve in the graph showing the relation between the thickness of the anti-reflective layer and the optical property to be satisfied by the optimum anti-reflective layer (FIG. 14, FIG. 36) or values on the curve ±0.3 for n and value on the curve ±0.3 for k shown in Example 65 was formed by the method described below to form an anti-reflective layer shown in FIG. 50.

That is, in this example, a film was formed by utilizing a parallel plate plasma CVD process, ECR plasma CVD process or bias ECR plasma CVD process, from a gas mixture of $SiH_4+O_2+N_2$ or a gas mixture of $SiH_4+N_2O$, using Ar as a buffer gas.

Example 70

In this example, an $Si_xO_yN_z$ film within a range of values on the curve in the graph showing the relation between the thickness of the anti-reflective layer and the optical property to be satisfied by the optimum anti-reflective layer (FIG. 14, FIG. 36) or values on the curve ±0.3 for n and values on the curve ±0.3 for k shown in Example 65 was formed by the method described below to form an anti-reflective layer shown in FIG. 50.

That is, in this example, a film was formed by utilizing a parallel plate plasma CVD process, ECR plasma CVD process or bias ECR plasma CVD process, using a microwave (2.45 GHz) from a gas mixture of $SiH_4+NH_3$ or a gas mixture of $SiH_2Cl_2+NH_3$.

Example 71

In this example, an $Si_xO_yN_z$ film within a range of values on the curve in the graph showing the relation between the thickness of the anti-reflective layer and the optical property to be satisfied by the optimum anti-reflective layer (FIG. 14, FIG. 36) or values on the curve ±0.3 for n and values on the curve ±0.3 for k shown in Example 65 was formed by the method described below to form an anti-reflective layer shown in FIG. 50.

That is, in this example, a film was formed by utilizing a parallel plate plasma CVD process, ECR plasma CVD process or bias ECR plasma CVD process, using a microwave (2.45 GHz) from a gas mixture of $SiH_4+O_2$ or a gas mixture of $SiH_2Cl_2+NH_3$ using Ar as a buffer gas.

Example 72

In this example, an $Si_xO_yN_z$ film within a range of values on the curve in the graph showing the relation between the thickness of the anti-reflective layer and the optical property to be satisfied by the optimum anti-reflective layer (FIG. 14, FIG. 36) or values on the curve ±0.3 for n and values on the curve ±0.3 for k shown in Example 65 was formed by the method described below to form an anti-reflective layer shown in FIG. 50.

That is, in this example, a film was formed by utilizing a parallel plate plasma CVD process, ECR plasma CVD process or bias ECR plasma CVD process, from a gas mixture of $SiH_4+NH_3$ or a gas mixture of $SiH_2Cl_2+NH_3$.

Example 73

In this example, an $Si_xO_yN_z$ film within a range of values on the curve in the graph showing the relation between the thickness of the anti-reflective layer and the optical property to be satisfied by the optimum anti-reflective layer (FIG. 14, FIG. 36) or values on the curve ±0.3 for n and values on the curve ±0.3 for k shown in Example 65 was formed by the method described below to form an anti-reflective layer shown in FIG. 50.

That is, in this example, a film was formed by utilizing a parallel plate plasma CVD process, ECR plasma CVD process or bias ECR plasma CVD process, from a gas mixture of $SiH_4+O_2$ or a gas mixture of $SiH_2Cl_2+NH_3$ using Ar as a buffer gas.

Example 74

In this example, a $Si_xO_yN_z$ or $Si_xN_y$ film within a range of values on the curve in the Figure (FIG. 14, FIG. 36) showing a relationship between the thickness of the anti-reflective layer and the optical property to be satisfied by the optimum anti-reflective layer or values on the curve ±0.3 for n and values on the curve ±0.3 for k was etched by the following method using the resist pattern as a mask for the underlying material.

That is, the $Si_xO_yN_z$ or $Si_xN_y$ film was etched by a reactive etching process using a gas system of $CHF_3$ (50–100 SCCM)+$O_2$(3–20 SCCM) under a pressure of about 2 Pa and with a power of about 100 to 1000 W and improved with the ionic property to etch a desired pattern.

Example 75

In this example, a $Si_xO_yN_z$ or $Si_xN_y$ film within a range of values on the curve in the Figure (FIG. 14, FIG. 36) showing a relationship between the thickness of the anti-reflective layer and the optical property to be satisfied by the optimum anti-reflective layer or values on the curve ±0.3 for n and values on the curve ±0.3 for k was etched by the following method using the resist pattern as a mask for the underlying material.

That is, the $Si_xO_yN_z$ or $Si_xN_y$ film was etched by a reactive etching process using a gas system of $C_4F_8$ (30–70 SCCM) +$CHF_3$ (10–30 SCCM) under a pressure of about 2 Pa and with a power of about 100 to 1000 W and improved with the ionic property to etch a desired pattern.

Example 76

In this example, a $Si_xO_yN_z$ or $Si_xN_y$ film within a range of values on the curve in the Figure (FIG. 14, FIG. 36) showing a relationship between the thickness of the anti-reflective layer and the optical property to be satisfied by the optimum anti-reflective layer or values on the curve ±0.3 for n and values on the curve ±0.3 for k was etched by the following method using the resist pattern as a mask for the underlying material.

That is, the $Si_xO_yN_z$ or $Si_xN_y$ film was etched by a reactive etching process using a gas system of $S_2F_2$ (5–30 SCCM) under a pressure of about 2 Pa and with a power of about 100 to 1000 W and improved with the ionic property to etch a desired pattern.

Example 77

In this example, in a case of forming a stable resist pattern on a silicon substrate, such as of single crystal silicon, polycrystalline silicon, amorphous silicon or doped polysilicon and, by way of a silicon oxide film, such as $SiO_2$, on the underlying material by using a KrF excimer laser, it has been found according to the present invention that use of an organic or inorganic film having n=1.8–2.6 and k=0.1–0.8, particularly a $Si_xO_yN_z$ or $Si_xN_y$ film at a film thickness of 20–150 nm as the anti-reflective layer was desirable.

In a case of using the $Si_xO_yN_z$ or $Si_xN_y$ film as the anti-reflective layer, the film could be formed by various types of CVD processes. Further, $Si_xO_yN_z$ or $Si_xN_y$ could be etched by RIE using $CHF_3$, $C_4F_8$, $CHF_3S_2F_2$ series gas as an etchant end improved with the ionic property.

That is, in this example, the present invention was applied in a case of using the $Si_xO_yN_z$ or $Si_xN_y$ film as the anti-reflective layer for forming a stable resist pattern on a silicon series substrate, such as single crystal silicon and, by way of a silicon oxide film, such as $SiO_2$, on the above-mentioned substrate by using KrF excimer lithography.

Figure 53:
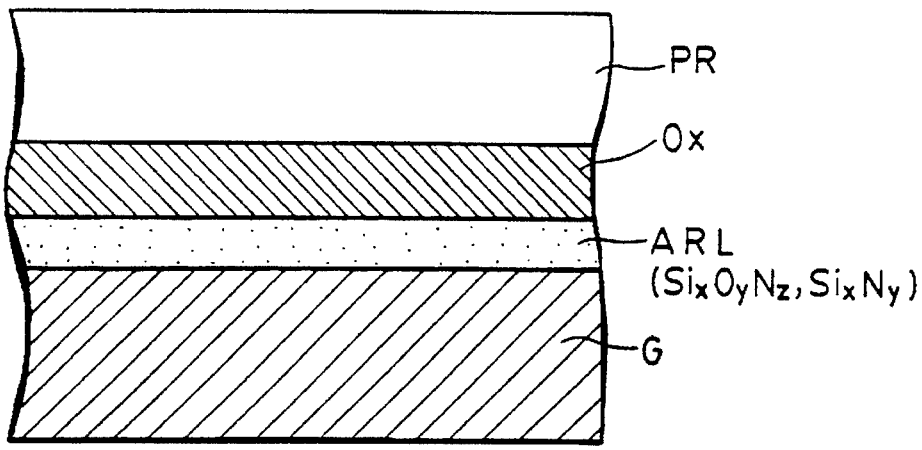
FIG. 53 is a cross sectional view showing the structure of Example 77.

As shown in FIG. 53, in the method of forming a resist pattern in this example, an anti-reflective layer ARL was formed with $Si_xO_yN_z$ or $Si_xN_y$ on a silicon series substrate G, such as single crystal silicon, a photoresist PR was formed on the anti-reflective layer ARL, or the photoresist PR was formed after forming the silicon oxide film Ox such as $SiO_2$ on the anti-reflective layer, thereby forming a resist pattern.

In this example, the present invention was applied, particularly in a case of forming a silicon oxide film Ox, such as $SiO_2$, on a silicon series substrate G, such as of single crystal silicon or on the material layer, which was patterned by a photolithographic step using the photoresist PR and an etching step, in which $Si_xO_yN_z$ or $Si_xN_y$ was used as the anti-reflective layer ARL.

At first, description will be made to procedures for selecting an organic or inorganic film, particularly, a $Si_xO_yN_z$ or $Si_xN_y$ film having n=1.8–2.6 and k=0.1–0.8 at a film thickness=20–150 nm as an anti-reflective layer on the silicon series substrate G such as of single crystal silicon or on the underlying material, as well as a method of determining the condition to be satisfied therewith. The following procedures (1)–(6) were conducted.

(1) XP 8843 resist (manufactured by Shipley Microelectronics Co.) was coated on a Si series substrate without an anti-reflective layer and exposed by a KrF excimer laser beam at a wavelength of 248 nm, followed by development. FIG. 41 shows the standing wave effect in this case. As shown in FIG. 41, the standing wave effect was about ±20%.

(2) In FIG. 41, the maximum value of the standing wave effect situates, for example, at 985 nm of the resist film thickness. Fluctuation for the amount of absorbed light in the resist film was determined relative to the change of optical constants $n_{arl}$, $k_{arl}$ of the anti-reflective layer, taking notice on the resist film thickness of 982 nm, and setting the thickness of the anti-reflective layer to 30 nm.

(3) The procedure (2) was repeated for each of a plurality of resist films of different thicknesses.

(4) The results are shown in the Figures and a common region in them was determined. Such a procedure was determined for each kind of the film thicknesses of the anti-reflective layers, by which an optimum value (n value, k value) of the optical property of a certain film thickness was determined. For instance, the optimum condition to be satisfied by the optimum anti-reflective layer in a case of setting the thickness of the anti-reflective layer as 32 nm was:

$$n_{arl}=2.0, k_{arl}=0.55.$$

Further, the optical condition to be satisfied by the optimum anti-reflective layer upon setting the thickness of the anti-reflective layer as 100 nm was:

$$n_{arl}=1.9, k_{arl}=0.35.$$

Figure 54:
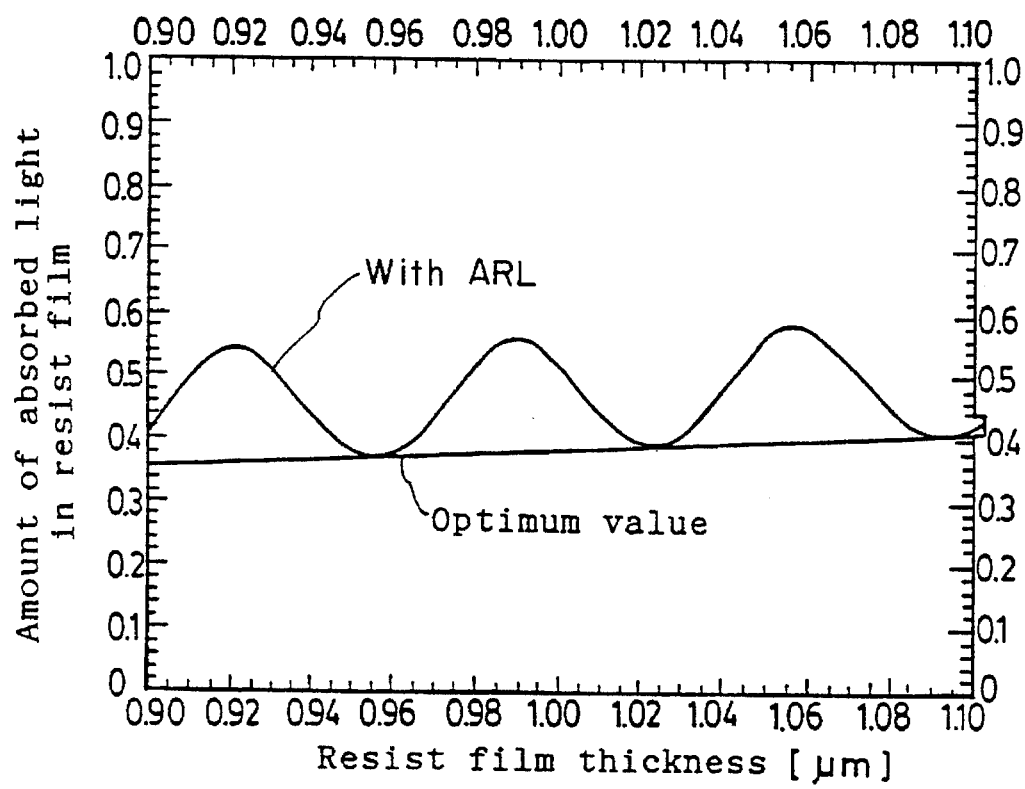
FIG. 54 is a graph illustrating the effect of an anti-reflective layer of a $Si_xO_yN_z$ film or $Si_xN_y$ film (32 nm) on Si.
Figure 55:
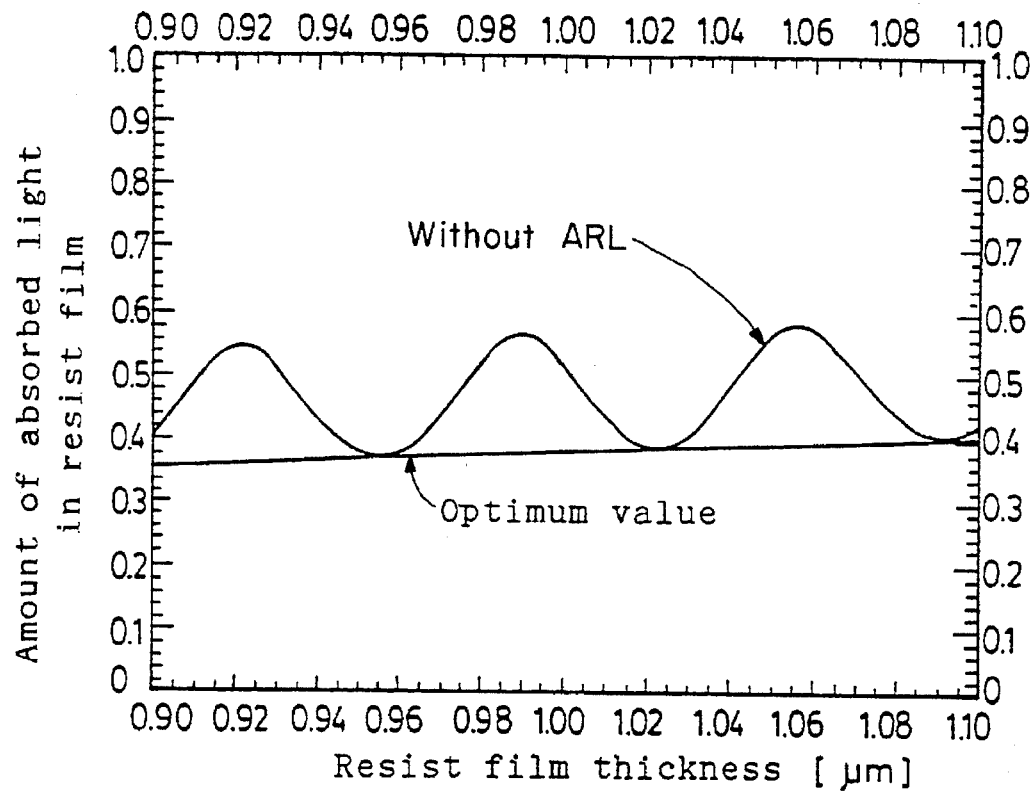
FIG. 55 is a graph illustrating the effect of an anti-reflective layer of a $Si_xO_yN_z$ film or $Si_xN_y$ film (100 nm) on Si.

When the standing wave effect was determined by using the above-mentioned two conditions, results as shown in FIGS. 54 and 55 were obtained. In FIGS. 54 and 55, the standing wave effect shown at the optimum value was extremely small and it was less than about ±1% in each of the cases. The standing wave effect was reduced to less than about 1/20 as compared with the case of not using the anti-reflective layer.

(5) The procedures (2)–(4) described above were applied to a case of setting the thickness of the anti-reflective layer as 32 nm and 100 nm. When the procedures (2)–(4) were repeated also to other different thicknesses of the anti-reflective layer (ARL layer thickness), an optimum condition for the anti-reflective layer depending on the thickness of the anti-reflective layer could be determined.

(6) It was investigated as to whether film species capable of satisfying the condition to be met by the anti-reflective layer determined in (5) above were present or not by using a spectroscopic ellipsometer (SOPRA Co.). As a result, it has been found that the optical constants show the change in FIG. 56 corresponding to the condition upon forming the $Si_xO_yN_2$ or $Si_xN_y$ film by using the CVD process. The regions shown by open circles in FIG. 56 satisfy the conditions for (4) described above. FIGS. 54 and 55 show the results determining the standing wave effect under the condition shown by the open circles in FIG. 56. In each of the cases, the standing wave effect was less than about ±1.0% by using the $Si_xO_yN_z$ or $Si_xN_y$ film as the anti-reflective layer and the standing wave effect was reduced to about 1/20 as compared with the case of not using the anti-reflective layer.

Example 78

In this example, $Si_xO_yN_z$ or $Si_xN_y$ was used as the anti-reflective layer ARL, particularly, in a case of patterning a silicon oxide film, such as $SiO_2$, on a silicon series substrate such as of polycrystalline silicon, amorphous silicon or doped polysilicon, or on the material layer by a photolithographic step using a photoresist PR and an etching step by using the method shown in Example 77.

At first, description will be made to the procedures for selecting an organic or inorganic film having n=1.8–2.6 and k=0.2–0.8 at a film thickness of 20–150 nm, in particular, a $Si_xO_yN_z$ or $Si_xN_y$ film as an anti-reflective layer on a silicon series substrate, such as of polycrystalline silicon, amorphous silicon or doped polysilicon by using the same method as in Example 77, as well as a method of determining the condition to be satisfied therewith.

Figure 57:
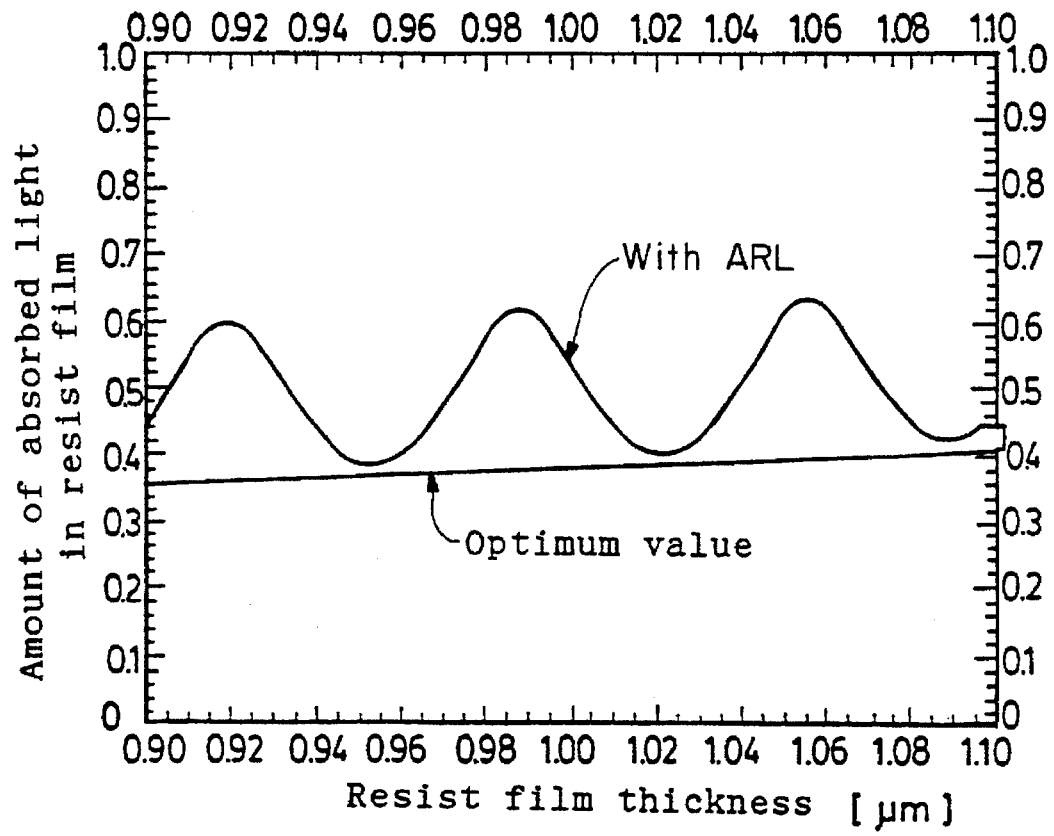
FIG. 57 is a graph illustrating the effect of an anti-reflective layer of the $Si_xO_yN_z$ film or $Si_xN_y$ film (33 nm) on the Si series material.

(1) The optical condition to be satisfied by the optimum anti-reflective layer with a thickness of the anti-reflective layer, for example, of 33 nm by using the same method as in Example 77 was $n_{arl}$=2.01, $k_{arl}$=0.62. When the standing wave effect was determined by using this condition, the result, as shown in FIG. 57, was obtained. The standing effect in FIG. 57 was extremely small and it was about less than 21% in each of the cases. The standing wave effect was reduced to about 1/20 as compared with the case of not using the anti-reflective layer.

(2) The foregoing procedures were applied to the case of setting the thickness of the anti-reflective layer to 33 nm. When the above-mentioned procedures were repeated also for other anti-reflective layers of different thicknesses (ARL layer thickness), an optimum condition for the anti-reflective layer in accordance with the thickness of the anti-reflective layer was obtained.

Figure 56:
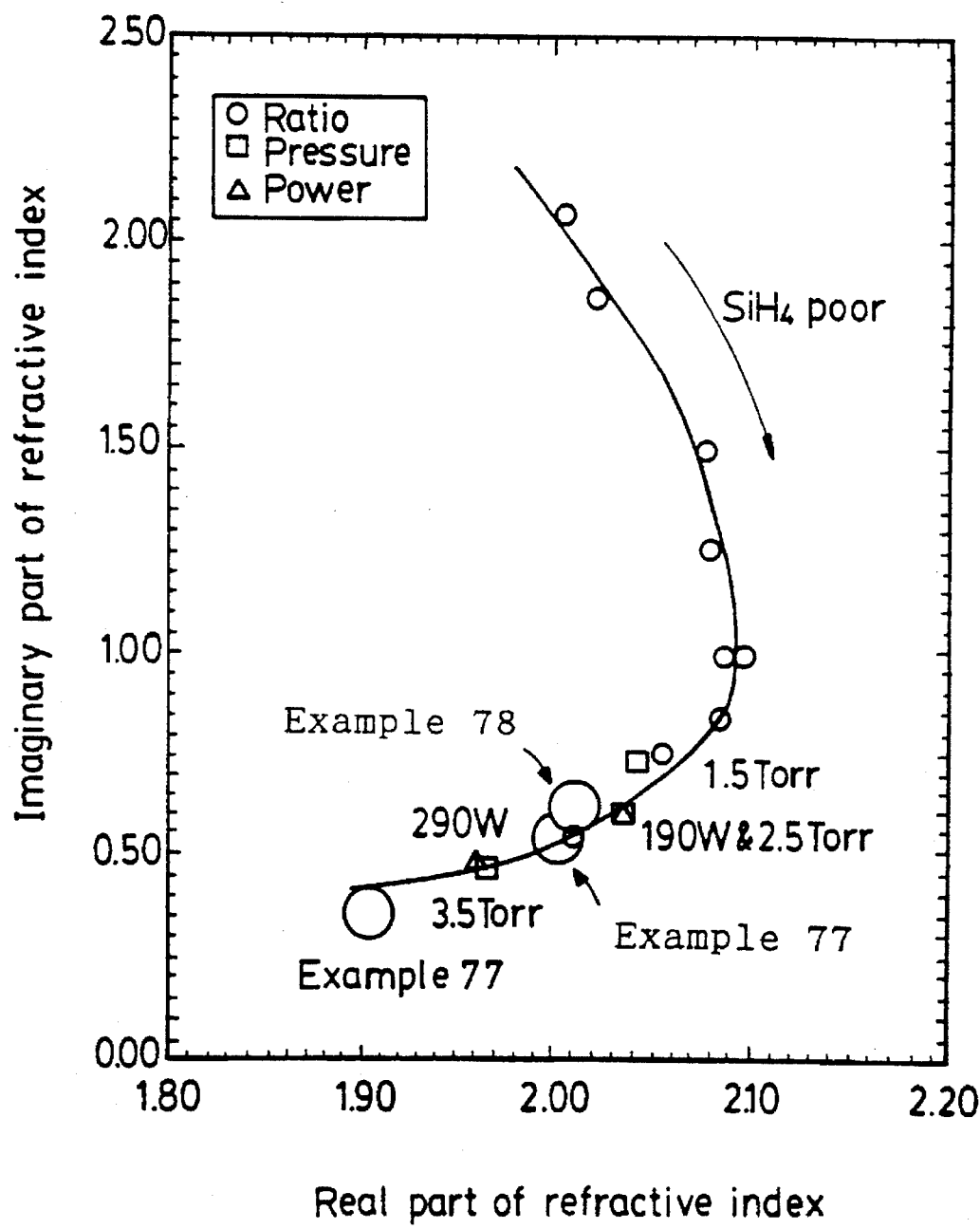
FIG. 56 is a graph illustrating the optical constant property of $Si_xO_yN_z$ or $Si_xN_y$.

(3) The condition to be satisfied by the anti-reflective layer determined above corresponds to the region shown by open circles in the change of the optical constants corresponding to the condition upon forming the $Si_xO_yN_z$ or $Si_xN_y$ film by using the CVD process (refer to FIG. 56). FIG. 57 shows the standing wave effect in the case of using the $Si_xO_yN_z$ or $Si_xN_y$ film at a thickness of 33 nm as the anti-reflective layer on the silicon series substrate, such as of polycrystalline silicon, amorphous silicon and doped polysilicon and in a case of not using the anti-reflective layer. The standing wave effect in a case of setting the thickness of the $Si_xO_yN_z$ or $Si_xN_y$ film to 33 nm was less than about ±1.0% and the standing wave effect was reduced to less than about 1/20 as compared with the case of not using the anti-reflective layer.

Example 79

In this example, the $Si_xO_yN_z$ film shown in Examples 77 and 78 was formed by the following method to form an anti-reflective layer as shown in Example 53.

That is, in this example, a film was formed by utilizing a parallel plate plasma CVD process, ECR plasma CVD process or bias ECR plasma CVD process using a microwave (2.45 GHz) for a gas mixture of $SiH_4+O_2+N_2$ or a gas mixture of $SiH_4+N_2O$.

Example 80

In this example, the $Si_xO_yN_z$ film shown in Examples 77 and 78 was formed by the following method to form the anti-reflective layer as shown in FIG. 53.

That is, in this example, the film was formed by utilizing a parallel plate plasma CVD process, ECR plasma CVD process or bias ECR plasma CVD process at a microwave (2.45 GHz) from a gas mixture of $SiH_4+O_2+N_2$ or a gas mixture of $SiH_4+N_2O$ using Ar as a buffer gas.

Example 81

In this example, the $Si_xO_yN_z$ film shown in Examples 77 and 78 was formed by the following method to form the anti-reflective layer as shown in FIG. 53.

That is, in this example, a film was formed by utilizing a parallel plate plasma CVD process, ECR plasma CVD process or a bias ECR plasma CVD process from a gas mixture of $SiH_4+O_2+N_2$ or a gas mixture of $SiH_4+N_2O$.

Example 82

In this example, the $Si_xO_yN_z$ film shown in Examples 77 and 78 was formed by the following method to form the anti-reflective layer as shown in FIG. 53.

That is, in this example, a film formed by utilizing a parallel plate plasma CVD process, ECR plasma CVD process or a bias ECR plasma CVD process from a gas mixture of $SiH_4+O_2+N_2$ or a gas mixture of $SiH_4+N_2O$ and using Ar as a buffer gas.

Example 83

In this example, the $Si_xN_y$ film shown in Examples 77 and 78 was formed by the following method to form the anti-reflective layer as shown in FIG. 53.

That is, in this example, a film was formed by utilizing a parallel plate plasma CVD process, ECR plasma CVD process or a bias ECR plasma CVD process using a microwave (2.45 GHz) from a gas mixture of $SiH_4+NH_3$ or a gas mixture of $SiH_2Cl_2+NH_3$.

Example 84

In this example, the $Si_xN_y$ film shown in Examples 77 and 78 was formed by the following method to form the anti-reflective layer as shown in FIG. 53.

That is, in this example, a film was formed by utilizing a parallel plate plasma CVD process, ECR plasma CVD process or a bias ECR plasma CVD process using a microwave (2.45 GHz) from a gas mixture of $SiH_4+O_2$ or a gas mixture of $SiH_2Cl_2+NH_3$ using Ar as a buffer gas.

Example 85

In this example, the $Si_xN_y$ film shown in Examples 77 and 78 was formed by the following method to form the anti-reflective layer as shown in FIG. 53.

That is, in this example, a film was formed by utilizing a parallel plate plasma CVD process, ECR plasma CVD process or a bias ECR plasma CVD process from a gas mixture of $SiH_4+N_3$ or a gas mixture of $SiH_2Cl_2+NH_3$.

Example 86

In this example, the $Si_xN_y$ film shown in Examples 77 and 78 was formed by the following method to form the anti-reflective layer as shown in FIG. 53.

That is, in this example, a film was formed by utilizing a parallel plate plasma CVD process, ECR plasma CVD process or a bias ECR plasma CVD process from a gas mixture of $SiH_4+O_2$ or a gas mixture of $SiH_2Cl_2+NH_3$ using Ar as a buffer gas.

Example 87

In this example, the $Si_xO_yN_z$ or $Si_xN_y$ film shown in Examples 77 and 78 was etched as the underlying material using the resist pattern as a mask by the following method.

That is, the $Si_xO_yN_z$ or $Si_xN_y$ film was etched by a reactive etching process using a gas system of $CHF_3$ (50–100 SCCM)+$O_2$ (3–20 SCCM), under a pressure of about 2 Pa, with a power of about 10–100(3 W and with the improved ionic property, to obtain a desired pattern by etching.

Example 88

In this example, the $Si_xO_yN_z$ or $Si_xN_y$ film shown in Examples 77 and 78 was etched as the underlying material using the resist pattern as a mask by the following method.

That is, the $Si_xO_yN_z$ or $Si_xN_y$ film was etched by a reactive etching process using a gas system of $C_4F_8$ (30–70 SCCM)+$CHF_3$ (10–30 SCCM), under a pressure of about 2 Pa, with a power of about 100–1000 W and with the improved ionic property, to obtain a desired pattern by etching.

Example 89

In this example, the $Si_xO_yN_z$ or $Si_xN_y$ film shown in Examples 77 and 78 was etched as the underlying material using the resist pattern as a mask by the following method.

That is, the $Si_xO_yN_z$ or $Si_xN_y$ film was etched by a reactive etching process using a gas system of $S_2F_2$ (5–30 SCCM), under a pressure of about 2 Pa, with a power of about 100–1000 W and with the improved ionic property, to obtain a desired pattern by etching.

Example 90

In this example, a $SiO_xN_y$ film is formed by using $SiH_4$ and $N_2O$ mix gas as raw gas. It is recognized that the formed film contains hydrogen.

Figure 58:
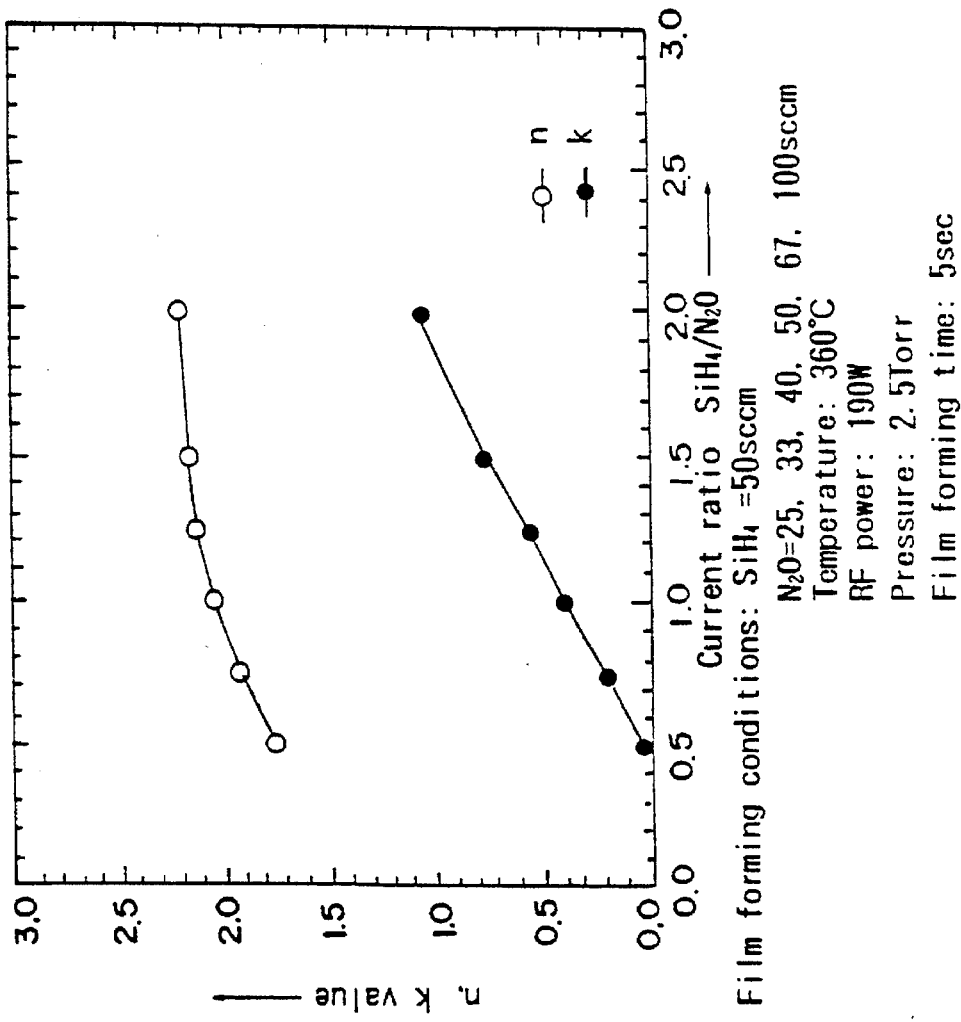
FIG. 58 is a graph for Example 90, which shows the relationship between current ratio $SiH_4/N_2O$ and n, k values of the formed film of $SiO_xN_y$.
Figure 59:
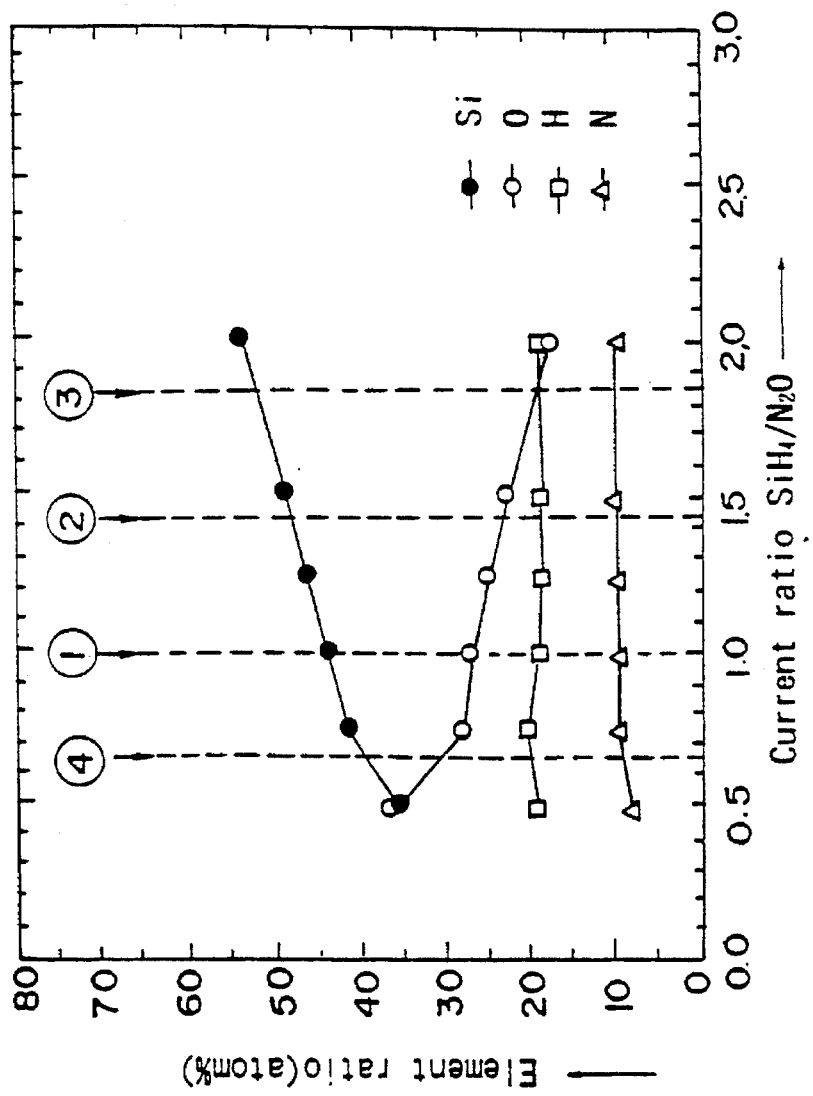
FIG. 59 is a graph for Example 90, which shows relationship between current ratio $SiH_4/N_2O$ and the element ratio for each of Si, O, N, H (RBS value) of the formed film of $SiO_xN_y$.

Referring to FIG. 58 and FIG. 59, FIG. 58 shows relationship between current ratio $SiH_4/N_2O$ and n, k value of the formed film in this example. FIG. 59 shows relationship between current ratio $SiH_4/N_2O$ and atomic ratio of Si, O, N, H (atom %) of the formed film in this example. As is understood through FIG. 59, the formed $SiO_xN_y$ film contains H with ratio of H changing in accordance to the current ratio $SiH_4/N_2O$. It shows the fact that $SiO_xN_yH_z$ film is formed.

Figure 60:
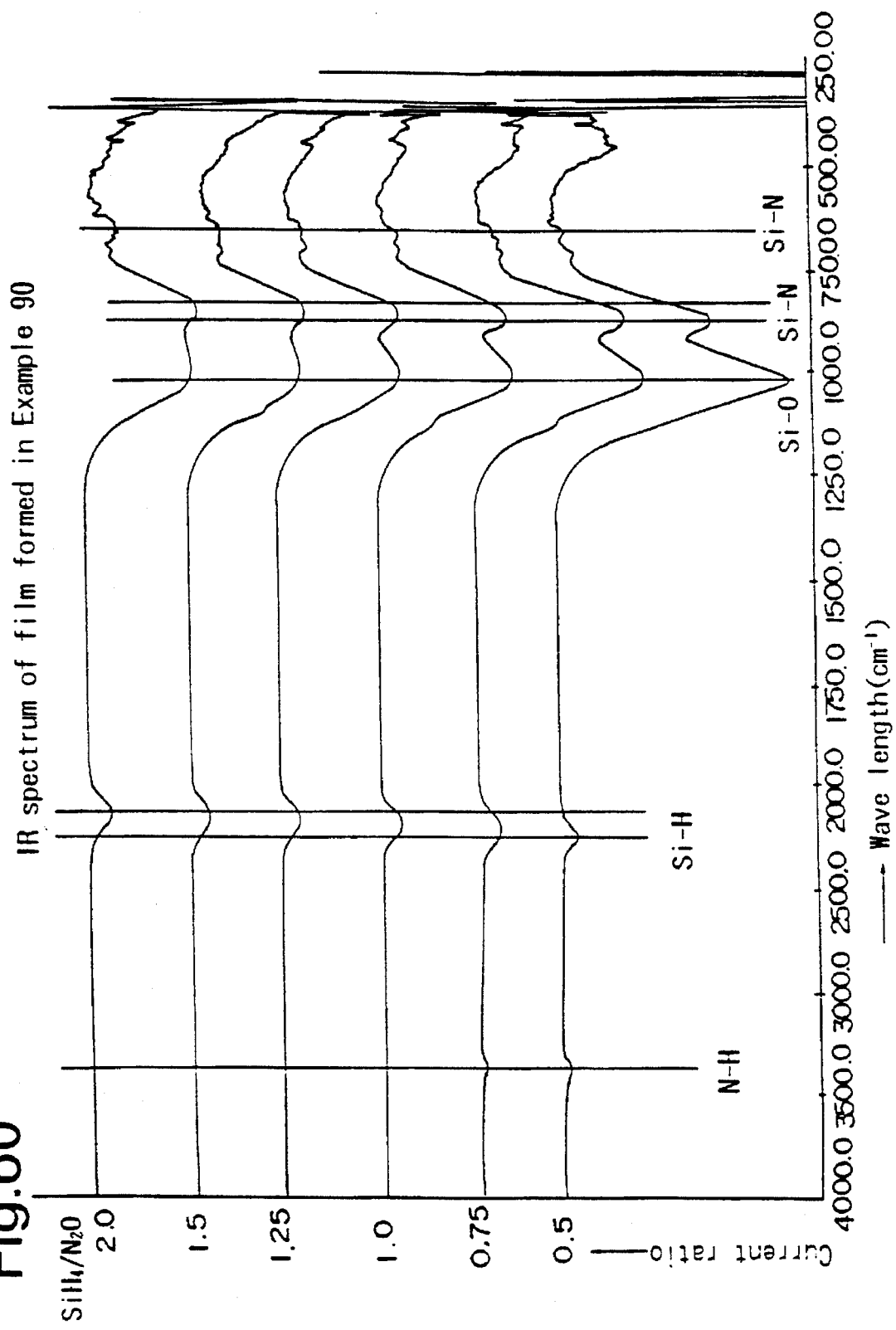
FIG. 60 is a graph illustrating the IR spectrum of film formed in Example 90.

Qualitatively speaking, as appeared in IR spectrum in FIG. 60, in any case of various current ratio, there exists not only peaks showing Si—O or Si—N bond but exists peaks showing N—H, Si—H bond.

It is considered that the existence of the hydrogen makes a contribution to the anti-reflective effect to a certain extent. It is considered that there exists hydrogen in any shape in the obtained film, when hydrogen-containing raw gas is used. Especially, in film forming method using plasma, the existence of such hydrogen is remarkable.

In this example, various x, y, z values of $SiO_xN_yH_z$ film investigated from the current ratio $SiH_4/N_2O$ based on FIG. 58 which gives most suitable k and n values for an i-line and excimer laser are shown in following Table 1. In this experiment, WSi as refractory metal silicide WSi with $SiO_2$, and Al-1 wt % Si as metal material are used as underlying material. And on the above-mentioned underlying materials, various thicknesses of anti-reflective layers are formed on said underlying material using said $SiH_4/N_2O$ mixed gas.

TABLE 1

| | | | x, y, z values of $SiO_xN_yH_z$ | | | | |
|---|---|---|---|---|---|---|---|
| No. | underlying material | light | thickness of anti-reflective layer (nm) | x | y | z | current ratio of $SiH_4/N_2O$ |
| 1 | WSi | i-line | 27 | 0.614 | 0.227 | 0.432 | 1.0 |
| 2 | WSi (with $SiO_2$) | excimer | 30 | 0.479 | 0.208 | 0.375 | 1.43 |
| 3 | Al—Si | excimer | 24 | 0.358 | 0.189 | 0.358 | 1.85 |
| 4 | Al—Si | excimer | 70 | 0.842 | 0.263 | 0.526 | 0.66 |

Points of current ratio corresponding to the above 1 to 4, there are drawn the lines showing them, in FIG. 59.

According to the present invention, the following are understood. In case that $SiO_xN_y$:$H_z$ is used as an anti-reflective layer to form WSi for wavelength 150 to 450 nm, it is preferred that x is 0.03 to 0.80, y is 0.10 to 0.30, and z can be zero, but when hydrogen is contained, it is preferred that z is 0.20 to 0.60.

According to the present invention, the following are also understood. In case that $SiO_xN_y$:$H_z$ is used as an anti-reflective layer for Al—Si for wavelength 150 to 450 nm, it is preferred that x is 0.03 to 0.70 and y is 0.05 to 0.30. z can be zero, but when hydrogen is contained, it is preferred that z is 0.1 to 0.5.

Figure 61:
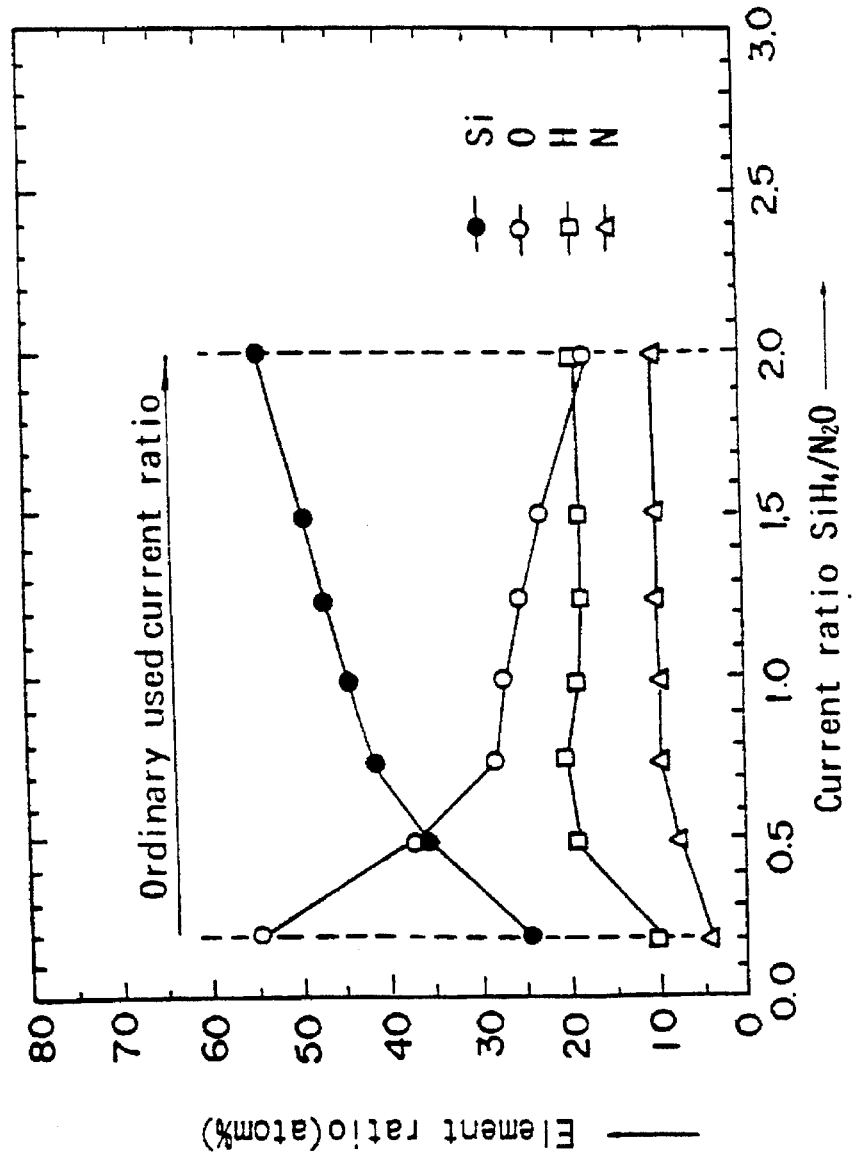
FIG. 61 is a graph illustrating the ordinarily used current ratio of $SiH_4/N_2O$ for forming the $SiO_xN_y$ film.

As shown in FIG. 61, ordinarily used current ratio of $SiH_4/N_2O$ for forming $SiO_xN_y$ film is 0.2 to 2.0.

Figure 62:
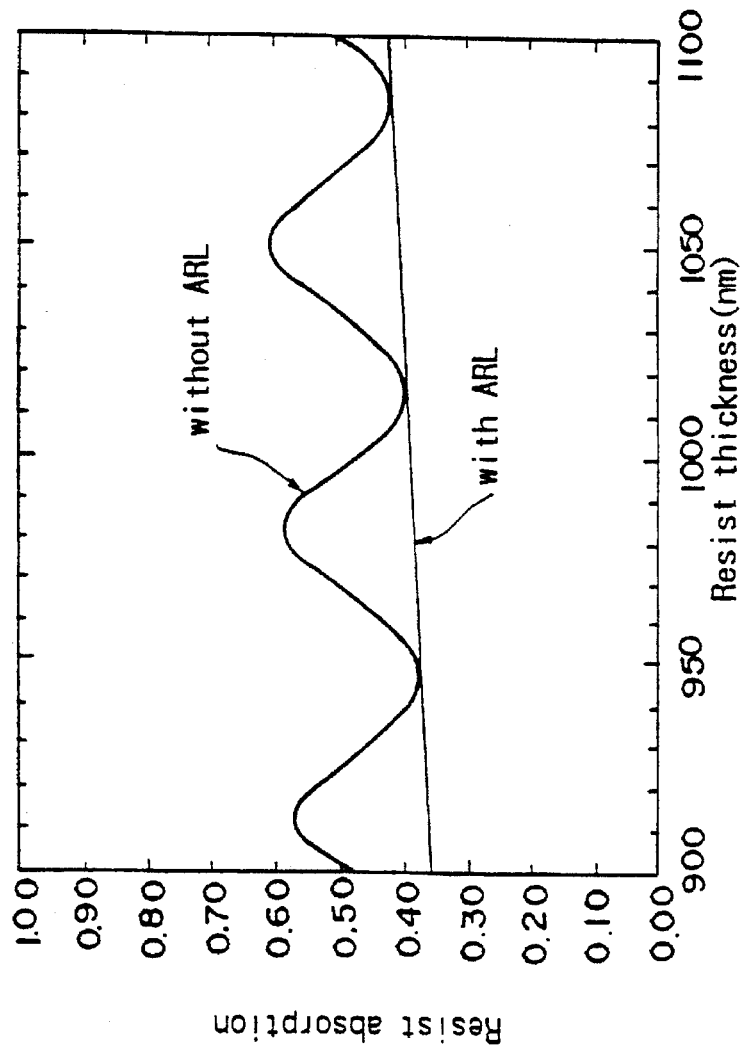
FIG. 62 is a graph illustrating the effect of an anti-reflective layer of the film formed in Example 90 on W—Si with $SiO_2$.
Figure 63:
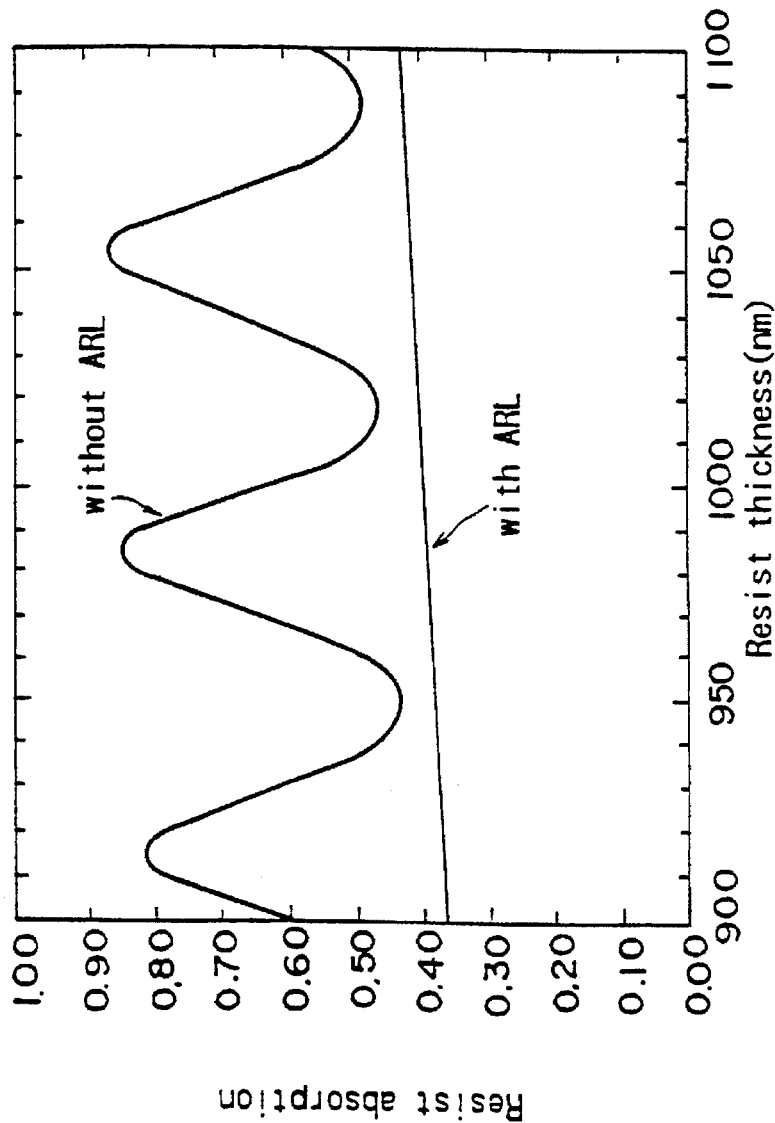
FIG. 63 is a graph illustrating the effect of an anti-reflective layer of the film formed in Example 90 on Al—Si.

FIGS. 62 and 63 show simulated anti-reflect effect (effect for decreasing standing wave) when anti-reflective layers obtained in this example are used. FIG. 62 shows the case that WSi with $SiO_2$ is used as underlying material. FIG. 63 shows the case that Al—Si is used as underlying material. By referring to FIGS. 62 and 63, it is understood that in the case having anti-reflective layers (with ARL) there diminished most of the standing effect, compared with the case having no anti-reflective layers (without ARL).

Figure 64:
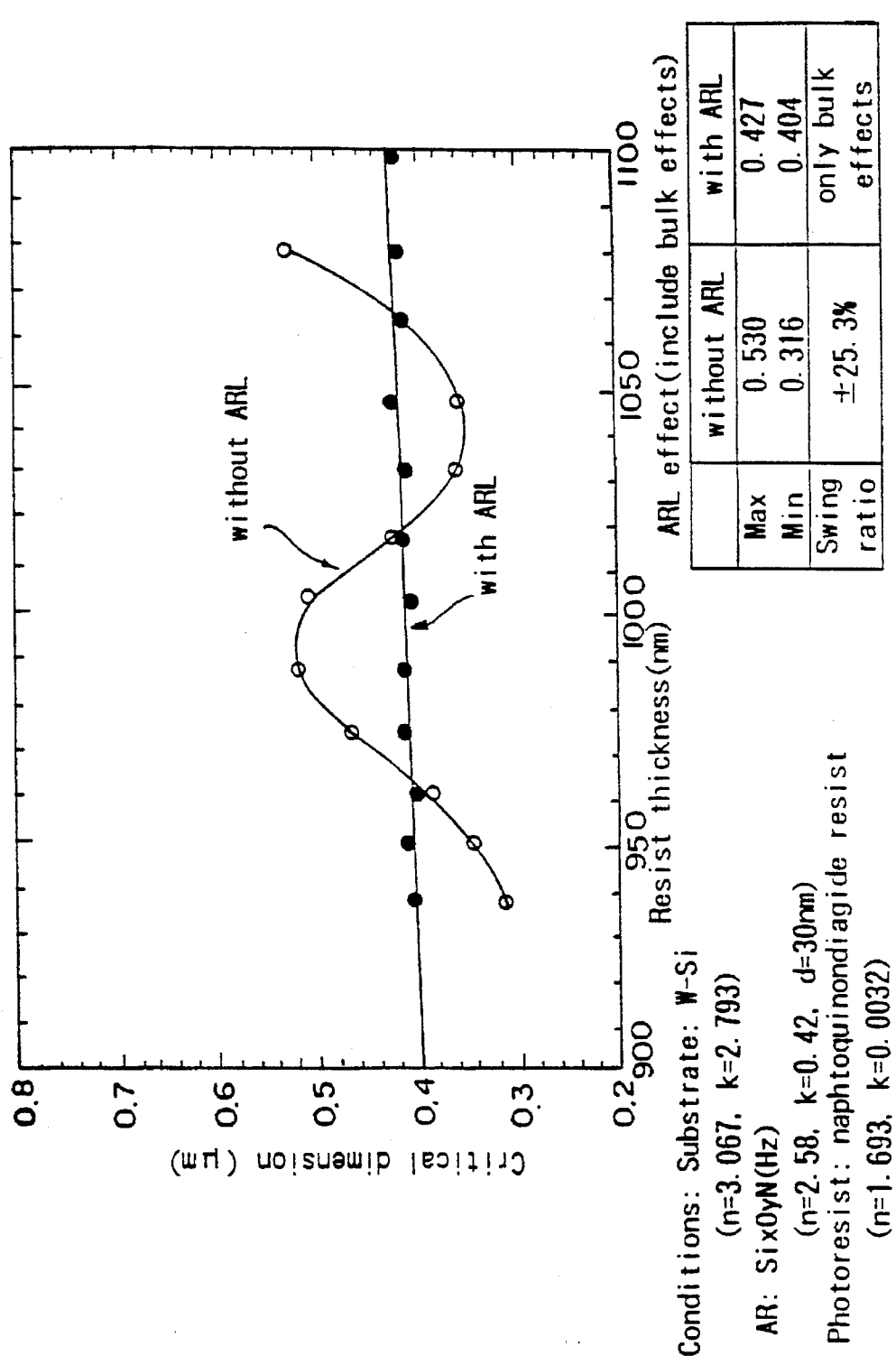
FIG. 64 is a graph illustrating the effect of an anti-reflective layer of the film formed in Example 90.

FIG. 64 shows the measured anti-reflect effect on 0.44 m line and space pattern in real i-line lithography process. By referring to FIG. 64, anti-reflect effect in this example is also understood.

Figure 65:
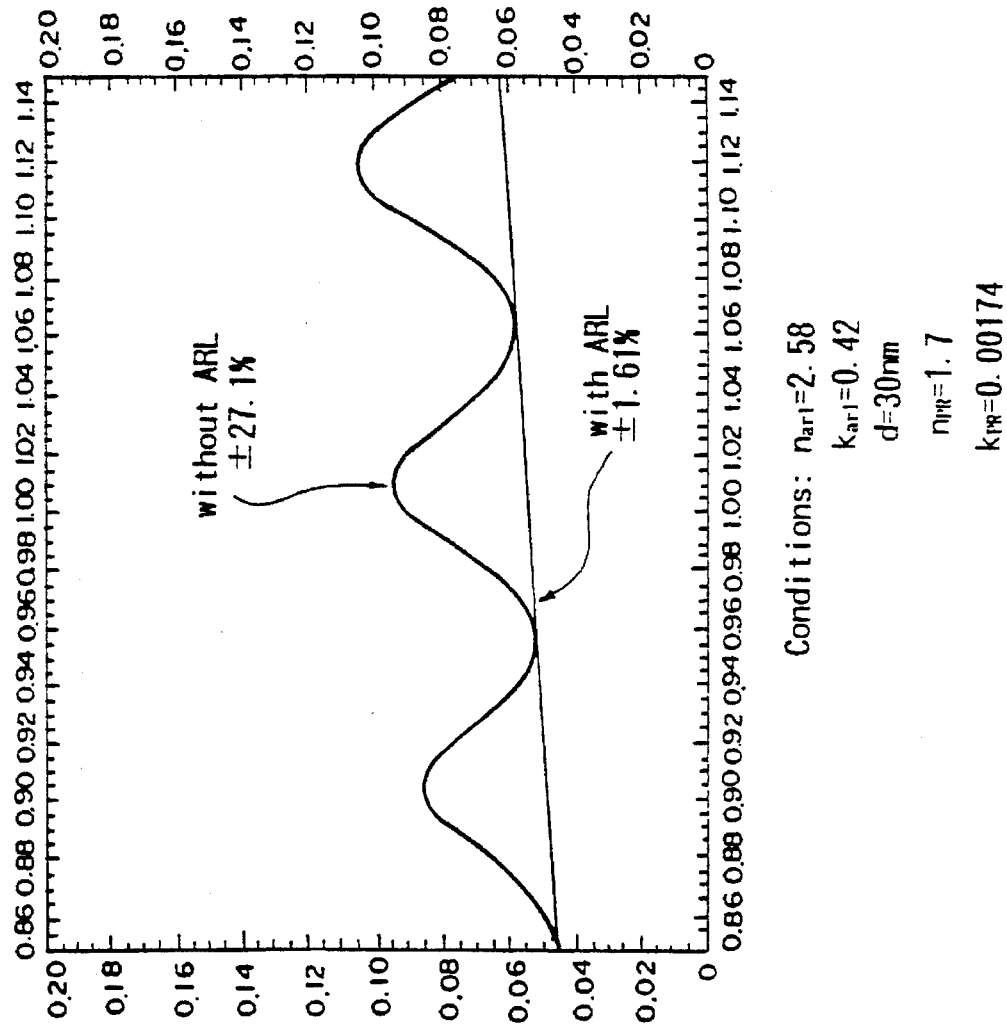
FIG. 65 is a graph illustrating the effect of an anti-reflective layer of the film formed in Example 90.
Figure 66:
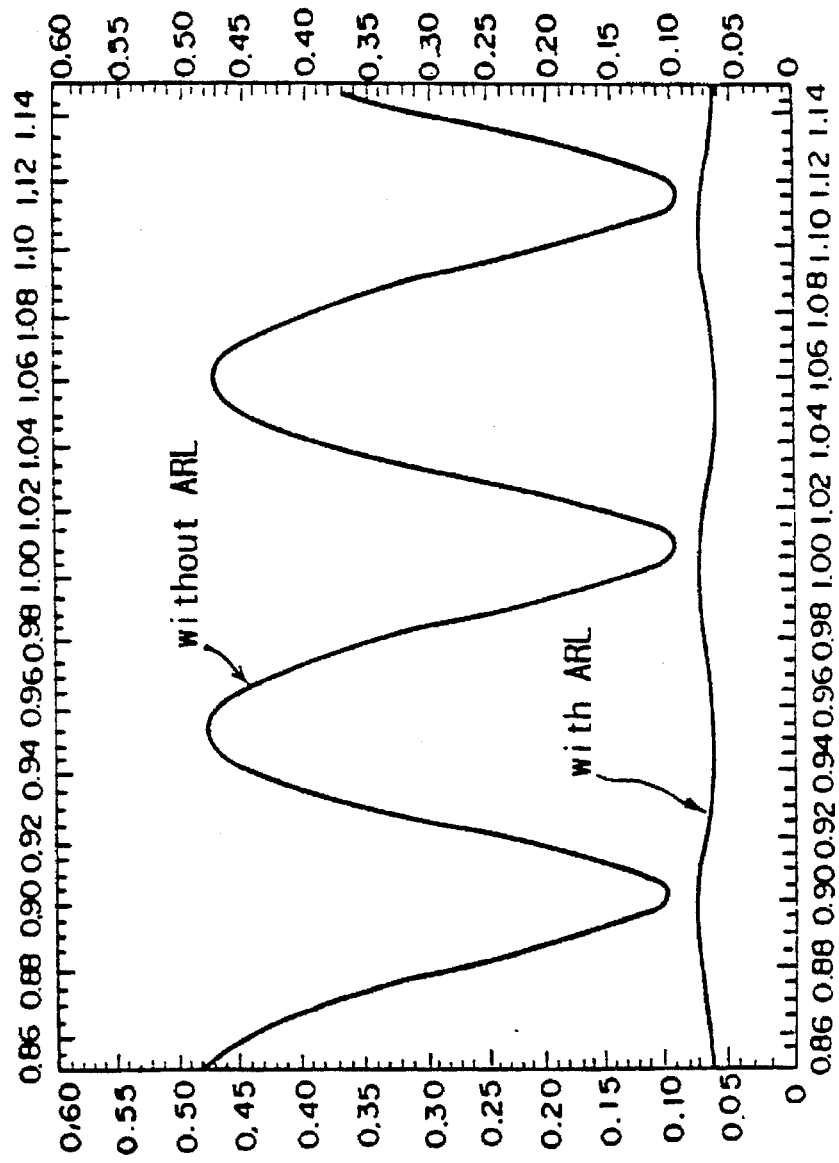
FIG. 66 is a graph illustrating the effect of an anti-reflective layer of the film formed in Example 90.

FIGS. 65 and 66 show simulated anti-reflect effect. FIG. 65 shows the case that WSi is used as underlying material (i-line, absorption ratio). FIG. 66 shows also the case that WSi is used as underlying material (i-line, reflective ratio). An anti-reflective layer of 30 nm with n, k value described in the Figures is formed, and data are measured by using photoresist with n, k value described in the Figure. Superior anti-reflective effect is obtained in both cases of absorption ratio and reflective ratio.

Figure 67:
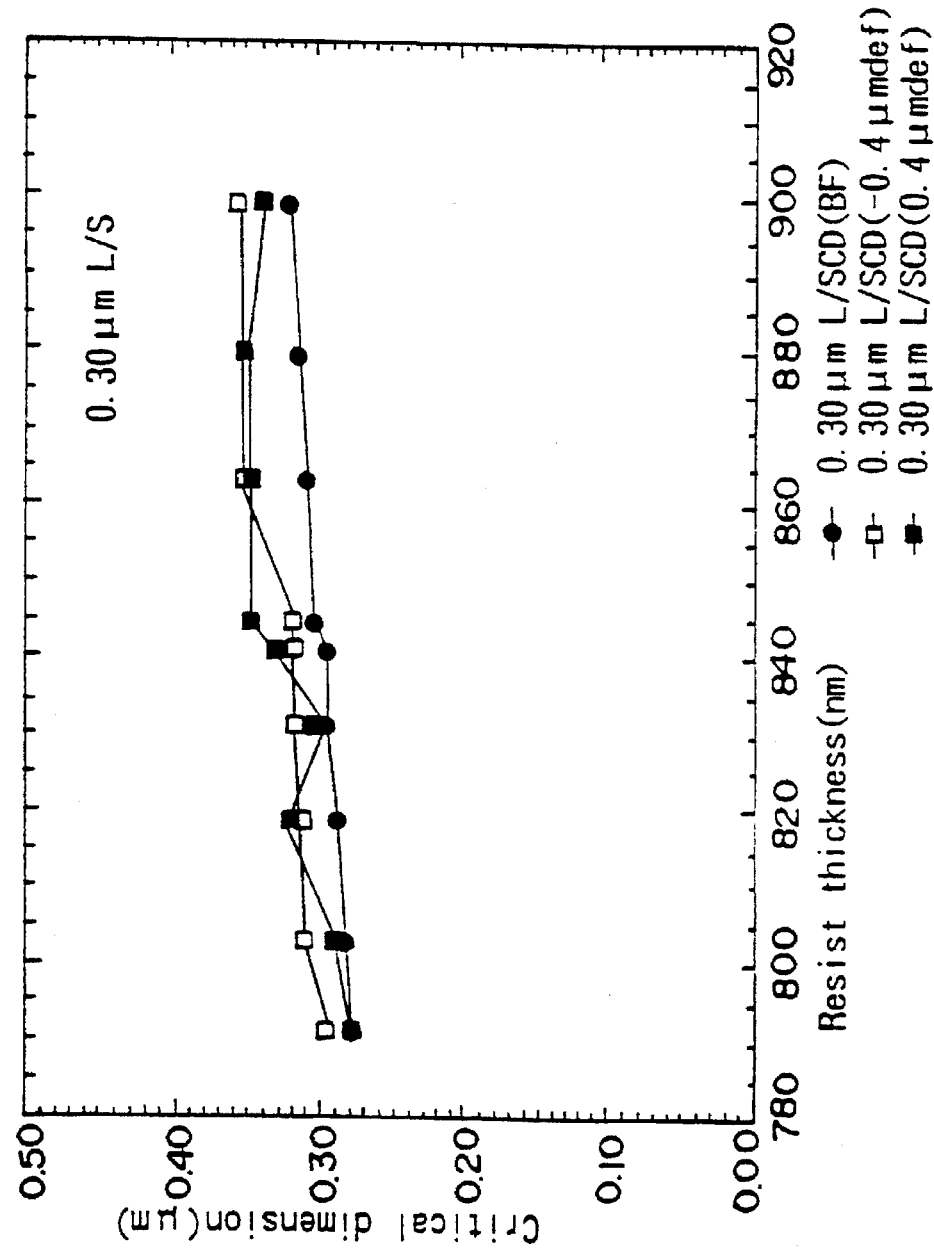
FIG. 67 is a graph illustrating the operation of Example 90.
Figure 68:
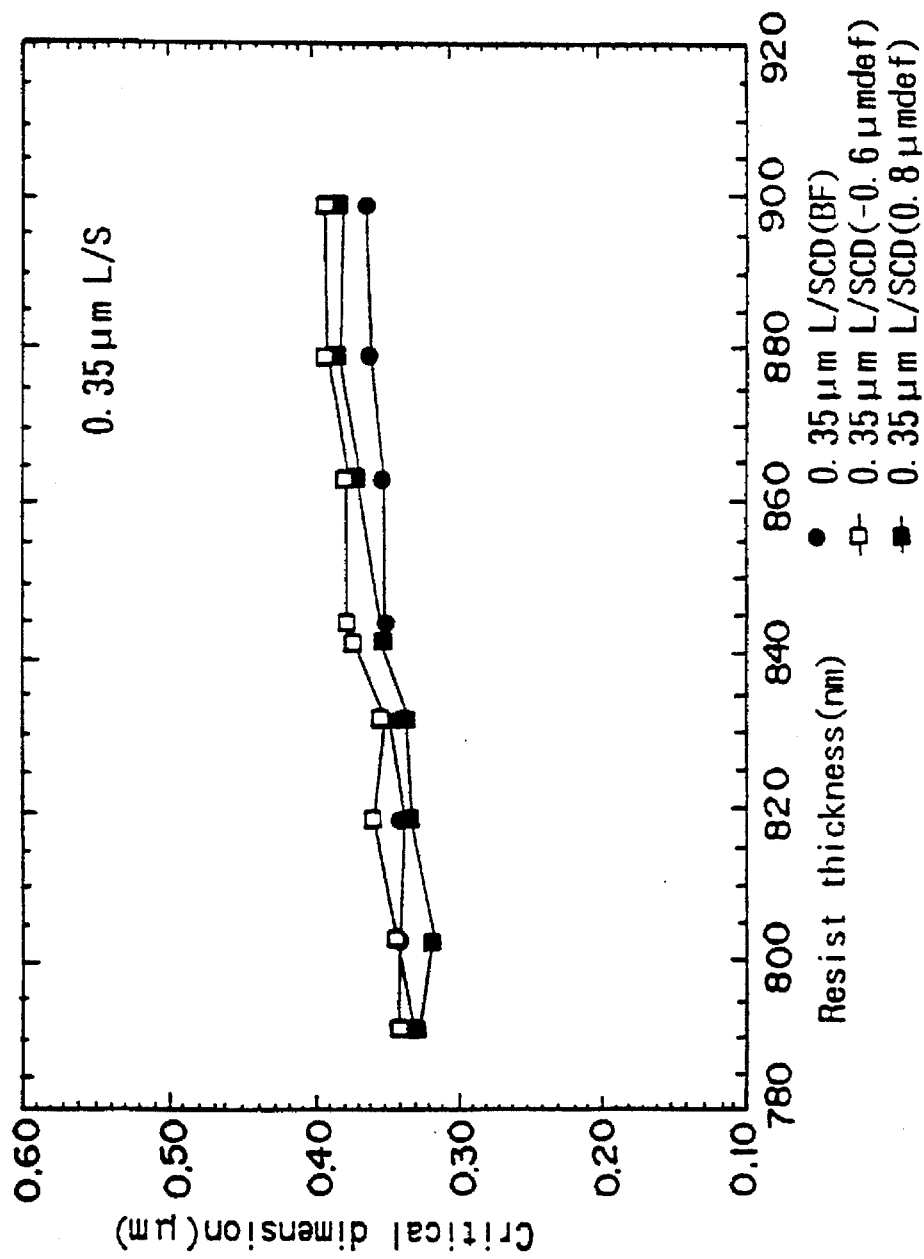
FIG. 68 is a graph illustrating the operation of Example 90.

FIGS. 67 and 68 show the relationship between thickness of photoresist and critical dimension. The experiment is operated using WSi as underlying material, and KrF excimer laser. FIG. 67 shows the case that data are measured concerning 0.30 m line and space pattern. FIG. 68 shows the case that data are measured concerning 0.35 m line and space pattern. In both cases, chemical amplifying positive resist is used.

Example 91

As aforementioned, the material n value of which is about 2.4 and k value of which is about 0.7 is suitable as an anti-reflective layer for excimer laser on, for example, refractory metal silicide. And also as aforementioned, $SiO_x$, $SiN_x$ or $SiO_xN_y$ is effective such an anti-reflective layer as described above. It is considered that $SiO_x$, $SiN_x$ or $SiO_xN_y$ with the n value and k value as described above which is effective for anti-reflectivity can be formed by controlling the n value and k value by controlling the element ratio x and y. It is, however, difficult to obtain a film with desired n value and k value by controlling the ratio by suitable means.

In this example, in order to obtain a film with desired n value and k value, the anti-reflective layer is formed by using a raw gas containing at least silicon element and oxide element. For example, in order to control the element ratio x of $SiO_x$, by using gas current ratio as parameter, it is possible to make x smaller through using higher ratio of raw gas containing silicon element. As a result, the atomic ratio can be controlled, and the optical constant (n, k) can be controlled.

In this example, $SiH_4$ is used as raw gas containing at least silicon element, and $N_2O$ is sued as raw gas containing at least oxide element. The film with desired anti-reflective effect can be formed by controlling the optical constant through using current ratio of $SiH_4$ and $N_2O$ as parameter. FIG. 58 shows the change of the optical constant of the formed film when the current ratio of $SiH_4$ and $N_2O$ in parallel electrode-type plasma CVD chamber is changed. The suitable example of film forming conditions for excimer lithography are as follows:

$SiH_4$=50 sccm $N_2O$=50 sccm

RF power=190 W pressure=332.5 Pa (2.5 torr)

temperature of the substrate=400° C.

distance between electrodes=1 cm.

In the above-mentioned means, current ratio of raw gas is mainly used as to control optical constant, however, pressure of film forming atmosphere, RF power, or temperature of the substrate can be used to control optical constant as parameter.

Example 92

In this example, an anti-reflective layer is formed by using at least one kind of organic compounds containing at least silicon element as a raw material. As a result of using an organic compound, coverage of an anti-reflective layer on a step improves. Namely, a difference between thickness of an anti-reflective layer on even portion and that of perpendicular portion of a step in this example is small, and uniformity of anti-reflective effect in semiconductor device tip improves.

In this example, as an organic compound which has improved step coverage is used, this example can be said it is especially effective for device with severe unevenness. As an organic compound, for example, TEOS, OMCTS ($Si_4O(CH_3)_8$:Si/Uratio=1). HMDS ($Si_2O(CH_3)_8$:Si/Oratio=2) and so on can be used. In this example, used conditions for forming film in parallel electrodes plasma CVD chamber are as follows:

OMCTS=50 sccm

RF power=190 W pressure=332.5 Pa (2.5 torr)

temperature of the substrate=400° C.

distance between electrodes=1 cm.

Example 93

When Si content of the desired film is larger than the above Example 92, $SiH_4$, which is a Si source gas without containing O, N, can be added. In this case, the example of conditions for forming the film in parallel electrode plasma CVD chamber are as follows:

OMCTS=50 sccm $SiH_4$=5 sccm

RF power=190 W pressure=332.50 Pa (2.5 torr)

temperature of the substrate=400° C.

distance between electrodes—1 cm.

As has been described above, according to the present invention, in a case of forming a resist pattern on an optional underlying material (substrate) by using an optional monochromatic light as an exposure optical source, the condition for an anti-reflective layer used therein can be determined such that a stable resist pattern can be formed satisfactorily even if the resist pattern is fine. Further, according to the present invention, an anti-reflective layer with such a condition can be formed. Furthermore, according to the present invention, an anti-reflective layer with such a condition can be formed. Furthermore, according to the present invention, a novel anti-reflective layer can be developed to provide a method of forming a resist pattern using such an anti-reflective layer.

Although various minor modifications may be suggested by those versed in the art, it should be understood that we wish to embody within the scope of the patent granted hereon all such modifications as reasonably and properly come within the scope of our contribution to the art.

We claim:

1. An anti-reflective layer used in semiconductor lithography process, said layer being on a surface and comprising an inorganic layer having a composition including elements of Si, O and N, and said composition of said anti-reflective layer being controlled to minimize a standing wave effect in a photoresist deposited thereon.

2. An anti-reflective layer according to claim 1, wherein said composition of the anti-reflective layer includes an element of H.

3. An anti-reflective layer according to claim 1, wherein said anti-reflective layer has the composition of $SiO_xN_yH_z$, wherein x is 0.3 to 1.30, y is 0.09 to 0.35 and z is 0 to 0.85.

4. An anti-reflective layer according to claim 1, wherein said anti-reflective layer for a light of a wavelength $\lambda$ has a reflection refractive index n, an absorption refractive index k and a thickness d, wherein 150 nm$\leq\lambda\leq$450 nm; 1.2$\leq$n$\leq$5.7; 0$\leq$k$\leq$1.4; and 10 nm$\leq$d$\leq$100 nm.

5. An anti-reflective layer according to claim 2, wherein said anti-reflective layer has the composition of $SiO_xN_yH_z$, wherein x is 0.3 to 1.30, y is 0.09 to 0.35 and z is up to 0.85.

* * * * *